United States Patent
Yamazaki et al.

(10) Patent No.: US 10,976,661 B2
(45) Date of Patent: *Apr. 13, 2021

(54) RESIST COMPOSITION, METHOD OF FORMING RESIST PATTERN, AND POLYMER COMPOUND

(71) Applicant: TOKYO OHKA KOGYO CO., LTD., Kawasaki (JP)

(72) Inventors: Hiroto Yamazaki, Kawasaki (JP); Masahito Yahagi, Kawasaki (JP); Kenta Suzuki, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 277 days.

This patent is subject to a terminal disclaimer.

(21) Appl. No.: 16/024,482

(22) Filed: Jun. 29, 2018

(65) Prior Publication Data
US 2019/0018319 A1 Jan. 17, 2019

(30) Foreign Application Priority Data
Jul. 12, 2017 (JP) .............................. JP2017-136603

(51) Int. Cl.
| | | |
|---|---|---|
| *G03F 7/038* | (2006.01) | |
| *G03F 7/039* | (2006.01) | |
| *G03F 7/16* | (2006.01) | |
| *G03F 7/38* | (2006.01) | |
| *G03F 7/32* | (2006.01) | |
| *G03F 7/20* | (2006.01) | |
| *C09D 125/18* | (2006.01) | |
| *C08F 212/14* | (2006.01) | |
| *C08F 212/32* | (2006.01) | |

(52) U.S. Cl.
CPC .......... *G03F 7/0382* (2013.01); *C09D 125/18* (2013.01); *G03F 7/0392* (2013.01); *G03F 7/162* (2013.01); *G03F 7/168* (2013.01); *G03F 7/2006* (2013.01); *G03F 7/2037* (2013.01); *G03F 7/322* (2013.01); *G03F 7/38* (2013.01); *C08F 212/14* (2013.01); *C08F 212/32* (2013.01); *C08F 2800/10* (2013.01)

(58) Field of Classification Search
CPC ...... G03F 7/0382; G03F 7/0392; G03F 7/162; G03F 7/168; G03F 7/38; G03F 7/322; G03F 7/2006; G03F 7/2037; C08F 212/32; C08F 212/14; C08F 2800/10; C09D 125/18
See application file for complete search history.

(56) References Cited

U.S. PATENT DOCUMENTS

| | | | |
|---|---|---|---|
| 5,932,392 A | 8/1999 | Hirai et al. | |
| 6,106,993 A | 8/2000 | Watanabe et al. | |

(Continued)

FOREIGN PATENT DOCUMENTS

| | | | |
|---|---|---|---|
| EP | 1077392 A1 * | 2/2001 | ........... G03F 7/0233 |
| JP | 2003-241385 A | 8/2003 | |

(Continued)

OTHER PUBLICATIONS

JP 2007-29394 A1 Machine generated English translation of Description, claims and abstract obtained from translating Japanese Patent application 2007-074839 thereof from J-PlatPat [JPP] website of Japan Platform for Patent Information generated on May 18, 2020, 21 pages. (Year: 2020).*

(Continued)

*Primary Examiner* — Cynthia Hamilton

(74) *Attorney, Agent, or Firm* — Knobbe Martens Olson & Bear LLP

(57) ABSTRACT

A resist composition which generates an acid when exposed and whose solubility in a developer is changed by an action of an acid, the resist composition including a polymer compound (A1) which has a constitutional unit (a0) derived from a compound represented by Formula (a0-1) and a constitutional unit (a10) derived from a compound represented by Formula (a10-1) and does not have a constitutional unit represented by Formula (1). In the formulas, $Ra^{x0}$ and $Ra^{x1}$ represent a polymerizable group-containing group; $Wa^{x0}$ and $Wa^{x1}$ represent an $(n_{ax0}+1)$-valent or $(n_{ax1}+1)$-valent aromatic hydrocarbon group; $n_{ax0}$ and $n_{ax1}$ represent an integer of 1 to 3; and $Z^2$ represents Fe, Co, Ni, Cr, or Ru.

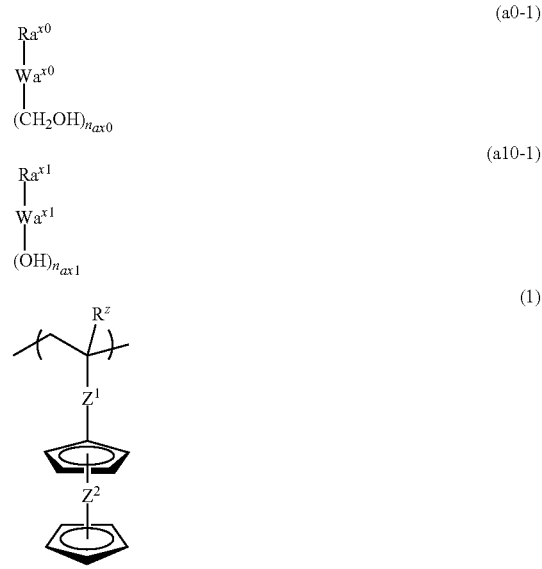

10 Claims, No Drawings

(56) References Cited

U.S. PATENT DOCUMENTS

| | | | |
|---|---|---|---|
| 6,136,502 A | 10/2000 | Satoshi et al. | |
| 6,485,883 B2 | 11/2002 | Kodama et al. | |
| 10,606,174 B2 * | 3/2020 | Yahagi | G03F 7/0382 |
| 2004/0110085 A1 | 6/2004 | Iwai et al. | |
| 2010/0159392 A1 * | 6/2010 | Hatakeyama | G03F 7/0397 430/286.1 |
| 2013/0341304 A1 | 12/2013 | Minegishi et al. | |
| 2015/0362836 A1 | 12/2015 | Tsuchimura et al. | |
| 2016/0091790 A1 | 3/2016 | Hori et al. | |

FOREIGN PATENT DOCUMENTS

| | | |
|---|---|---|
| JP | A-2003-241385 | 8/2003 |
| JP | 2007-084502 A | 4/2007 |
| JP | A-2007-084502 | 4/2007 |
| JP | 2007293294 A * | 11/2007 |
| JP | 5723829 B | 5/2015 |
| WO | WO 2013/069812 A1 | 5/2013 |

OTHER PUBLICATIONS

Frechet, Jean M.J. "The photogeneration of acid and base within polymer coatings: Approaches to polymer curing and imaging", Pure & Appl. Chem., vol. 64, No. 9, pp. 1239-1248, year 19992. (Year: 1992).*
Office action from U.S. Appl. No. 10/606,174 dated Jun. 25, 2019.
Notice of Allowance from U.S. Appl. No. 10/606,174 dated Nov. 22, 2019.
Restriction Requirement from U.S. Appl. No. 15/877,764 dated Apr. 8, 2019.

* cited by examiner

RESIST COMPOSITION, METHOD OF FORMING RESIST PATTERN, AND POLYMER COMPOUND

BACKGROUND OF THE INVENTION

Field of the Invention

The present invention relates to a resist composition, a resist pattern-forming method, and a polymer compound.

Priority is claimed on Japanese Patent Application No. 2017-136603, filed on Jul. 12, 2017, the content of which is incorporated herein by reference.

Description of Related Art

In a lithography technique, for example, a step of forming a resist pattern having a predetermined shape on a resist film is performed by forming the resist film formed of a resist material on a substrate, selectively exposing the resist film, and performing a development treatment thereon. The resist material is divided into a positive type resist material and a negative type resist material. A resist material having a characteristic in which an exposed portion of a resist film is dissolved in a developer is referred to as a positive type resist material and a resist material having a characteristic in which an exposed portion of a resist film is not dissolved in a developer is referred to as a negative type resist material.

In recent years, pattern miniaturization has improved along with the advancement of lithography techniques in the manufacture of semiconductor elements and liquid crystal display elements. As a technique of miniaturization, shortening of the wavelength (increasing the energy) of exposure light source has typically been performed. Specifically, although ultraviolet rays typified by g-line and i-line have been used in the related art, mass production of semiconductor elements obtained by using a KrF excimer laser and an ArF excimer laser has also been achieved. Further, an extreme ultraviolet ray (EUV), an electron beam (EB), or an X-ray having a wavelength shorter (high energy) than that of any of these excimer lasers has also been examined.

The resist material is required to have lithography characteristics such as sensitivity to these exposure light sources, a resolution that enables reproduction of a pattern with fine dimensions, and the like.

As a resist material satisfying such a requirement, in the related art, a chemically amplified resist composition which contains a base material component whose solubility in a developer is changed due to an action of an acid and an acid generator component that generates an acid when exposed has typically been used.

For example, in a case where the developer is an alkali developer (alkali development process), as a positive type chemically amplified resist composition, a composition that contains a resin component (base resin) whose solubility in an alkali developer is increased due to an action of an acid and an acid generator component is typically used. In a case where a resist film formed using such a resist composition is selectively exposed at the time of formation of a resist pattern, an acid is generated from an acid generator component in the exposed portion, the polarity of a base resin is increased due to an action of the acid, and the exposed portion of the resist film becomes soluble in an alkali developer. Accordingly, by performing alkali development, an unexposed portion of the resist film remains as a pattern so that a positive type pattern is formed (for example, see Japanese Unexamined Patent Application, First Publication No. 2003-241385).

As the resist material, a chemically amplified resist composition containing a base material component (alkali-soluble base material component) that is soluble in an alkali developer, an acid generator component that generates an acid when exposed, and a crosslinking agent component has been used in the related art. In such a chemically amplified resist composition, for example, in a case where an acid is generated from the acid generator component when exposed, crosslinking occurs between the crosslinking agent component and the alkali-soluble base material component due to an action of the acid. As a result, the solubility of the composition in an alkali developer is decreased. Therefore, in a case where a resist film obtained by coating a support with such a chemically amplified resist composition is selectively exposed at the time of formation of a resist pattern, since the unexposed portion of the resist film is soluble in an alkali developer and this state is not changed while the exposed portion of the resist film becomes poorly soluble in an alkali developer, a negative type resist pattern is formed by performing development using an alkali developer (for example, see Japanese Unexamined Patent Application, First Publication No. 2007-084502).

Further, a chemically amplified resist composition containing a base material component that contains a polymer compound formed by introducing a crosslinking group to a polyhydroxystyrene polymer and an acid generator component that generates an acid when exposed has been reported. In such a chemically amplified resist composition, in a case where an acid is generated from the acid generator component when exposed, crosslinking occurs between base material components through the crosslinking group due to an action of the acid. As a result, the solubility of the composition in an alkali developer is decreased (for example, see Japanese Patent No. 5723829).

SUMMARY OF THE INVENTION

In recent years, as the miniaturization of a resist pattern has been progressing, there is a demand for a technique of forming a high-resolution pattern having an excellent shape.

In a case where a pattern with finer dimensions is intended to be formed using the above-described positive type chemically amplified resist composition, there is a problem in that the resolution of the resist pattern is likely to be decreased due to generation of a region having a low optical intensity in the exposed portion of the resist film particularly in the film thickness direction.

To address this problem, a method of forming a resist pattern (negative type resist pattern) by selectively dissolving and removing a region having a low optical intensity using a chemically amplified resist composition containing an alkali-soluble base material component, an acid generator component, and a crosslinking agent component is useful for forming a pattern with fine dimensions as described above. However, in a chemically amplified resist composition of the related art which contains a crosslinking agent component, the sensitivity, the resolution, and the roughness are degraded in some cases due to the plastic effect of the crosslinking agent.

In the chemically amplified resist composition containing an acid generator component and a base material component that contains a polymer compound formed by introducing a crosslinking group described in Japanese Patent No. 5723829, the hydrophilicity and the reactivity of the crosslinking group introduced into the polymer compound are low. Accordingly, the hydrophilicity and the reactivity of the base material component are degraded and the sensitivity, the resolution, and the roughness of the resist composition are degraded in some cases. Further, in a case where the composition does not contain a crosslinking agent component, crosslinking for forming a desired pattern is insufficient in some cases.

The present invention has been made in consideration of the above-described circumstances, and an object thereof is to provide a resist composition and a method of forming a resist pattern with improved sensitivity, resolution, and roughness; and a polymer compound which is useful as a base material component for the resist composition.

In order to solve the above-described problems, the present invention employs the following configurations.

According to a first aspect of the present invention, a resist composition is provided which generates an acid when exposed and whose solubility in a developer is changed by an action of an acid, the resist composition including: a polymer compound (A1) which has a constitutional unit (a0) derived from a compound represented by Formula (a0-1) and a constitutional unit (a10) derived from a compound represented by Formula (a10-1) and does not have a constitutional unit represented by Formula (1).

In Formula (a0-1), $Ra^{x0}$ represents a polymerizable group-containing group; $Wa^{x0}$ represents an $(n_{ax0}+1)$-valent aromatic hydrocarbon group; provided that $Ra^{x0}$ and $Wa^{x0}$ may together form a fused ring structure; and $n_0$ represents an integer of 1 to 3. In Formula (a10-1), $Ra^{x1}$ represents a polymerizable group-containing group; $Wa^{x1}$ represents an $(n_{ax1}+1)$-valent aromatic hydrocarbon group, provided that $Ra^{x1}$ and $Wa^{x1}$ may together form a fused ring structure; and $n_{ax1}$ represents an integer of 1 to 3.

In Formula (1), $R^z$ represents a hydrogen atom or a methyl group; $Z^1$ represents a single bond, a methylene group, —C(=O)—O—$R^{z1}$—, —O—$R^{z1}$—, —O—C(=O)—$R^{z1}$—, or —$R^{z2}$—$R^{z1}$—, provided that $R^{z1}$ represents a single bond, a linear, branched, or cyclic alkylene group having 1 to 6 carbon atoms which may have an ester group or an ether group, an arylene group having 6 to 10 carbon atoms which may have an ester group or an ether group, or an alkenylene group having 2 to 10 carbon atoms which may have an ester group or an ether group, and $R^{z2}$ represents a phenylene group or a naphthylene group; and $Z^2$ represents Fe, Co, Ni, Cr, or Ru.

According to a second aspect of the present invention, a method of forming a resist pattern is provided, including: forming a resist film on a support using the resist composition according to the first aspect; exposing the resist film; and developing the exposed resist film to form a resist pattern.

According to a third aspect of the present invention, a polymer compound is provided which has a constitutional unit (a0) derived from a compound represented by Formula (a0-1) and a constitutional unit (a10) derived from a compound represented by Formula (a10-1) and does not have a constitutional unit represented by Formula (1).

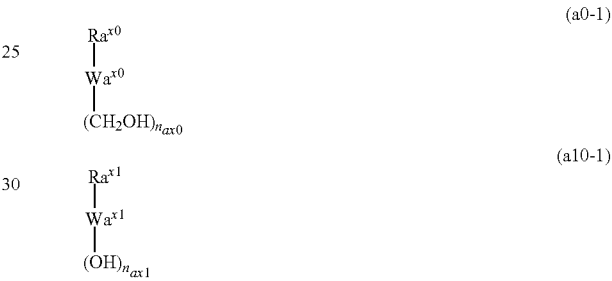

In Formula (a0-1), $Ra^{x0}$ represents a polymerizable group-containing group; $Wa^{x0}$ represents an $(n_{ax0}+1)$-valent aromatic hydrocarbon group, provided that $Ra^{x0}$ and $Wa^{x0}$ may together form a fused ring structure; and $n_{ax0}$ represents an integer of 1 to 3. In Formula (a10-1), $Ra^{x1}$ represents a polymerizable group-containing group; $Wa^{x1}$ represents an $(n_{ax1}+1)$-valent aromatic hydrocarbon group, provided that $Ra^{x1}$ and $Wa^{x1}$ may together form a fused ring structure; and $n_{ax1}$ represents an integer of 1 to 3.

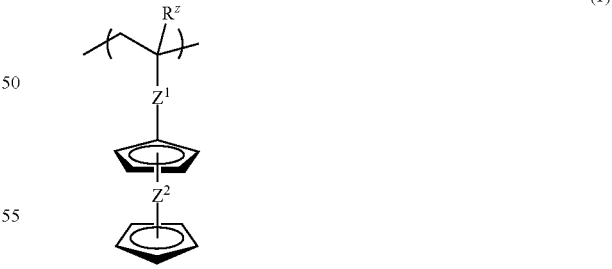

In Formula (1), $R^z$ represents a hydrogen atom or a methyl group; $Z^1$ represents a single bond, a methylene group, —C(=O)—O—$R^{z1}$—, —O—$R^{z1}$—, —O—C(=O)—$R^{z1}$—, or —$R^{z2}$—$R^{z1}$—, provided that $R^{z1}$ represents a single bond, a linear, branched, or cyclic alkylene group having 1 to 6 carbon atoms which may have an ester group or an ether group, an arylene group having 6 to 10 carbon atoms which may have an ester group or an ether group, or an alkenylene group having 2 to 10 carbon atoms which may have an ester group or an ether group, and $R^{z2}$ represents a phenylene group or a naphthylene group; and $Z^2$ represents Fe, Co, Ni, Cr, or Ru.

According to the resist composition and the method for forming a resist pattern of the present invention, it is possible to improve the sensitivity, the resolution, and the roughness.

In terms of improving the sensitivity, the resolution, and the roughness at the time of forming a resist pattern, the polymer compound of the present invention is useful as a base material component for a resist composition.

DETAILED DESCRIPTION OF THE INVENTION

In the present specification and claims, the term "aliphatic" is a concept relative to aromatic and means a group or a compound that does not have aromaticity, or the like.

The concept of "alkyl group" includes a linear, branched, or cyclic monovalent saturated hydrocarbon group unless otherwise noted. The same applies to an alkyl group in an alkoxy group.

The concept of "alkylene group" includes a linear, branched, or cyclic divalent saturated hydrocarbon group unless otherwise noted.

A "halogenated alkyl group" indicates a group formed by some or all hydrogen atoms in an alkyl group being substituted with halogen atoms, and examples of the halogen atoms include a fluorine atom, a chlorine atom, a bromine atom, and an iodine atom.

A "fluorinated alkyl group" or a "fluorinated alkylene group" indicates a group formed by some or all hydrogen atoms in an alkyl group or an alkylene group being substituted with fluorine atoms.

A "constitutional unit" indicates a monomer unit constituting a polymer compound (a resin, a polymer, or a copolymer).

The description "may have a substituent" includes a case where a hydrogen atom (—H) is substituted with a monovalent group and a case where a methylene group (—$CH_2$—) is substituted with a divalent group.

The concept of "exposure" includes general irradiation with radiation.

A "constitutional unit derived from acrylic acid ester" indicates a constitutional unit formed by an ethylenic double bond of acrylic acid ester being cleaved.

Further, "acrylic acid ester" indicates a compound in which a hydrogen atom in the terminal of a carboxy group of acrylic acid ($CH_2$=CH—COOH) is substituted with an organic group.

In acrylic acid ester, a hydrogen atom bonded to a carbon atom in the α-position may be substituted with a substituent. The substituent ($R^{\alpha 0}$) that substitutes for a hydrogen atom bonded to a carbon atom at the α-position is an atom or a group other than a hydrogen atom, and examples thereof include an alkyl group having 1 to 5 carbon atoms and a halogenated alkyl group having 1 to 5 carbon atoms. In addition, the substituent ($R^{\alpha 0}$) includes itaconic acid diester substituted with a substituent having an ester bond and the substituent ($R^{\alpha 0}$) includes α-hydroxy acrylic ester substituted with a hydroxyalkyl group or a group that modifies the hydroxyl group thereof. Further, the carbon atom at the α-position of acrylic acid ester indicates a carbon atom to which a carbonyl group of acrylic acid is bonded unless otherwise noted.

Hereinafter, acrylic acid ester formed by a hydrogen atom bonded to a carbon atom at the α-position being substituted with a substituent is also referred to as α-substituted acrylic acid ester. Further, the acrylic acid ester and the α-substituted acrylic acid ester are also collectively referred to as "(α-substituted)acrylic acid ester".

A "constitutional unit derived from acrylamide" indicates a constitutional unit formed by an ethylenic double bond of acrylamide being cleaved.

In acrylamide, a hydrogen atom bonded to a carbon atom at the α-position may be substituted with a substituent, and either or both of hydrogen atoms in an amino group of acrylamide may be substituted with substituents. Further, the carbon atom at the α-position of acrylamide indicates a carbon atom to which a carbonyl group of acrylamide is bonded unless otherwise noted.

Examples of the substituent that substitutes for a hydrogen atom bonded to a carbon atom at the α-position of acrylamide are the same as those described as examples of the substituent at the α-position (substituent ($R^{\alpha 0}$)) in the α-substituted acrylic acid ester.

A "constitutional unit derived from hydroxystyrene derivative" indicates a constitutional unit formed by an ethylenic double bond of hydroxystyrene being cleaved. A "constitutional unit derived from a hydroxystyrene derivative" indicates a constitutional unit formed by an ethylenic double bond of a hydroxystyrene derivative being cleaved.

A "hydroxystyrene derivative" indicates a derivative formed by a hydrogen atom at the α-position of hydroxystyrene being substituted with another substituent such as an alkyl group or a halogenated alkyl group, and the concept of the "hydroxystyrene derivative" includes these derivatives. Examples of these derivatives include a derivative formed by a hydrogen atom of a hydroxyl group of hydroxystyrene, in which a hydrogen atom at the α-position may be substituted with a substituent, being substituted with an organic group; and a derivative formed by a substituent other than a hydroxyl group being bonded to a benzene ring of hydroxystyrene in which a hydrogen atom at the α-position may be substituted with a substituent. Further, the α-position (carbon atom at the α-position) indicates a carbon atom to which a benzene ring is bonded unless otherwise noted.

Examples of the substituent that substitutes for a hydrogen atom at the α-position of hydroxystyrene are the same as those described as examples of the substituent at the α-position in the α-substituted acrylic acid ester.

A "constitutional unit derived from vinylbenzoic acid or a vinylbenzoic acid derivative" indicates a constitutional unit formed by an ethylenic double bond of vinylbenzoic acid or a vinylbenzoic acid derivative being cleaved.

A "vinylbenzoic acid derivative" indicates a derivative formed by a hydrogen atom at the α-position of vinylbenzoic acid being substituted with another substituent such as an alkyl group or a halogenated alkyl group, and the concept of the "vinylbenzoic acid derivative" includes these derivatives. Examples of these derivatives include a derivative formed by a hydrogen atom of a carboxy group of vinylbenzoic acid, in which a hydrogen atom at the α-position may be substituted with a substituent, being substituted with an organic group; and a derivative formed by a substituent other than a hydroxyl group and a carboxy group being bonded to a benzene ring of vinylbenzoic acid in which a hydrogen atom at the α-position may be substituted with a substituent. Further, the α-position (carbon atom at the α-position) indicates a carbon atom to which a benzene ring is bonded unless otherwise noted.

The concept of "styrene" includes those formed by hydrogen atoms in styrene and the α-position of styrene being substituted with other substituents such as an alkyl group and a halogenated alkyl group.

A "styrene derivative" indicates a derivative formed by a hydrogen atom at the α-position of styrene being substituted with another substituent such as an alkyl group or a halogenated alkyl group, and the concept of the "styrene derivative" includes these derivatives. Examples of these derivatives include those formed by a substituent being bonded to a benzene ring of hydroxystyrene in which a hydrogen atom at the α-position may be substituted with a substituent. Further, the α-position (carbon atom at the α-position) indicates a carbon atom to which a benzene ring is bonded unless otherwise noted.

A "constitutional unit derived from styrene" or a "constitutional unit derived from a styrene derivative" indicates a constitutional unit formed by an ethylenic double bond of styrene or a styrene derivative being cleaved.

As the alkyl group as a substituent at the α-position, a linear or branched alkyl group is preferable, and specific examples thereof include an alkyl group having 1 to 5 carbon atoms (such as a methyl group, an ethyl group, a propyl group, an isopropyl group, an n-butyl group, an isobutyl group, a tert-butyl group, a pentyl group, an isopentyl group, or a neopentyl group).

Further, specific examples of the halogenated alkyl group as a substituent at the α-position include groups formed by some or all hydrogen atoms in the "alkyl group as a substituent at the α-position" being substituted with halogen atoms. Examples of the halogen atoms include a fluorine atom, a chlorine atom, a bromine atom, and an iodine atom. Among these, a fluorine atom is particularly preferable.

In addition, specific examples of the hydroxyalkyl group as a substituent at the α-position include groups formed by some or all hydrogen atoms in the "alkyl group as a substituent at the α-position" being substituted with hydroxyl groups. The number of hydroxyl groups in the hydroxyalkyl group is preferably in a range of 1 to 5 and most preferably 1.

Resist Composition

A resist composition according to a first aspect of the present invention generates an acid when exposed and the solubility thereof in a developer is changed due to an action of an acid.

As an embodiment of such a resist composition, a resist composition that contains a base material component (A) (hereinafter, also referred to as an "(A) component") whose solubility in a developer is changed due to an action of an acid is exemplified.

In the resist composition of the present embodiment, the (A) component contains a polymer compound (A1) (hereinafter, referred to as an "(A1) component") that has a constitutional unit derived from a compound represented by Formula (a0-1) and a constitutional unit (a10) derived from a compound represented by Formula (a10-1) and does not have a constitutional unit represented by Formula (1).

In a case where a resist film is formed using the resist composition of the present embodiment and the resist film is selectively exposed, an acid is generated in the exposed portion of the resist film so that the solubility in a developer of the (A) component is changed due to an action of the acid, but the solubility in a developer of the (A) component is not changed in the unexposed portion of the resist film. Therefore, a difference in solubility in a developer is generated between the exposed portion and the unexposed portion of the resist film. Accordingly, in a case where the resist film is alkali-developed, the unexposed portion of the resist film is dissolved and removed and then a negative type resist pattern is formed.

In the present specification, a resist composition that forms a positive type resist pattern by the exposed portion of the resist film being dissolved and removed is referred to as a positive type resist composition; and a resist composition that forms a negative type resist pattern by the unexposed portion of the resist film being dissolved and removed is referred to as a negative type resist composition.

The resist composition of the present embodiment is suitable for an alkali development process performed using an alkali developer during a development treatment when a resist pattern is formed.

The resist composition of the present embodiment has acid-generating ability for generating an acid when exposed, and the (A) component may generate an acid when exposed or an additive component blended separately from the (A) component may generate an acid when exposed.

Specifically, (1) the resist composition of the present embodiment may contain an acid generator component (B) (hereinafter, referred to as a "(B) component") that generates an acid when exposed; (2) the (A) component may be a component that generates an acid when exposed; and (3) the (A) component is a component that generates an acid when exposed and may further contain the (B) component.

In other words, in a case of (2) or (3) described above, the (A) component becomes a "base material component which generates an acid when exposed and whose solubility in a developer is changed due to an action of an acid". In a case where the (A) component is a base material component which generates an acid when exposed and whose solubility in a developer is changed due to an action of an acid, it is preferable that an (A1) component described below be a polymer compound which generates an acid when exposed and whose solubility in a developer is changed due to an action of an acid. As such a polymer compound, a resin having a constitutional unit that generates an acid when exposed can be used. As a monomer from which a constitutional unit generating an acid when exposed is derived, known ones can be used. It is particularly preferable that the resist composition of the present embodiment correspond to the case of (1) described above.

(A) Component

The (A) component is a base material component whose solubility in a developer is changed due to an action of an acid.

The "base material component" in the present invention is an organic compound having film-forming ability, and an organic compound having a molecular weight of 500 or greater is preferably used. In a case where the molecular weight of the organic compound is 500 or greater, the film-forming ability is improved and a nano-level resist pattern is easily formed.

The organic compound used as the base material component is roughly classified into a non-polymer and a polymer.

A non-polymer having a molecular weight of 500 or greater and less than 4000 is typically used as the non-polymer. Hereinafter, a "low-molecular-weight compound" described below indicates a non-polymer having a molecular weight of 500 or greater and less than 4000.

A polymer having a molecular weight of 1000 or greater is typically used as the polymer. Hereinafter, a "resin", a "polymer compound", or a "polymer" described below indicates a polymer having a molecular weight of 1000 or greater.

As the molecular weight of a polymer, a weight-average molecular weight in terms of polystyrene according to gel permeation chromatography (GPC) is used.

In the resist composition of the present embodiment, as the (A) component, at least a polymer compound (A1) that has a constitutional unit derived from a compound represented by Formula (a0-1) (hereinafter, referred to as a "constitutional unit (a0)") and a constitutional unit derived from a compound represented by Formula (a10-1) (hereinafter, referred to as a "constitutional unit (a10)") and does not have a constitutional unit represented by Formula (1) is used. Further, a polymer compound other than the (A1) component and/or a low-molecular-weight compound may be used in combination.

In a case where a resist film is formed using the resist composition that contains at least the (A1) component and the resist film is selectively exposed, in the exposed portion of the resist film, an acid is generated from a (B) component in a case where the resist composition contains the (B) component and crosslinking occurs between (A1) components due to an action of the acid through the constitutional unit (a0) having crosslinking properties so that the solubility of the exposed portion of the resist film in an alkali developer is decreased. Accordingly, in a case where the resist film obtained by coating the support with the resist composition of the present embodiment is selectively exposed when a resist pattern is formed, the solubility of the unexposed portion of the resist film in an alkali developer is not changed while the solubility of the exposed portion of the resist film in an alkali developer is changed into insolubility. Therefore, a negative type resist pattern is formed by performing development using an alkali developer.

Regarding (A1) Component

The (A1) component is a polymer compound that has a constitutional unit (constitutional unit (a0)) derived from a compound represented by Formula (a0-1) and a constitutional unit (constitutional unit (a10)) derived from a compound represented by Formula (a10-1) and does not have a constitutional unit represented by Formula (1).

It is preferable that the (A1) component be a copolymer that further has a constitutional unit having an aromatic ring (excluding an aromatic ring to which a hydroxy group is bonded) in a side chain in addition to the constitutional unit (a0) and the constitutional unit (a10).

The (A1) component may be a copolymer that further has a constitutional unit containing a non-acid-dissociable group in a side chain in addition to the constitutional unit (a0) and the constitutional unit (a10).

Further, the (A1) component may further have other constitutional units in addition to the constitutional unit (a0) and the constitutional unit (a10).

<<Constitutional Unit (a0)>>

The constitutional unit (a0) is a constitutional unit derived from a compound represented by Formula (a0-1) and has crosslinkable properties.

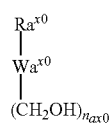

(a0-1)

In Formula (a0-1), $Ra^{x0}$ represents a polymerizable group-containing group; $Wa^{x0}$ represents an $(n_{ax0}+1)$-valent aromatic hydrocarbon group, provided that $Ra^{x0}$ and $Wa^{x0}$ may together form a fused ring structure; and $n_{ax0}$ represents an integer of 1 to 3.

In Formula (a0-1), $Ra^{x0}$ represents a polymerizable group-containing group.

A "polymerizable group" in $Ra^{x0}$ is a group that enables polymerization of a compound containing a polymerizable group through radical polymerization or the like and indicates a group having a multiple bond such as an ethylenic double bond between carbon atoms.

Examples of the polymerizable group include a vinyl group, an allyl group, an acryloyl group, a methacryloyl group, a fluorovinyl group, a difluorovinyl group, a trifluorovinyl group, a difluorotrifluoromethyl vinyl group, a trifluoroallyl group, a perfluoroallyl group, a trifluoromethyl acryloyl group, a nonylfluorobutyl acryloyl group, a vinyl ether group, a fluorine-containing vinyl ether group, an allyl ether group, a fluorine-containing allyl ether group, a styryl group, a vinyl naphthyl group, a fluorine-containing styryl group, a fluorine-containing vinyl naphthyl group, a norbornyl group, a fluorine-containing norbornyl group, and a silyl group.

The polymerizable group-containing group may be a group composed of only a polymerizable group or a group composed of a polymerizable group and other groups other than the polymerizable group. Examples of the group other than the polymerizable group include a divalent hydrocarbon group which may have a substituent and a divalent linking group having a heteroatom.

Suitable examples of $Ra^{x0}$ include a group represented by Chemical Formula: $CH_2=C(R)-Ya^{x0}-$. In this chemical formula, R represents a hydrogen atom, an alkyl group having 1 to 5 carbon atoms, or a halogenated alkyl group having 1 to 5 carbon atoms, and $Ya^{x0}$ represents a single bond or a divalent linking group.

In the above-described chemical formula, as the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group formed by some or all hydrogen atoms in the alkyl group having 1 to 5 carbon atoms being substituted with halogen atoms. Examples of the halogen atoms include a fluorine atom, a chlorine atom, a bromine atom, and an iodine atom. Among these, a fluorine atom is particularly preferable. R represents preferably a hydrogen atom, an alkyl group having 1 to 5 carbon atoms, or a fluorinated alkyl group having 1 to 5 carbon atoms and particularly preferably a hydrogen atom or a methyl group in terms of industrial availability.

In the above-described chemical formula, the divalent linking group as $Ya^{x0}$ is not particularly limited, and suitable examples thereof include a divalent hydrocarbon group which may have a substituent and a divalent linking group having a heteroatom.

Divalent Hydrocarbon Group which May have Substituent

In a case where $Ya^{x0}$ represents a divalent hydrocarbon group which may have a substituent, the hydrocarbon group may be an aliphatic hydrocarbon group or an aromatic hydrocarbon group.

Aliphatic Hydrocarbon Group as $Ya^{x0}$

An aliphatic hydrocarbon group indicates a hydrocarbon group that does not have aromaticity. The aliphatic hydrocarbon group may be saturated or unsaturated. However, a saturated aliphatic hydrocarbon group is usually preferable.

Examples of the aliphatic hydrocarbon group include a linear or branched aliphatic hydrocarbon group and an aliphatic hydrocarbon group having a ring in the structure.

Linear or Branched Aliphatic Hydrocarbon Group

The number of carbon atoms of the linear aliphatic hydrocarbon group is preferably in a range of 1 to 10, more preferably in a range of 1 to 6, still more preferably in a range of 1 to 4, and most preferably in a range of 1 to 3.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The number of carbon atoms of the branched aliphatic hydrocarbon group is preferably in a range of 2 to 10, more preferably in a range of 3 to 6, still more preferably 3 or 4, and most preferably 3.

As the branched aliphatic hydrocarbon group, a branched alkylene group is preferable, and specific examples thereof include an alkylalkylene group, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyltrimethylene group such as —$CH(CH_3)CH_2CH_2$— and —$CH_2CH(CH_3)CH_2$—; and an alkyltetramethylene group such as —$CH(CH_3)CH_2CH_2CH_2$— and —$CH_2CH(CH_3)CH_2CH_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms, and a carbonyl group.

Aliphatic Hydrocarbon Group Having Ring in Structure

Examples of the aliphatic hydrocarbon group having ring in structure Examples of the aliphatic hydrocarbon group having a ring in the structure include a cyclic aliphatic hydrocarbon group (group formed by removing two hydrogen atoms from an aliphatic hydrocarbon ring) which may have a substituent having a heteroatom in the ring structure; a group formed by the cyclic aliphatic hydrocarbon group being bonded to the terminal of a linear or branched aliphatic hydrocarbon group; and a group formed by the cyclic aliphatic hydrocarbon group being interposed in the middle of a linear or branched aliphatic hydrocarbon group. Examples of the linear or branched aliphatic hydrocarbon group are the same as those described above.

The number of carbon atoms of the cyclic aliphatic hydrocarbon group is preferably in a range of 3 to 20 and more preferably in a range of 3 to 12.

The cyclic aliphatic hydrocarbon group may be a polycyclic or monocyclic group. As the monocyclic alicyclic hydrocarbon group, a group formed by removing two hydrogen atoms from a monocycloalkane is preferable. The number of carbon atoms of the monocycloalkane is preferably in a range of 3 to 6, and specific examples thereof include cyclopentane and cyclohexane. As the polycyclic alicyclic hydrocarbon group, a group formed by removing two hydrogen atoms from a polycycloalkane is preferable. The number of carbon atoms of the polycycloalkane is preferably in a range of 7 to 12, and specific examples thereof include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

As the alkyl group as a substituent, an alkyl group having 1 to 5 carbon atoms is preferable; and a methyl group, an ethyl group, a propyl group, an n-butyl group, and a tert-butyl group are more preferable.

As the alkoxy group as a substituent, an alkoxy group having 1 to 5 carbon atoms is preferable; a methoxy group, an ethoxy group, an n-propoxy group, an iso-propoxy group, an n-butoxy group, and a tert-butoxy group are more preferable; and a methoxy group and an ethoxy group are still more preferable.

Examples of the halogen atom as a substituent include a fluorine atom, a chlorine atom, a bromine atom, and an iodine atom. Among these, a fluorine atom is preferable.

Examples of the halogenated alkyl group for the substituent include groups in which part or all of the hydrogen atoms within the aforementioned alkyl groups have been substituted with the aforementioned halogen atoms.

The cyclic aliphatic hydrocarbon group may have part of the carbon atoms constituting the ring structure thereof substituted with a substituent containing a hetero atom. As the substituents having heteroatoms, —O—, —C(=O)—O—, —S—, —S(=O)$_2$—, or —S(=O)$_2$—O— are preferable.

Aromatic Hydrocarbon Group as $Ya^{x0}$

The aromatic hydrocarbon group is a hydrocarbon group having at least one aromatic ring.

The aromatic ring is not particularly limited as long as the aromatic ring is a cyclic conjugated system having $4n+2\pi$ electrons, and the aromatic ring may be monocyclic or polycyclic. The number of carbon atoms of the aromatic ring is preferably in a range of 5 to 30, more preferably in a range of 5 to 20, still more preferably in a range of 6 to 15, and particularly preferably in a range of 6 to 12. Here, it is determined that the number of carbon atoms does not include the number of carbon atoms in a substituent.

Specific examples of the aromatic ring include an aromatic hydrocarbon ring such as benzene, naphthalene, anthracene, and phenanthrene; and an aromatic heterocycle formed by some carbon atoms constituting the aromatic hydrocarbon ring being substituted with a heteroatom. Examples of the heteroatom in the aromatic heterocycle include an oxygen atom, a sulfur atom, and a nitrogen atom. Specific examples of the aromatic heterocycle include a pyridine ring and thiophene ring.

Specific examples of the aromatic hydrocarbon group include a group (such as an arylene group or a heteroarylene group) formed by removing two hydrogen atoms from the aromatic hydrocarbon ring or the aromatic heterocycle; a group formed by removing two hydrogen atoms from an aromatic compound (biphenyl, fluorene or the like) having two or more aromatic rings; and a group (a group formed by removing one hydrogen atom from an aryl group in an arylalkyl group such as a benzyl group, a phenethyl group, a 1-naphthylmethyl group, a 2-naphthylmethyl group, a 1-naphthylethyl group, and a 2-naphthylethyl group) formed by one hydrogen atom in a group (such as an aryl group or a heteroaryl group), obtained by removing one hydrogen atom from the aforementioned aromatic hydrocarbon ring or the aromatic heterocycle, being substituted with an alkylene group. The number of carbon atoms of the alkylene group bonded to the aryl group or the heteroaryl group is preferably in a range of 1 to 4, more preferably 1 or 2, and particularly preferably 1.

In the aromatic hydrocarbon group, a hydrogen atom in the aromatic hydrocarbon group may be substituted with a substituent. For example, a hydrogen atom bonded to an aromatic ring in the aromatic hydrocarbon group may be substituted with a substituent. Examples of the substituent include an alkyl group, an alkoxy group, a halogen atom, a halogenated alkyl group, and a hydroxyl group.

As the alkyl group as the substituent, an alkyl group having 1 to 5 carbon atoms is preferable; and a methyl group, an ethyl group, a propyl group, an n-butyl group, or a tert-butyl group is more preferable.

Examples of the alkoxy group, the halogen atom, and the halogenated alkyl group as the substituent include those described as examples of the substituent substituting a hydrogen atom included in the cyclic aliphatic hydrocarbon group.

Divalent Linking Group Having a Heteroatom

In a case where $Ya^{x0}$ represents a divalent linking group having a heteroatom, preferred examples of the linking group include a group represented by —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, —S(=O)$_2$—O—, Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$— [in the formula, $Y^{21}$ and $Y^{22}$ each independently represents a divalent hydrocarbon group which may have a substituent, O represents an oxygen atom, and m'' represents an integer of 0 to 3].

In a case where the divalent linking group having a heteroatom represents —C(=O)—NH—, —C(=O)—NH—C(=O)—, —NH—, or —NH—C(=NH)—, H in the formula may be substituted with a substituent such as an alkyl group or an acyl group. The number of carbon atoms of the substituent (such as an alkyl group or an acyl group) is preferably in a range of 1 to 10, more preferably in a range of 1 to 8, and particularly preferably in a range of 1 to 5.

In Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$—, $Y^{21}$ and $Y^{22}$ each independently represents a divalent hydrocarbon group which may have a substituent Examples of the divalent hydrocarbon group are the same as those for the divalent linking group (divalent hydrocarbon group which may have a substituent) described above.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. As the alkyl group in the alkylmethylene group, a linear alkyl group having 1 to 5 carbon atoms is preferable, a linear alkyl group having 1 to 3 carbon atoms is more preferable, and a methyl group is most preferable.

In the group represented by Formula —[$Y^{21}$—C(=O)—O]$_{m''}$—$Y^{22}$—, m'' represents an integer of 0 to 3, preferably an integer of 0 to 2, more preferably 0 or 1, and particularly preferably 1. In other words, as the group represented by Formula —[$Y^{21}$—C(=O)—O]$_{m''}$—$Y^{22}$—, a group represented by Formula —$Y^{21}$—C(=O)—O—$Y^{22}$— is particularly preferable. Among the examples, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

Among the examples described above, it is preferable that $Ya^{x0}$ represent a single bond, an ester bond [—C(=O)—O—, or —O—C(=O)—], an ether bond (—O—), a linear or branched alkylene group, or a combination of these and more preferable that $Ya^{x0}$ represent a single bond or an ester bond [—C(=O)—O—, or —O—C(=O)—].

In Formula (a0-1), $Wa^{x0}$ represents an ($n_{ax0}$+1)-valent aromatic hydrocarbon group.

Examples of the aromatic hydrocarbon group as $Wa^{x0}$ include a group formed by removing ($n_{ax0}$+1) hydrogen atoms from an aromatic ring. Here, the aromatic ring is not particularly limited as long as the aromatic ring is a cyclic conjugated system having 4n+2 π electrons, and the aromatic ring may be monocyclic or polycyclic. The number of carbon atoms of the aromatic ring is preferably in a range of 5 to 30, more preferably in a range of 5 to 20, still more preferably in a range of 6 to 15, and particularly preferably in a range of 6 to 12. Specific examples of the aromatic ring include an aromatic hydrocarbon ring such as benzene, naphthalene, anthracene, or phenanthrene; and an aromatic heterocycle formed by some carbon atoms constituting the aromatic hydrocarbon ring being substituted with a heteroatom. Examples of the heteroatom in the aromatic heterocycle include an oxygen atom, a sulfur atom, and a nitrogen atom. Specific examples of the aromatic heterocycle include a pyridine ring and thiophene ring.

Further, examples of the aromatic hydrocarbon group as $Wa^{x0}$ also include a group formed by removing ($n_{ax0}$+1) hydrogen atoms from an aromatic compound (biphenyl, fluorene or the like) having two or more aromatic rings.

Among these, it is preferable that $Wa^{x0}$ represent a group formed by removing ($n_{ax0}$+1) hydrogen atoms from benzene, naphthalene, anthracene, or biphenyl and more preferable that $Wa^{x0}$ represent a group formed by removing ($n_{ax0}$+1) hydrogen atoms from benzene.

$Ra^{x0}$ and $Wa^{x0}$ may together form a fused ring structure.

In a case where $Ra^{x0}$ and $Wa^{x0}$ together form a fused ring structure, the fused ring structure has an aromatic ring derived from $Wa^{x0}$. Further, a multiple bond, between carbon atoms, in a polymerizable group derived from $Ra^{x0}$ is cleaved so that the main chain of the (A1) component is formed. In other words, part of carbon atoms constituting the fused ring forms the main chain of the (A1) component.

In Formula (a0-1), $n_{ax0}$ represents an integer of 1 to 3 and preferably 1 or 2.

Specific preferred examples of the constitutional unit (a0) described above include a constitutional unit represented by Formula (a0-u1).

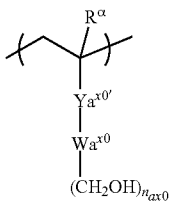

(a0-u1)

In Formula (a0-u1), $R^\alpha$ represents a hydrogen atom, a methyl group, or a trifluoromethyl group; $Ya^{x0\prime}$ represents a divalent linking group having a heteroatom or a single bond; $Wa^{x0}$ represents an ($n_{ax0}+1$)-valent aromatic hydrocarbon group; and $n_{ax0}$ represents an integer of 1 to 3.

In Formula (a0-u1), $R^\alpha$ represents a hydrogen atom, a methyl group, or a trifluoromethyl group. Among these, it is preferable that $R^\alpha$ represent a hydrogen atom or a methyl group.

In Formula (a0-u1), $Ya^{x0\prime}$ represents a divalent linking group having a heteroatom or a single bond.

The divalent linking group having a heteroatom as $Ya^{x0\prime}$ has the same definition as that for the divalent linking group having a heteroatom as $Ya^{x0}$. Among the examples, it is preferable that $Ya^{x0\prime}$ represent a single bond or an ester bond [—C(=O)—O— or —O—C(=O)—].

In Formula (a0-u1), $Wa^{x0}$ and no each has the same definition as that for $Wa^{x0}$ and $n_{ax0}$ in Formula (a0-1).

Suitable examples of the constitutional unit represented by Formula (a0-u1) include constitutional units respectively represented by Formulae (a0-u1-1) to (a0-u1-5).

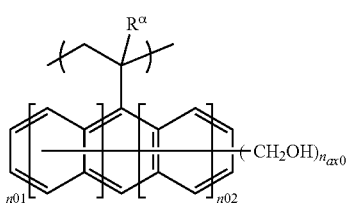

(a0-u1-1)

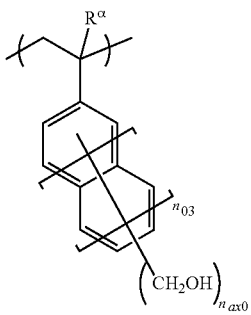

(a0-u1-2)

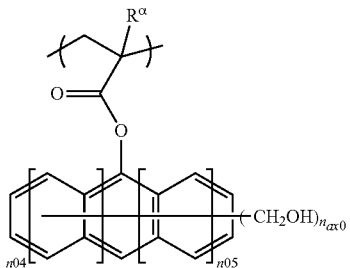

(a0-u1-3)

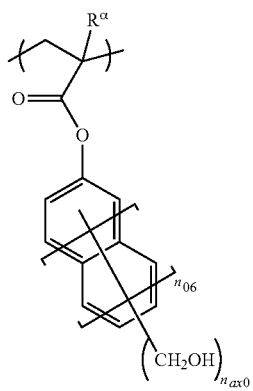

(a0-u1-4)

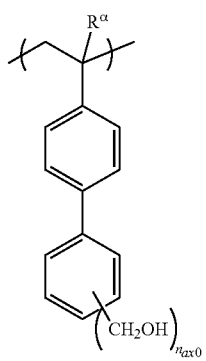

(a0-u1-5)

In the formulae, $R^\alpha$ represents a hydrogen atom, a methyl group, or a trifluoromethyl group; $n_{ax0}$ represents an integer of 1 to 3; $n_{01}$, $n_{02}$, $n_{04}$, and $n_{05}$ each independently represents 0 or 1; and $n_{03}$ and $n_{06}$ each independently represents 1 or 2.

Specific examples of the constitutional unit (constitutional unit (a0)) derived from a compound represented by Formula (a0-1) are shown below.

In each formula shown below, $R^\alpha$ represents a hydrogen atom, a methyl group, or a trifluoromethyl group.

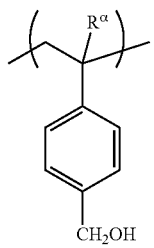

(a0-u1-11)

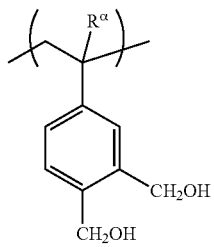

(a0-u1-12)

-continued
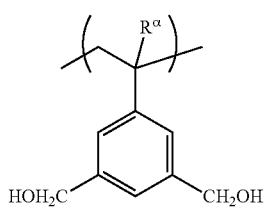
(a0-u1-13)
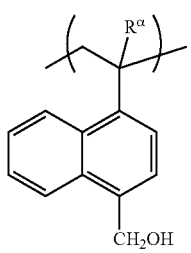
(a0-u1-14)
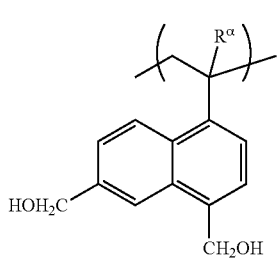
(a0-u1-15)
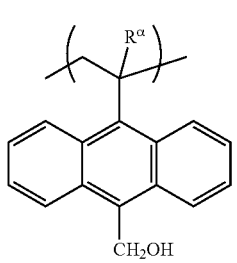
(ao-u1-16)
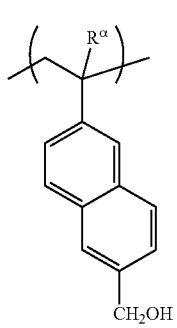
(a0-u1-21)
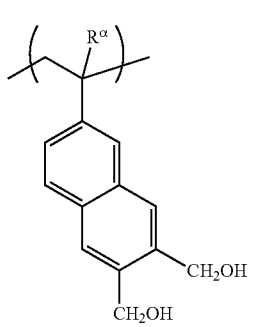
(a0-u1-22)
-continued
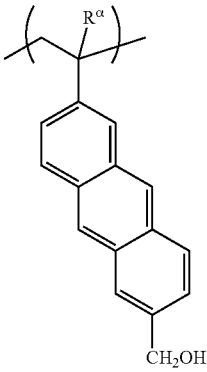
(a0-u1-23)
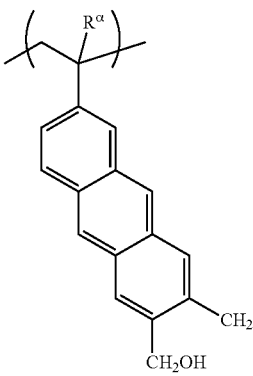
(a0-u1-24)
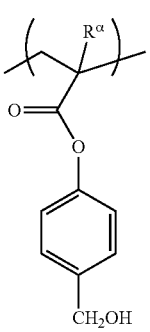
(a0-u1-31)
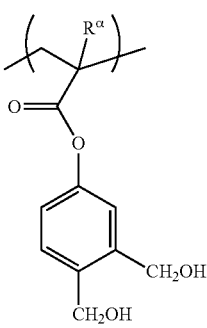
(a0-u1-32)

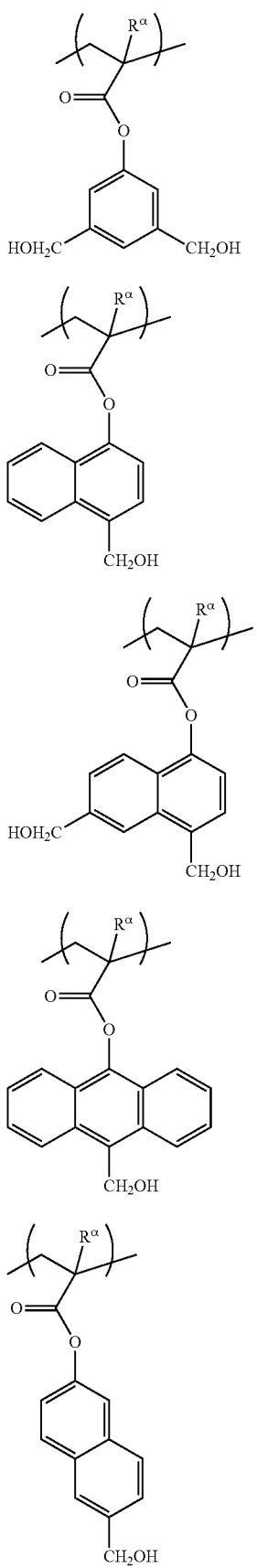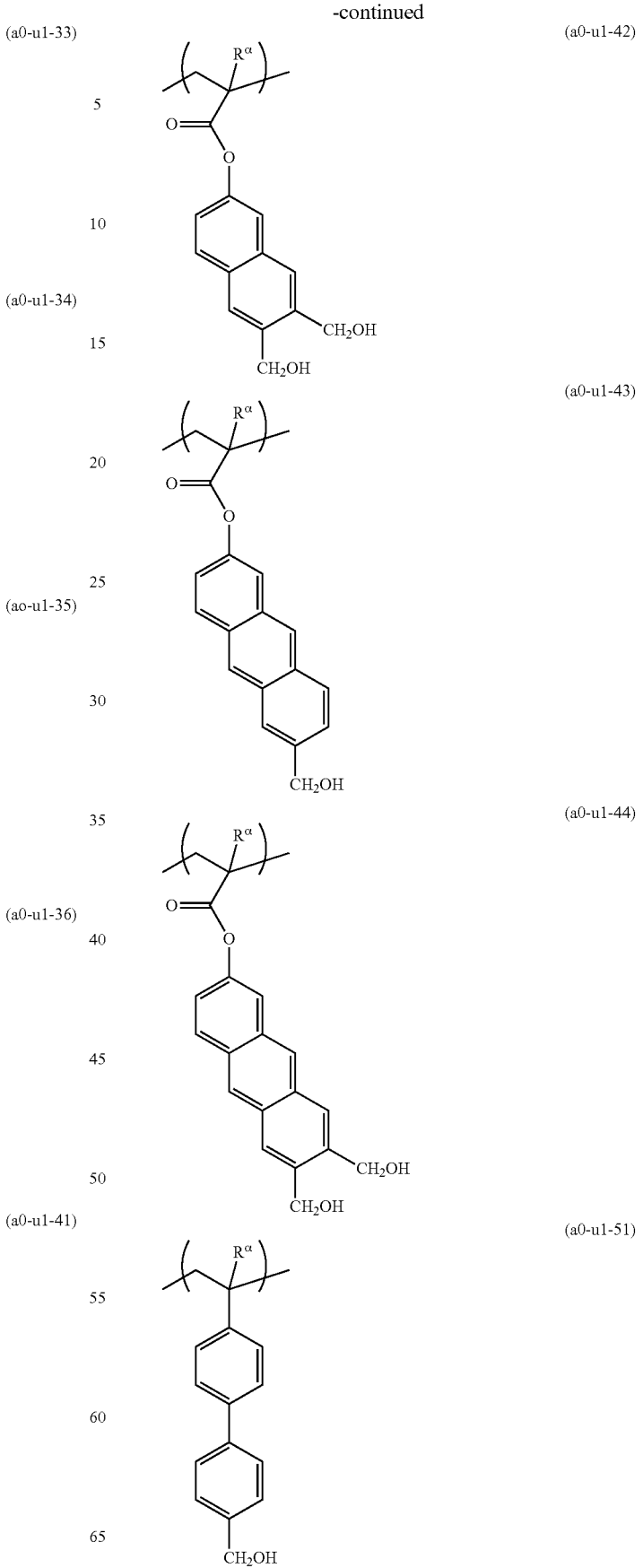

(a0-u1-52)

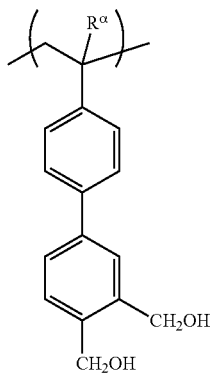

(a0-u1-53)

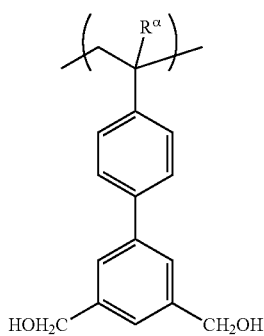

Suitable examples of the constitutional unit (a0) also include a constitutional unit represented by Formula (a0-u1-8) shown below. Specific examples thereof include a constitutional unit represented by Formula (a0-u1-81) shown below. In the following formulae, $n_{ax0}$ represents an integer of 1 to 3.

(a0-u1-8)

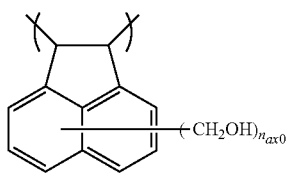

(a0-u1-81)

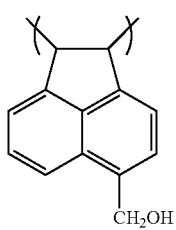

In the examples shown above, it is preferable that the constitutional unit (a0) be a constitutional unit represented by Formula (a0-u1-1) or a constitutional unit represented by Formula (a0-u1-3).

Among these, a constitutional unit represented by any of Chemical Formulae (a0-u1-11) to (a0-u1-13) and (a0-u1-31) to (a0-u1-33) is particularly preferable.

As the constitutional unit (a0) included in the (A1) component, one kind thereof may be used, or combination of two or more kinds thereof may be used.

The proportion of the constitutional unit (a0) in the (A1) component is preferably in a range of 5% to 95% by mole, more preferably in a range of 5% to 50% by mole, still more preferably in a range of 10% to 40% by mole, and particularly preferably in a range of 20% to 40% by mole with respect to the total amount (100% by mole) of all constitutional units constituting the (A1) component.

In a case where the proportion of the constitutional unit (a0) is greater than or equal to the lower limit, the sensitivity, the resolution, or the roughness of the resist composition is further improved. Further, in a case where the proportion thereof is less than or equal to the upper limit, the balance of the constitutional unit (a0) and other constitutional units is likely to be achieved.

<<Constitutional Unit (a10)>>

The constitutional unit (a10) is a constitutional unit derived from a compound represented by Formula (a10-1).

(a10-1)

In Formula (a10-1), $Ra^{x1}$ represents a polymerizable group-containing group; $Wa^{x1}$ represents an $(n_{ax1}+1)$-valent aromatic hydrocarbon group, provided that $Ra^{x1}$ and $Wa^{x1}$ may together form a fused ring structure; and $n_{ax1}$ represents an integer of 1 to 3.

In Formula (a10-1), $Ra^{x1}$ represents a polymerizable group-containing group and has the same definition as that for $Ra^{x0}$ in Formula (a0-1).

In Formula (a10-1), $Wa^{x1}$ represents an $(n_{ax0}+1)$-valent aromatic hydrocarbon group and has the same definition as that for $Wa^{x0}$ in Formula (a0-1).

$Ra^{x1}$ and $Wa^{x1}$ may together form a fused ring structure.

In a case where $Ra^{x1}$ and $Wa^{x1}$ together form a fused ring structure, the fused ring structure has an aromatic ring derived from $Wa^{x1}$. Further, a multiple bond, between carbon atoms, in a polymerizable group derived from $Ra^{x1}$ is cleaved so that the main chain of the (A1) component is formed. In other words, part of carbon atoms constituting the fused ring forms the main chain of the (A1) component.

In Formula (a10-1), $n_{ax1}$ represents an integer of 1 to 3 and preferably 1 or 2.

Specific preferred examples of the constitutional unit (a10) include a constitutional unit represented by Formula (a10-u1).

(a10-u1)

In the formula, $R^{\alpha}$ represents a hydrogen atom, a methyl group, or a trifluoromethyl group; $Ya^{x1}$ represents a divalent linking group having a heteroatom or a single bond; $Wa^{x1}$ represents an $(n_{ax1}+1)$-valent aromatic hydrocarbon group; and $n_{ax1}$ represents an integer of 1 to 3.

In Formula (a10-u1), $R^α$ represents a hydrogen atom, a methyl group, or a trifluoromethyl group. Among these, it is preferable that $R^α$ represent a hydrogen atom or a methyl group.

In Formula (a10-u1), $Ya^{x1}$ represents a divalent linking group having a heteroatom or a single bond.

The divalent linking group having a heteroatom as $Ya^{x1}$ has the same definition as that for the divalent linking group having a heteroatom as $Ya^{x0}$. Among the examples, it is preferable that $Ya^{x1}$ represent a single bond or an ester bond [—C(=O)—O— or —O—C(=O)—].

In Formula (a10-u1), $Wa^{x1}$ represents an $(n_{ax1}+1)$-valent aromatic hydrocarbon group. Examples of the aromatic hydrocarbon group as $Wa^{x1}$ include a group formed by removing $(n_{ax1}+1)$ hydrogen atoms from an aromatic ring. Here, the aromatic ring is not particularly limited as long as the aromatic ring is a cyclic conjugated system having $4n+2$ π electrons, and the aromatic ring may be monocyclic or polycyclic. The number of carbon atoms of the aromatic ring is preferably in a range of 5 to 30, more preferably in a range of 5 to 20, still more preferably in a range of 6 to 15, and particularly preferably in a range of 6 to 12. Specific examples of the aromatic ring include an aromatic hydrocarbon ring such as benzene, naphthalene, anthracene, or phenanthrene; and an aromatic heterocycle formed by some carbon atoms constituting the aromatic hydrocarbon ring being substituted with a heteroatom. Examples of the heteroatom in the aromatic heterocycle include an oxygen atom, a sulfur atom, and a nitrogen atom. Specific examples of the aromatic heterocycle include a pyridine ring and thiophene ring.

Further, examples of the aromatic hydrocarbon group as $Wa^{x1}$ also include a group formed by removing $(n_{ax1}+1)$ hydrogen atoms from an aromatic compound (such as biphenyl or fluorene) having two or more aromatic rings.

Among these, it is preferable that $Wa^{x1}$ represent a group formed by removing $(n_{ax1}+1)$ hydrogen atoms from an aromatic hydrocarbon ring such as benzene, naphthalene, anthracene, or phenanthrene, more preferable that $Wa^{x1}$ represent a group formed by removing $(n_{ax1}+1)$ hydrogen atoms from benzene, naphthalene, or anthracene, and still more preferable that $Wa^{x1}$ represent a group formed by removing $(n_{ax1}+1)$ hydrogen atoms from benzene or naphthalene.

In Formula (a10-u1), $n_{ax1}$ represents an integer of 1 to 3 and preferably 1 or 2.

Suitable examples of the constitutional unit represented by Formula (a10-u1) include constitutional units respectively represented by Formulae (a10-u1-1) to (a10-u1-4).

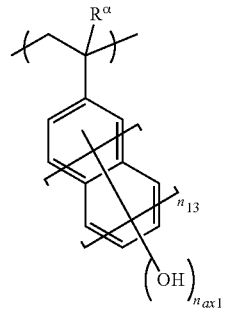

(a10-u1-2)

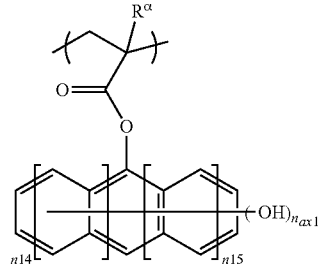

(a10-u1-3)

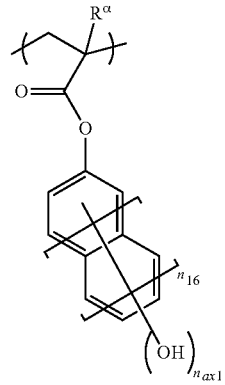

(a10-u1-4)

In the formulae, $R^α$ represents a hydrogen atom, a methyl group, or a trifluoromethyl group; $n_{ax1}$ represents an integer of 1 to 3; $n_{11}$, $n_{12}$, $n_{14}$, and $n_{15}$ each independently represents 0 or 1; and $n_{13}$ and $n_{16}$ each independently represents 1 or 2.

Specific examples of the constitutional unit (constitutional unit (a10)) derived from a compound represented by Formula (a10-1) are shown below.

In each formula shown below, $R^α$ represents a hydrogen atom, a methyl group, or a trifluoromethyl group.

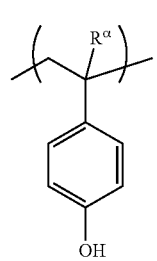

(a10-u1-11)

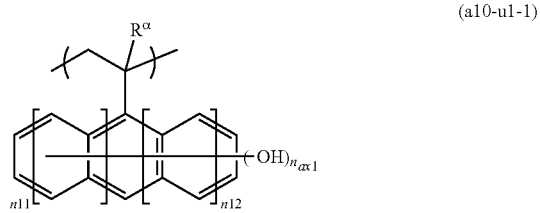

(a10-u1-1)

(a10-u1-12)
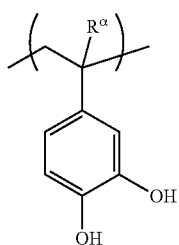
(a10-u1-13)
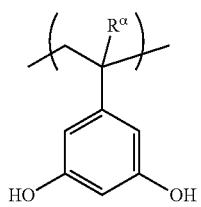
(a10-u1-14)
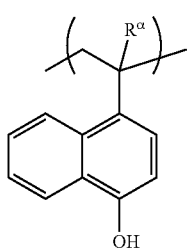
(a10-u1-15)
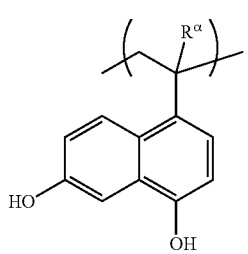
(a10-u1-16)
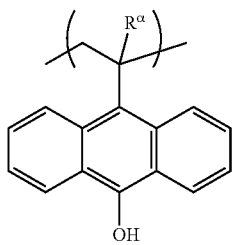
(a10-u1-21)
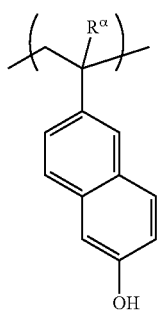
(a10-u1-22)
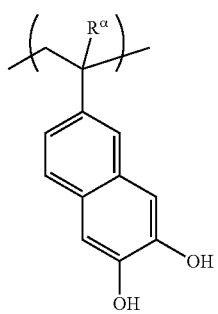
(a10-u1-23)
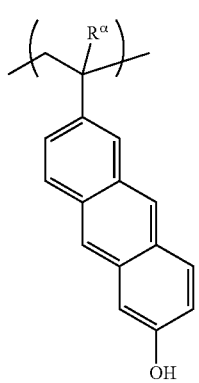
(a10-u1-24)
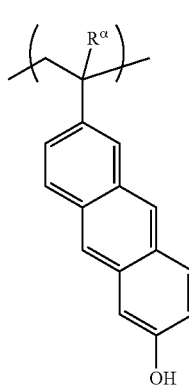
(a10-u1-31)
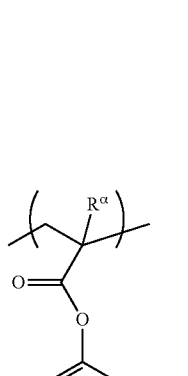
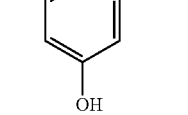

(a10-u1-32)
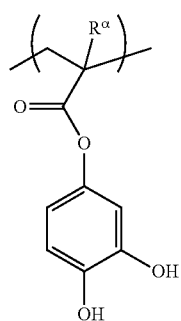
(a10-u1-33)
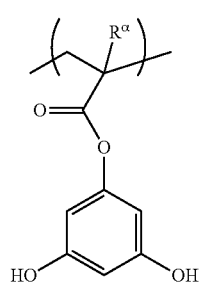
(a10-u1-34)
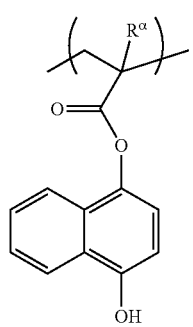
(a10-u1-35)
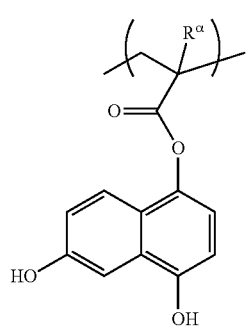
(a10-u1-36)
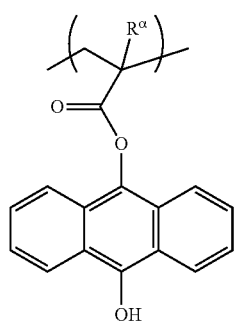
(a10-u1-41)
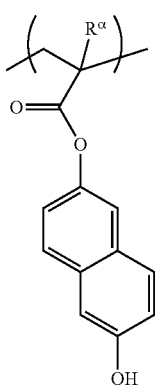
(a10-u1-42)
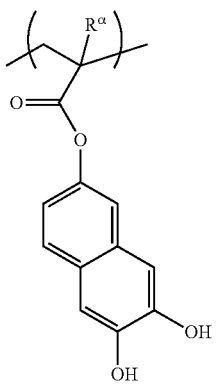
(a10-u1-43)
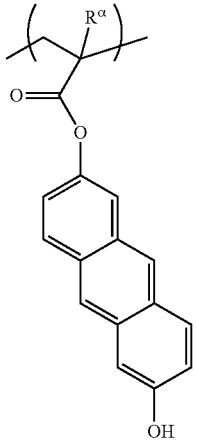

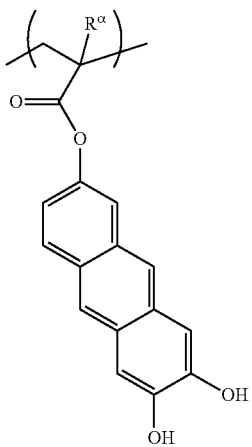

(a10-u10-44)

Suitable examples of the constitutional unit (a10) also include a constitutional unit represented by Formula (a10-u1-5) shown below. Specific examples thereof include a constitutional unit represented by Formula (a10-u1-51) shown below. In the following formulae, $n_{ax1}$ represents an integer of 1 to 3.

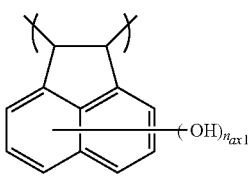

(a10-u1-5)

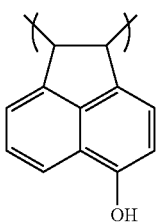

(a10-u1-51)

Among the examples shown above, as the constitutional unit (a10), at least one selected from the group consisting of constitutional units respectively represented by Formulae (a10-u1-1) to (a10-u1-4) is preferable and a constitutional unit represented by Formula (a10-u1-1) is more preferable.

Among these, as the constitutional unit (a10), a constitutional unit represented by any of Chemical Formulae (a10-u1-11), (a10-u1-21), and (a10-u1-31) is preferable.

As the constitutional unit (a10) included in the (A1) component, one kind thereof may be used, or combination of two or more kinds thereof may be used.

The proportion of the constitutional unit (a10) in the (A1) component is preferably in a range of 50% to 95% by mole, more preferably in a range of 55% to 80% by mole, and still more preferably in a range of 60% to 70% by mole with respect to the total amount (100% by mole) of all constitutional units constituting the (A1) component.

In a case where the proportion of the constitutional unit (a10) is greater than or equal to the lower limit, the sensitivity, the developability, or the roughness is further improved. Further, in a case where the proportion thereof is less than or equal to the upper limit, the balance of the constitutional unit (a10) and other constitutional units is likely to be achieved.

<<Constitutional Unit Represented by Formula (1)>>

The (A1) component does not have a constitutional unit represented by Formula (1).

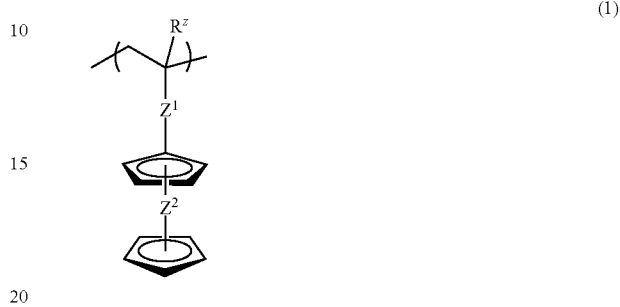

(1)

In Formula (1), $R^z$ represents a hydrogen atom or a methyl group; $Z^1$ represents a single bond, a methylene group, —C(=O)—O—$R^{z1}$—, —O—$R^{z1}$—, —O—C(=O)—$R^{z1}$—, or —$R^{z2}$—$R^{z1}$—, provided that $R^{z1}$ represents a single bond, a linear, branched, or cyclic alkylene group having 1 to 6 carbon atoms which may have an ester group or an ether group, an arylene group having 6 to 10 carbon atoms which may have an ester group or an ether group, or an alkenylene group having 2 to 10 carbon atoms which may have an ester group or an ether group, and $R^{z2}$ represents a phenylene group or a naphthylene group; and $Z^2$ represents Fe, Co, Ni, Cr, or Ru.

The (A1) component has the constitutional unit (a0) and the constitutional unit (a10), but does not have a constitutional unit represented by Formula (1).

In a case where the base material component contained in the resist composition contains a polymer compound having a constitutional unit represented by Formula (1), the content of the metal in the resist composition is increased. In this case, there is a concern that the electric characteristic or the reliability of a semiconductor element or a liquid crystal display element to be finally manufactured is impaired.

In the resist composition of the present embodiment, since the (A1) component does not have a constitutional unit represented by Formula (1), the content of the metal in the resist composition can be suppressed to be low level. In a case where the content of the metal in the resist composition is increased, the performance or the stability of a semiconductor element or a liquid crystal element is degraded in some cases due to the influence of metallic impurities. Further, the influence of metallic impurities is increased along with high integration. Therefore, the electric characteristics or the reliability of a semiconductor element or a liquid crystal display element to be manufactured as a final product is improved by suppressing the content of the metal in the resist composition to be low level. Further, high integration of a semiconductor element or a liquid crystal display element is easily achieved.

It is preferable that the (A1) component not have any constitutional unit derived from a metal complex in addition to the constitutional unit represented by Formula (1). In a case where the (A1) component does not have a constitutional unit derived from a metal complex, the content of the metal in the resist composition is further decreased and the electric characteristics or the reliability of a semiconductor element or a liquid crystal display element to be manufactured as a final product can be further improved.

<<Constitutional Unit (a11)>>

It is preferable that the (A1) component be a copolymer that further has a constitutional unit (a11) derived from a compound having an aromatic ring (excluding an aromatic ring to which a hydroxy group is bonded) in a side chain in addition to the constitutional unit (a0) and the constitutional unit (a10).

Suitable examples of the compound having an aromatic ring (excluding an aromatic ring to which a hydroxy group is bonded) in a side chain include a compound represented by Formula (a11-1).

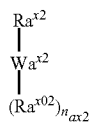

(a11-1)

In Formula (a11-1), $Ra^{x2}$ represents a polymerizable group-containing group; $Wa^{x2}$ represents an $(n_{ax2}+1)$-valent aromatic hydrocarbon group, provided that $Ra^{x2}$ and $Wa^{x2}$ may together form a fused ring structure; $Ra^{x02}$ represents a substituent that substitutes a hydrogen atom constituting $Wa^{x2}$ (an aromatic hydrocarbon group); and $n_{ax2}$ represents an integer of 0 to 3; and when $n_{ax2}$ represents 2 or greater, a plurality of $Ra^{x02}$'s may be bonded to one another to form a ring structure.

In Formula (a11-1), $Ra^{x2}$ represents a polymerizable group-containing group and has the same definition as that for $Ra^{x0}$ in Formula (a0-1).

In Formula (a11-1), $Wa^{x2}$ represents an $(n_{ax2}+1)$-valent aromatic hydrocarbon group and has the same definition as that for $Wa^{x0}$ in Formula (a0-1).

$Ra^{x2}$ and $Wa^{x2}$ may together form a fused ring structure.

In a case where $Ra^{x2}$ and $Wa^{x2}$ together form a fused ring structure, the fused ring structure has an aromatic ring derived from $Wa^{x2}$. Further, a multiple bond, between carbon atoms, in a polymerizable group derived from $Ra^{x2}$ is cleaved so that the main chain of the (A1) component is formed. In other words, part of carbon atoms constituting the fused ring form the main chain of the (A1) component.

In Formula (a11-1), $Ra^{x02}$ represents a substituent that substitutes a hydrogen atom constituting $Wa^{x2}$ (an aromatic hydrocarbon group).

Examples of the substituent as $Ra^{x02}$ include an alkyl group, an alkoxy group, an acyloxy group, and an alkylsilyl group.

As the alkyl group used as a substituent represented by $Ra^{x02}$, an alkyl group having 1 to 5 carbon atoms is preferable, and a methyl group, an ethyl group, a propyl group, an n-butyl group, or a tert-butyl group is more preferable.

As the alkoxy group used as a substituent represented by $Ra^{x02}$, an alkoxy group having 1 to 5 carbon atoms is preferable, a methoxy group, an ethoxy group, an n-propoxy group, an iso-propoxy group, an n-butoxy group, or a tert-butoxy group is more preferable, and a methoxy group or an ethoxy group is particularly preferable.

As the acyloxy group used as a substituent represented by $Ra^{x02}$, an acyloxy group having 2 to 6 carbon atoms is preferable, $CH_3C(=O)-O-$ (an acetoxy group), $C_2H_5C(=O)-O-$ is more preferable, and $CH_3C(=O)-O-$ (an acetoxy group) is particularly preferable.

As the alkylsilyl group used as a substituent represented by $Ra^{x02}$, an alkylsilyl group having 3 to 6 carbon atoms is preferable, a trimethylsilyl group, a triethylsilyl group, a dimethylethylsilyl group, a dimethyl-iso-propylsilyl group, a dimethyl-n-propylsilyl group, a dimethyl-n-butylsilyl group, or a dimethyl-tert-butylsilyl group is more preferable, and a trimethylsilyl group is still more preferable.

In Formula (a11-1), $n_{ax2}$ represents an integer of 0 to 3, preferably 0, 1, or 2, more preferably 0 or 1, and still more preferably 0.

In a case where $n_{ax2}$ represents 2 or greater, a plurality of $Ra^{x02}$'s may be bonded to one another to form a ring structure. The ring structure formed here may be a hydrocarbon ring or a heterocycle. For example, a ring structure formed of two $Ra^{x02}$'s bonded to the same aromatic ring in $Wa^{x2}$ and a side (a bond between carbon atoms) of an aromatic ring ($Wa^{x2}$) to which these two $Ra^{x02}$'s are bonded is exemplified.

Specific preferred examples of the constitutional unit (a11) include a constitutional unit represented by Formula (a11-u1).

(a11-u1)

In the formula, $R^\alpha$ represents a hydrogen atom, a methyl group, or a trifluoromethyl group; $Ya^{x2}$ represents a divalent linking group having a heteroatom or a single bond; $Wa^{x2}$ represents an $(n_{ax2}+1)$-valent aromatic hydrocarbon group; $Ra^{x02}$ represents a substituent that substitutes a hydrogen atom constituting $Wa^{x2}$ (an aromatic hydrocarbon group); $n_{ax2}$ represents an integer of 0 to 3; and when $n_{ax2}$ represents 2 or greater, a plurality of $Ra^{x02}$'s may be bonded to one another to form a ring structure.

In Formula (a11-u1), $R^\alpha$ represents a hydrogen atom, a methyl group, or a trifluoromethyl group. Among these, it is preferable that $R^\alpha$ represent a hydrogen atom or a methyl group.

In Formula (a11-u1), $Ya^{x2}$ represents a divalent linking group having a heteroatom or a single bond.

The divalent linking group having a heteroatom as $Ya^{x2}$ has the same definition as that for the divalent linking group having a heteroatom as $Ya^{x0}$. Among the examples, it is preferable that $Ya^{x2}$ represent a single bond or an ester bond [$-C(=O)-O-$ or $-O-C(=O)-$].

In Formula (a11-u1), $Wa^{x2}$ represents an $(n_{ax2}+1)$-valent aromatic hydrocarbon group. Examples of the aromatic hydrocarbon group as $Wa^{x2}$ include a group formed by removing $(n_{ax2}+1)$ hydrogen atoms from an aromatic ring. Here, the aromatic ring is not particularly limited as long as the aromatic ring is a cyclic conjugated system having $4n+2$ π electrons, and the aromatic ring may be monocyclic or polycyclic. The number of carbon atoms of the aromatic ring is preferably in a range of 5 to 30, more preferably in a range of 5 to 20, still more preferably in a range of 6 to 15, and particularly preferably in a range of 6 to 12. Specific examples of the aromatic ring include an aromatic hydrocarbon ring such as benzene, naphthalene, anthracene, or phenanthrene; and an aromatic heterocycle formed by some carbon atoms constituting the aromatic hydrocarbon ring being substituted with a heteroatom. Examples of the heteroatom in the aromatic heterocycle include an oxygen atom, a sulfur atom, and a nitrogen atom. Specific examples of the aromatic heterocycle include a pyridine ring and thiophene ring.

Examples of the aromatic hydrocarbon group as $Wa^{x2}$ also include a group formed by removing ($n_{ax2}+1$) hydrogen atoms from an aromatic compound (biphenyl, fluorene or the like) having two or more aromatic rings.

Among these, it is preferable that $Wa^{x2}$ represent a group formed by removing ($n_{ax2}+1$) hydrogen atoms from an aromatic hydrocarbon ring such as benzene, naphthalene, anthracene, or phenanthrene, more preferable that $Wa^{x2}$ represent a group formed by removing ($n_{ax2}+1$) hydrogen atoms from benzene, naphthalene, or anthracene, and still more preferable that $Wa^{x2}$ represent a group formed by removing ($n_{ax2}+1$) hydrogen atoms from benzene or naphthalene.

In Formula (a11-u1), $n_{ax2}$ represents an integer of 0 to 3, preferably 0, 1, or 2, more preferably 0 or 1, and still more preferably 0.

Suitable examples of such a constitutional unit (a11) include constitutional units respectively represented by Formulae (a11-u1-1) to (a11-u1-4).

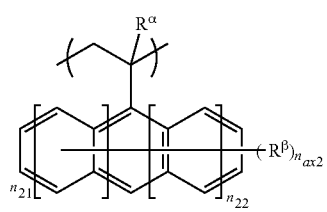
(a11-u1-1)

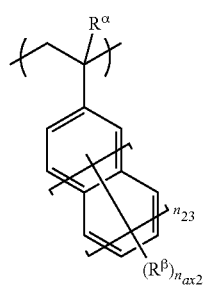
(a11-u1-2)

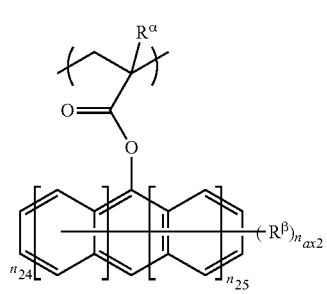
(a11-u1-3)

-continued

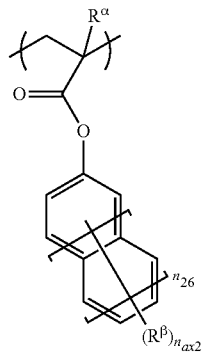
(a11-u1-4)

In the formula, $R^\alpha$ represents a hydrogen atom, a methyl group, or a trifluoromethyl group; $R^\beta$ represents an alkyl group, an alkoxy group, an acyloxy group, or an alkylsilyl group; $n_{ax2}$ represents an integer of 0 to 3; when $n_{ax2}$ represents 2 or greater, a plurality of $R^\beta$'s may be bonded to one another to form a ring structure; $n_{21}$, $n_{22}$, $n_{24}$, and $n_{25}$ each independently represents 0 or 1; and $n_{23}$ and $n_{26}$ each independently represents 1 or 2.

In Formulae (a11-u1-1) to (a11-u1-6), the alkyl group, the alkoxy group, the acyloxy group, and the alkylsilyl group as $R^\beta$ each has the same definition as that for the alkyl group, the alkoxy group, the acyloxy group, and the alkylsilyl group exemplified as a substituent as $Ra^{x02}$ in Formula (a11-1).

Specific examples of the constitutional unit (constitutional unit (a11)) derived from a compound represented by Formula (a11-1) are shown below.

In each formula shown below, $R^\alpha$ represents a hydrogen atom, a methyl group, or a trifluoromethyl group.

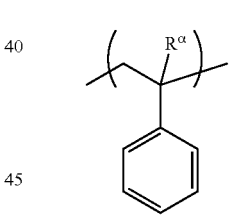
(a11-u1-11)

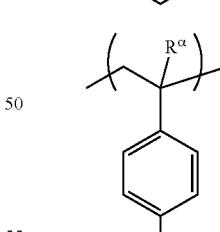
(a11-u1-12)

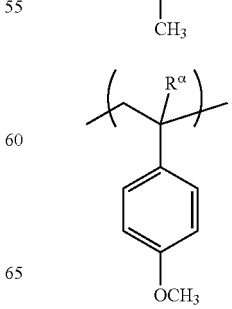
(a11-u1-13)

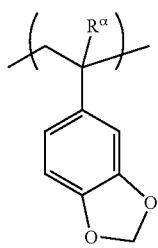 (a11-u1-14)
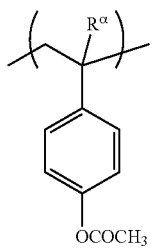 (a11-u1-15)
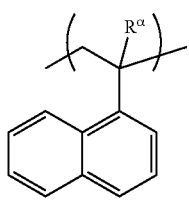 (a11-u1-16)
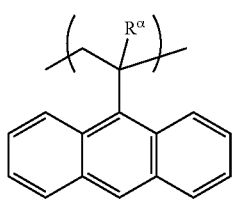 (a11-u1-17)
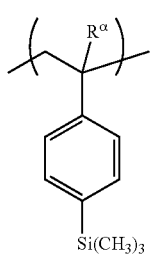 (a11-u1-18)
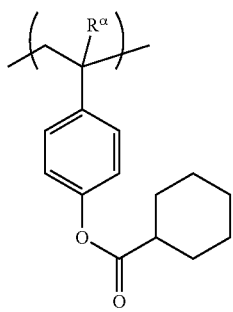 (a11-u1-19)
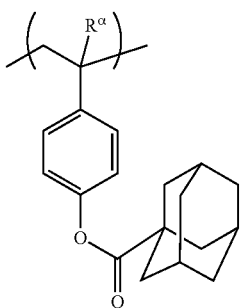 (a11-u1-20)
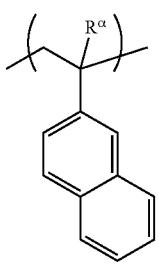 (a11-u1-21)
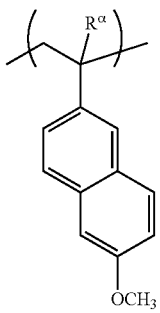 (a11-u1-22)
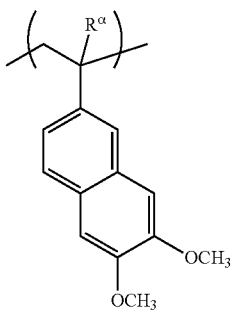 (a11-u1-23)
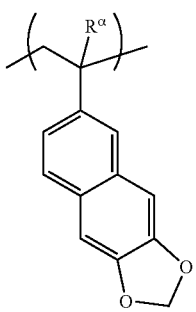 (a11-u1-24)

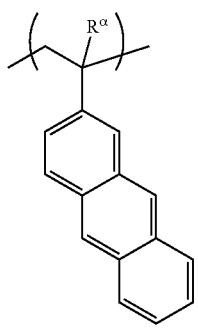
(a11-u1-25)
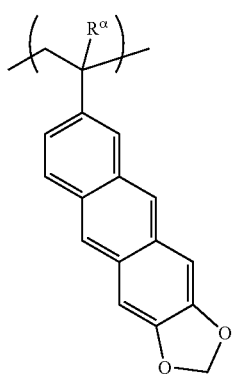
(a11-u1-27)
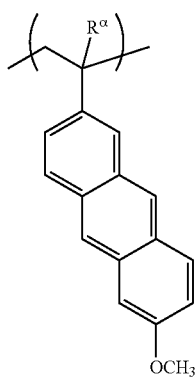
(a11-u1-28)
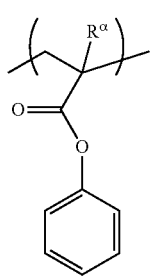
(a11-u1-31)
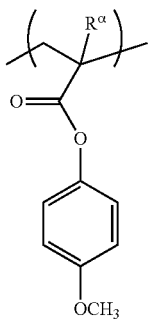
(a11-u1-32)
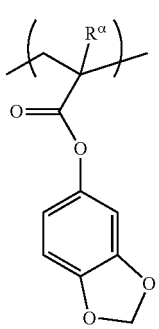
(a11-u1-33)
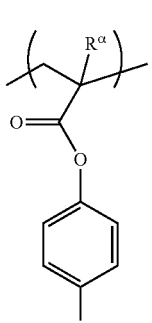
(a11-u1-34)
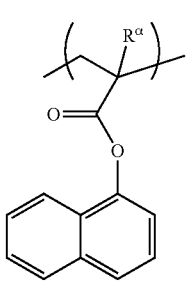
(a11-u1-35)
(a11-u1-36)

(a11-u1-37)
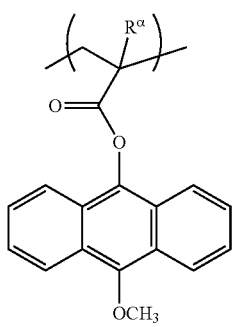
(a11-u1-38)
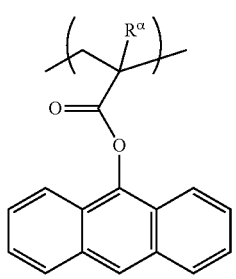
(a11-u1-41)
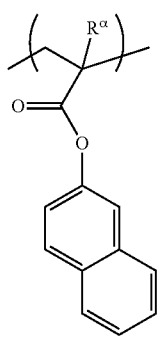
(a11-u1-42)
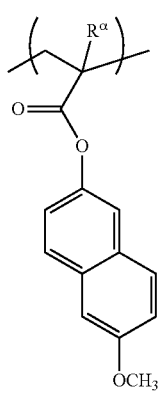
(a11-u1-43)
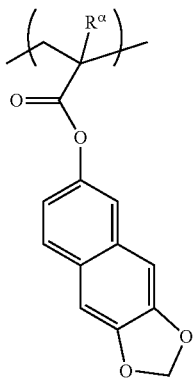
(a11-u1-44)
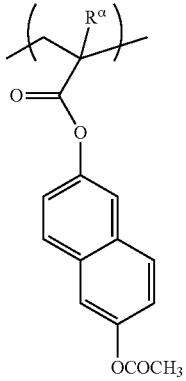
(a11-u1-45)
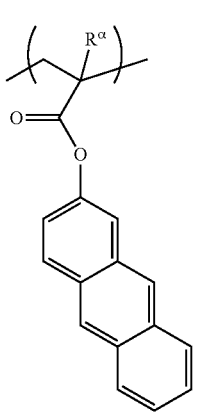
(a11-u1-46)
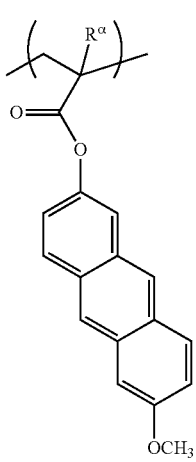

(a11-u1-47)

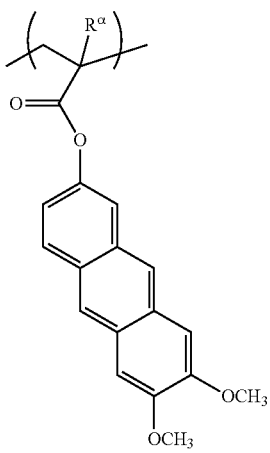

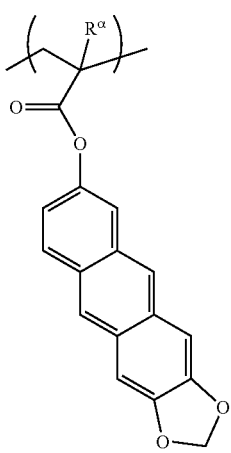

(a11-u1-48)

Suitable examples of the constitutional unit (a11) also include a constitutional unit represented by Formula (a11-u1-5) or (a11-u1-6).

(a11-u1-5)

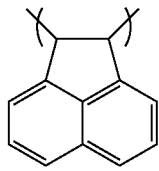

(a11-u1-6)

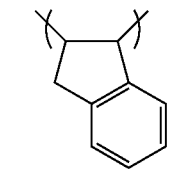

In the formulae, $R^\beta$ represents an alkyl group, an alkoxy group, an acyloxy group, or an alkylsilyl group; $n_{ax2}$ represents an integer of 0 to 3; and when $n_{ax2}$ represents 2 or greater, a plurality of $R^\beta$'s may be bonded to one another to form a ring structure.

In Formulae (a11-u1-5) and (a11-u1-6), the alkyl group, the alkoxy group, the acyloxy group, and the alkylsilyl group as $R^\beta$ each has the same definition as that for the alkyl group, the alkoxy group, the acyloxy group, and the alkylsilyl group exemplified as a substituent as $Ra^{x02}$ in Formula (a11-1).

Specific examples of the constitutional unit represented by Formula (a11-u1-5) or (a11-u1-6) are shown below.

(a11-u1-51)

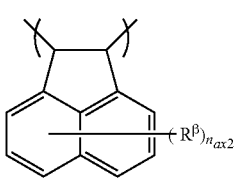

(a11-u1-61)

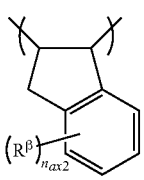

Among the examples shown above, as the constitutional unit (a11), at least one selected from the group consisting of constitutional units respectively represented by Formulae (a11-u1-1) to (a11-u1-4) is preferable and a constitutional unit represented by Formula (a11-u1-1) or (a11-u1-2) is more preferable.

Among these, as the constitutional unit (a11), a constitutional unit represented by any of Chemical Formulae (a11-u1-11), (a11-u1-13), and (a11-u1-21) is preferable.

As the constitutional unit (a11) included in the (A1) component, one kind thereof may be used, or combination of two or more kinds thereof may be used.

In a case where the (A1) component has the constitutional unit (a11), the proportion of the constitutional unit (a11) in the (A1) component is preferably in a range of 5% to 40% by mole, more preferably in a range of 10% to 35% by mole, still more preferably in a range of 10% to 30% by mole, and particularly preferably in a range of 10% to 20% by mole with respect to the total amount (100% by mole) of all constitutional units constituting the (A1) component.

In a case where the proportion of the constitutional unit (a11) is greater than or equal to the lower limit, the etching resistance, the sensitivity, the resolution, or the roughness is further improved. Particularly, in a case where the proportion thereof is less than or equal to the upper limit, the balance of the constitutional unit (a11) and other constitutional units is likely to be achieved.

<<Constitutional Unit (a12)>>

The (A1) component may further have a constitutional unit (a12) that contains a non-acid-dissociable group in a side chain in addition to the constitutional unit (a0) and the constitutional unit (a10) or in addition to the constitutional unit (a0), the constitutional unit (a10), and the constitutional unit (a11) described above.

Suitable examples of the constitutional unit (a12) include a constitutional unit represented by Formula (a12-1).

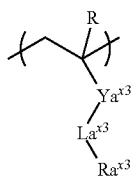

(a12-1)

In Formula (a12-1), R represents a hydrogen atom, an alkyl group having 1 to 5 carbon atoms, or a halogenated alkyl group having 1 to 5 carbon atoms; $Y_a^{x3}$ represents a single bond or a divalent linking group; $L_a^{x3}$ represents —O—, —COO—, —CON(R')—, —OCO—, —CONHCO—, or —CONHCS—; R' represents a hydrogen atom or a methyl group, provided that $Y_a^{x3}$ does not represent —CO— when $L_a^{x3}$ represents —O—; and $R_a^{x3}$ represents a hydrogen atom, an aliphatic hydrocarbon group, a lactone-containing cyclic group, a —$SO_2$-containing cyclic group, or a carbonate-containing cyclic group, provided that $R_a^{x3}$ represents a non-acid-dissociable group.

In Formula (a12-1), R represents a hydrogen atom, an alkyl group having 1 to 5 carbon atoms or a halogenated alkyl group having 1 to 5 carbon atoms.

As the alkyl group having 1 to 5 carbon atoms as R, a linear or branched alkyl group having 1 to 5 carbon atoms is preferable, and specific examples thereof include a methyl group, an ethyl group, an n-propyl group, an isopropyl group, an n-butyl group, an isobutyl group, a tert-butyl group, a pentyl group, an isopentyl group, and a neopentyl group.

The halogenated alkyl group having 1 to 5 carbon atoms as R is a group formed by part or all of hydrogen atoms in the alkyl group having 1 to 5 carbon atoms being substituted with a halogen atom. Examples of the halogen atom include a fluorine atom, a chlorine atom, a bromine atom, and an iodine atom. Among these, a fluorine atom is particularly preferable.

R represents preferably a hydrogen atom, an alkyl group having 1 to 5 carbon atoms, or a fluorinated alkyl group having 1 to 5 carbon atoms, more preferably a hydrogen atom or an alkyl group having 1 to 5 carbon atoms, still more preferably a hydrogen atom or an alkyl group having 1 to 5 carbon atoms, and particularly preferably a hydrogen atom or a methyl group in terms of industrial availability.

In Formula (a12-1), $Y_a^{x3}$ represents a single bond or a divalent linking group.

Examples of the divalent linking group as $Y_a^{x3}$ as the same as those for the divalent linking group as $Y_a^{x0}$ in Formula (a0-1). Among the examples, it is preferable that $Y_a^{x3}$ represent a single bond, an ester bond [—C(=O)—O— or —O—C(=O)—], an ether bond (—O—), a linear or branched alkylene group, or a combination of these.

In Formula (a12-1), $L_a^{x3}$ represents —O—, —COO—, —CON(R')—, —OCO—, —CONHCO—, or —CONHCS—. In the formula shown above, R' represents a hydrogen atom or a methyl group. In a case where $L_a^{x3}$ represents —O—, $Y_a^{x3}$ does not represent —CO—.

In Formula (a12-1), $R_a^{x3}$ represents a hydrogen atom, an aliphatic hydrocarbon group, a lactone-containing cyclic group, a —$SO_2$-containing cyclic group, or a carbonate-containing cyclic group, provided that $R_a^{x3}$ represents a non-acid-dissociable group. The "non-acid-dissociable group" indicates a group that remains in the constitutional unit without being dissociated even when an acid acts in a case where an acid is generated in the resist composition when exposed (for example, in a case where an acid is generated from the (B) component or the constitutional unit that generates an acid when exposed).

Aliphatic Hydrocarbon Group:

In a case where $R_a^{x3}$ represents an aliphatic hydrocarbon group, it is preferable that the aliphatic hydrocarbon group be a linear or cyclic aliphatic hydrocarbon group.

In a case where the aliphatic hydrocarbon group as $R_a^{x3}$ is a linear aliphatic hydrocarbon group, as the linear aliphatic hydrocarbon group, a linear alkyl group having 1 to 5 carbon atoms is preferable, a linear alkyl group having 1 to 4 carbon atoms is more preferable, and a methyl group is still more preferable.

In a case where the non-acid-dissociable aliphatic hydrocarbon group as $R_a^{x3}$ is a cyclic aliphatic hydrocarbon group, the cyclic aliphatic hydrocarbon group may be a monocyclic or polycyclic group. As the cyclic group, a plurality of cyclic groups known to be used for resin components of a resist composition in the related art can be used.

In a case where the cyclic group is a monocyclic aliphatic hydrocarbon group, as the monocyclic group, a cycloalkyl group having 3 to 10 carbon atoms is preferable, a cycloalkyl group having 3 to 6 carbon atoms is more preferable, and a cyclohexyl group is still more preferable. The monocyclic group may have a linear or branched alkyl group having 1 to 5 carbon atoms as a substituent, but it is preferable that the monocyclic group not have a substituent. Among these, a cyclohexyl group not having a substituent is preferable.

In a case where the cyclic group is a polycyclic aliphatic hydrocarbon group, as the polycyclic group, an aliphatic polycyclic group having 4 to 20 carbon atoms is preferable, an aliphatic polycyclic group having 6 to 15 carbon atoms is more preferable, and an aliphatic polycyclic group having 7 to 12 carbon atoms is still more preferable. Particularly, a polycyclic aliphatic hydrocarbon group selected from a tricyclodecyl group, an adamantyl group, a teteracyclodo-decyl group, an isobornyl group, and a norbornyl group is preferable in terms of industrial availability. The polycyclic group may have a linear or branched alkyl group having 1 to 5 carbon atoms a substituent, but it is preferable that the polycyclic groups not have a substituent. Among these, an adamantyl group not having a substituent is preferable.

Among the examples, as the aliphatic hydrocarbon group as $R_a^{x3}$, a linear aliphatic hydrocarbon group is preferable, a linear alkyl group having 1 to 5 carbon atoms is more preferable, a linear alkyl group having 1 to 4 carbon atoms is still more preferable, and a methyl group is particularly preferable.

Specific examples of the constitutional unit (a12) in a case where $R_a^{x3}$ in Formula (a12-1) represents an aliphatic hydrocarbon group include constitutional units respectively represented by Formulae (a4-1) to (a4-9).

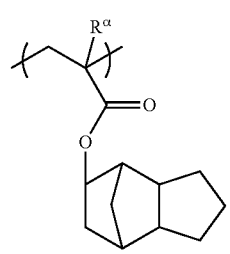

(a4-1)

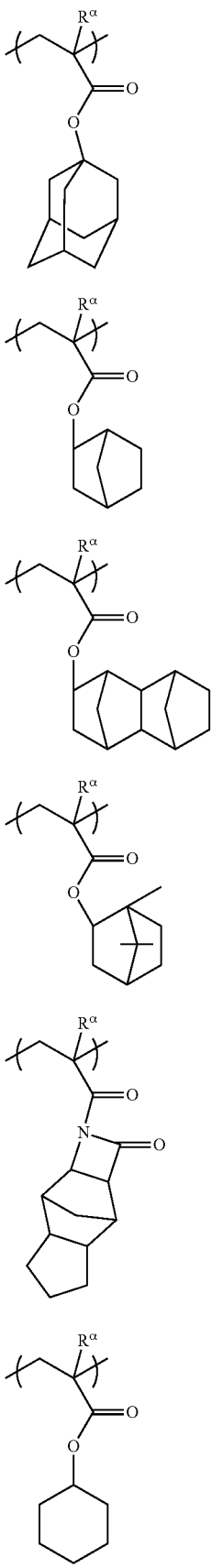

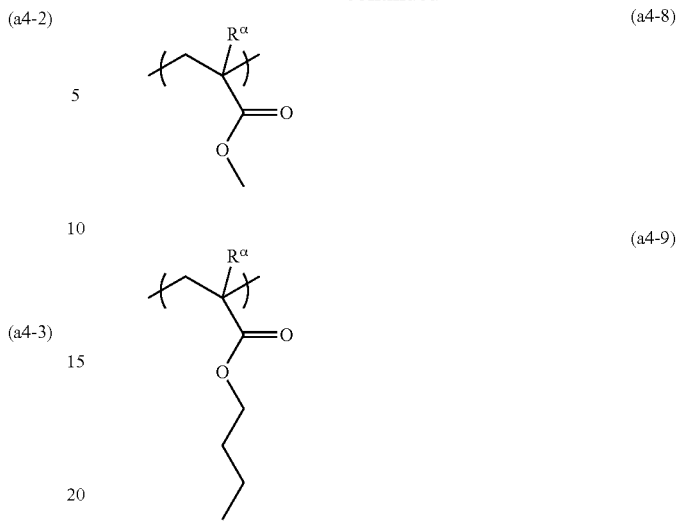

In the formulae, R represents a hydrogen atom, an alkyl group having 1 to 5 carbon atoms, or a halogenated alkyl group having 1 to 5 carbon atoms.

In a case where $Ra^{x3}$ in Formula (a12-1) represents an aliphatic hydrocarbon group, examples of the constitutional unit (a12) include a constitutional unit derived from (meth)acrylic acid alkyl esters such as ethyl (meth)acrylate and propyl (meth)acrylate.

Among the examples, as the constitutional unit (a12) in the case where $Ra^{x3}$ represents an aliphatic hydrocarbon group, a constitutional unit represented by Formula (a4-2), (a4-7), (a4-8), or (a4-9) is preferable, a constitutional unit represented by Formula (a4-2) or (a4-8) is more preferable, and a constitutional unit represented by Formula (a4-8) is still more preferable.

In the case where $Ra^{x3}$ in Formula (a12-1) represents an aliphatic hydrocarbon group, dry etching resistance of a resist pattern to be formed is improved when the (A1) component having the constitutional unit (a12). Further, the hydrophobicity of the (A1) component is increased. The improvement of the hydrophobicity contributes to improvement of the resolution, the resist pattern shape, or the like particularly in the case of the solvent development process.

Lactone-Containing Cyclic Group:

The "lactone-containing cyclic group" indicates a cyclic group containing a ring (lactone ring) that has —O—C(=O)— in the ring skeleton. The lactone ring is counted as the first ring, and a group with only the lactone ring is referred to as a monocyclic group and a group with other ring structures is referred to as a polycyclic group regardless of the structures. The lactone-containing cyclic group may be a monocyclic group or a polycyclic group.

In a case where $Ra^{x3}$ in Formula (a12-1) represents a lactone-containing cyclic group, the lactone-containing cyclic group is not particularly limited, and any group having lactone ring can be used as the lactone-containing cyclic group. Specific examples thereof include groups respectively represented by Formulae (a2-r-1) to (a2-r-7). In the following formulae, the symbol "*" represents a bonding site (hereinafter, the same applies to the present specification).

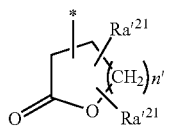 (a2-r-1)

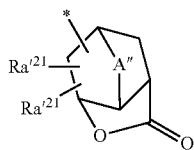 (a2-r-2)

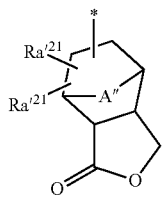 (a2-r-3)

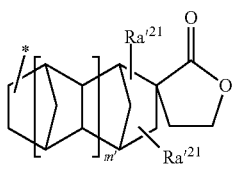 (a2-r-4)

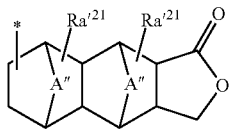 (a2-r-5)

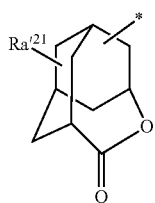 (a2-r-6)

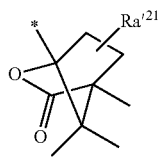 (a2-r-7)

In the formulae, $Ra'^{21}$'s each independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$-containing cyclic group; A" represents an alkylene group having 1 to 5 carbon atoms which may have an oxygen atom (—O—) or a sulfur atom (—S—), an oxygen atom, or a sulfur atom; n' represents an integer of 0 to 2; and m' represents 0 or 1.

In Formulae (a2-r-1) to (a2-r-7), as the alkyl group represented by $Ra'^{21}$, an alkyl group having 1 to 6 carbon atoms is preferable. It is preferable that the alkyl group be linear or branched. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or an ethyl group is preferable, and a methyl group is particularly preferable.

As the alkoxy group represented by $Ra'^{21}$, an alkoxy group having 1 to 6 carbon atoms is preferable.

It is preferable that the alkoxy group be linear or branched. Specific examples thereof include a group formed by an oxygen atom (—O—) being linked to an alkyl group exemplified as the alkyl group as $Ra'^{21}$.

Examples of the halogen atom as $Ra'^{21}$ include a fluorine atom, a chlorine atom, a bromine atom, and an iodine atom. Among these, a fluorine atom is preferable.

Examples of the halogenated alkyl group as $Ra'^{21}$ include a group formed by part or all of hydrogen atoms in the alkyl group as $Ra'^{21}$ being substituted with a halogen atom. As the halogenated alkyl group, a fluorinated alkyl group is preferable and a perfluoroalkyl group is particularly preferable.

In —COOR" and —OC(=O)R" as $Ra'^{21}$, R" represents a hydrogen atom, an alkyl group, a lactone-containing cyclic group, a carbonate-containing cyclic group, or a —SO$_2$-containing cyclic group.

The alkyl group as R" may be linear, branched, or cyclic, and the number of carbon atoms is preferably in a range of 1 to 15.

In a case where R" represents a linear or branched alkyl group, the number of carbon atoms is preferably in a range of 1 to 10 and more preferably in a range of 1 to 5. A methyl group or an ethyl group is particularly preferable as the linear or branched alkyl group.

In a case where R" represents a cyclic alkyl group, the number of carbon atoms is preferably in a range of 3 to 15, more preferably in a range of 4 to 12, and most preferably in a range of 5 to 10. Specific examples thereof include a group formed by removing one or more hydrogen atoms from a monocycloalkane which may or may not substituted with a fluorine atom or a fluorinated alkyl group; and a group formed by removing one or more hydrogen atoms from a polycycloalkane such as a bicycloalkane, a tricycloalkane, or a tetracycloalkane. More specific examples thereof include a group formed by removing one or more hydrogen atoms from a monocycloalkane such as cyclopentane or cyclohexane; and a group formed by removing one or more hydrogen atoms from a polycycloalkane such as adamantane, norbornane, isobornane, tricyclodecane, and tetracyclododecane.

Examples of the lactone-containing cyclic group as R" are the same as those for the groups respectively represented by Formulae (a2-r-1) to (a2-r-7).

The carbonate-containing cyclic group as R" has the same definition as that for the carbonate-containing cyclic group described below. Specific examples thereof include groups respectively represented by Formulae (ax3-r-1) to (ax3-r-3) which will be described below.

The —SO$_2$-containing cyclic group as R" has the same definition as that for the —SO$_2$-containing cyclic group described below. Specific examples thereof include groups respectively represented by Formulae (a5-r-1) to (a5-r-4) which will be described below.

The number of carbon atoms of the hydroxyalkyl group represented by $Ra'^{21}$ is preferably in a range of 1 to 6, and specific examples thereof include a group formed by at least one of the hydrogen atoms in the alkyl group as $Ra'^{21}$ being substituted with a hydroxyl group.

Among the examples, $Ra'^{21}$ represents preferably a hydrogen atom or an alkyl group having 1 to 6 carbon atoms and more preferably a hydrogen atom.

In Formulae (a2-r-2), (a2-r-3), and (a2-r-5), as the alkylene group having 1 to 5 carbon atoms represented by A", a linear or branched alkylene group is preferable and examples thereof include a methylene group, an ethylene group, an n-propylene group, and an isopropylene group. In a case where the alkylene group has an oxygen atom or a sulfur atom, specific examples thereof include a group formed by —O— or —S— being interposed at the terminal thereof or between carbon atoms, such as —O—CH$_2$—, —CH$_2$—O—CH$_2$—, —S—CH$_2$—, or —CH$_2$—S—CH$_2$—. As A", an alkylene group having 1 to 5 carbon atoms or —O— is preferable; an alkylene group having 1 to 5 carbon atoms is more preferable; and a methylene group is most preferable.

Specific examples of the groups respectively represented by Formulae (a2-r-1) to (a2-r-7) are shown below.

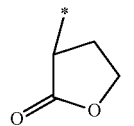
(r-lc-1-1)

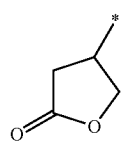
(r-lc-1-2)

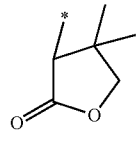
(r-lc-1-3)

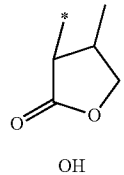
(r-lc-1-4)

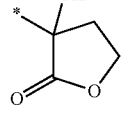
(r-lc-1-5)

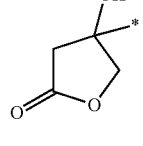
(r-lc-1-6)

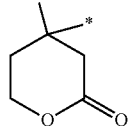
(r-lc-1-7)

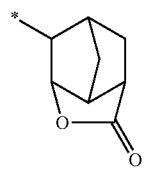
(r-lc-2-1)

-continued

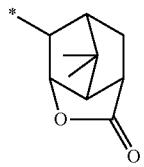
(r-lc-2-2)

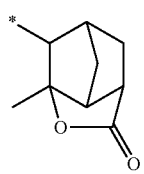
(r-lc-2-3)

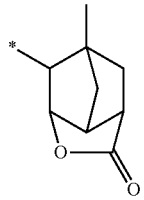
(r-lc-2-4)

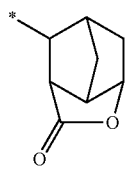
(r-lc-2-5)

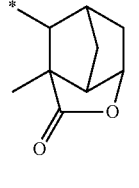
(r-lc-2-6)

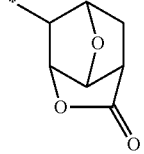
(r-lc-2-7)

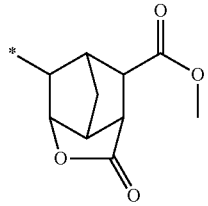
(r-lc-2-8)

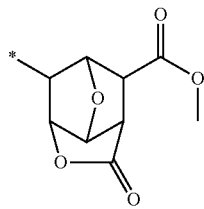
(r-lc-2-9)

-continued
(r-lc-2-10)
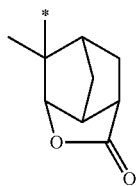
(r-lc-2-11)
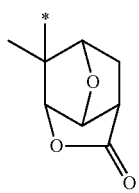
(r-lc-2-12)
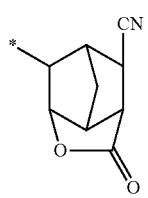
(r-lc-2-13)
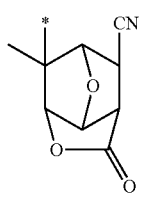
(r-lc-2-14)
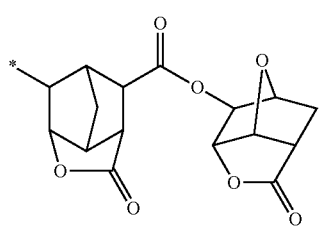
(r-lc-2-15)
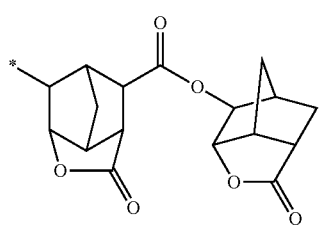
(r-lc-2-16)
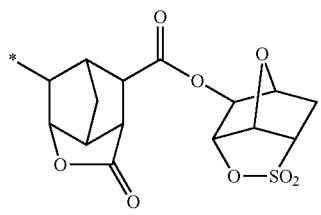
-continued
(r-lc-2-17)
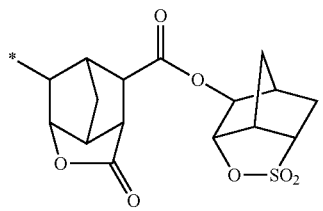
(r-lc-2-18)
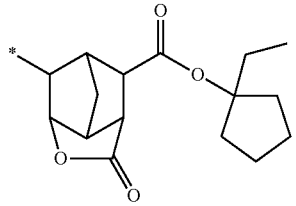
(r-lc-3-1)
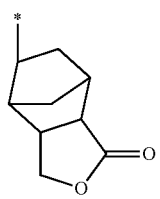
(r-lc-3-2)
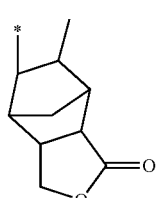
(r-lc-3-3)
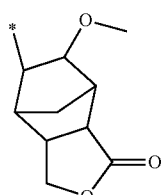
(r-lc-3-4)
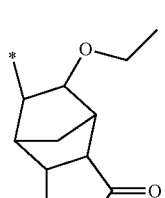
(r-lc-3-5)
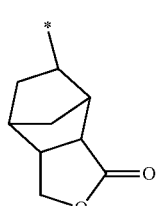
(r-lc-4-1)

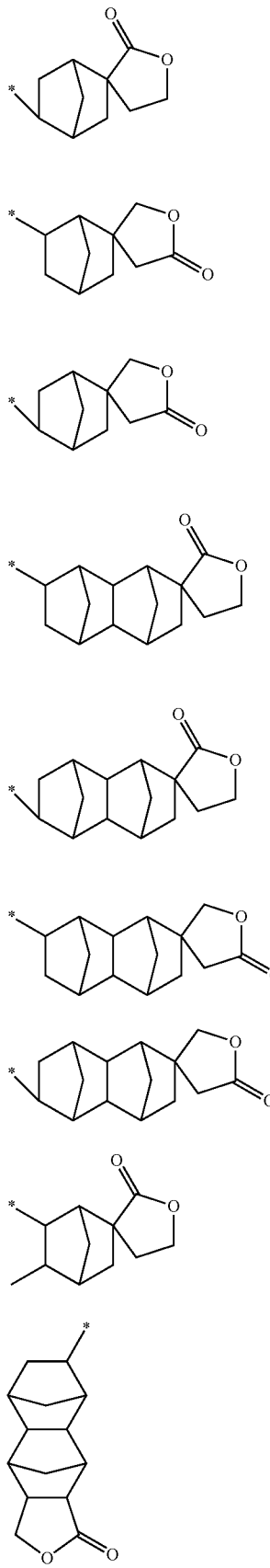

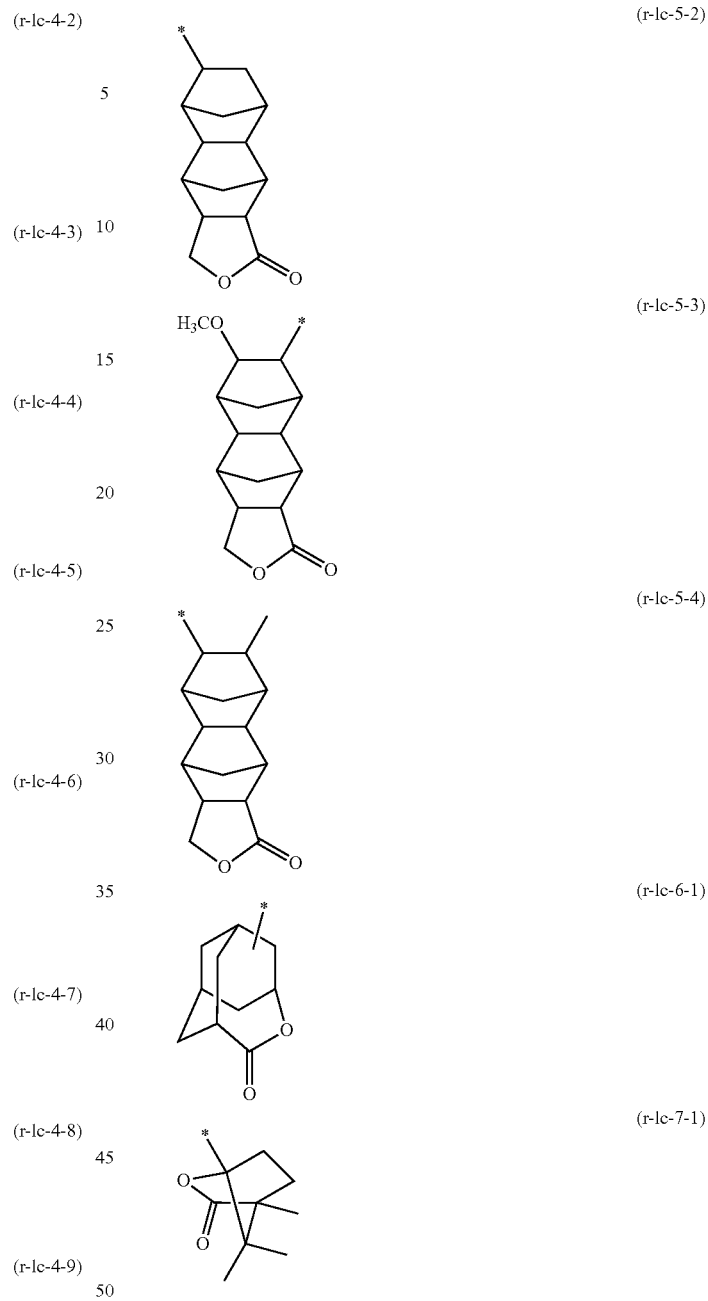

—SO$_2$-Containing Cyclic Group:

The "—SO$_2$-containing cyclic group" indicates a cyclic group containing a ring that has —SO$_2$— in the ring skeleton and specifically indicates a cyclic group in which a sulfur atom (S) in —SO$_2$— forms a part of the ring skeleton of the cyclic group. The ring having —SO$_2$— in the ring skeleton is counted as the first ring, and a group with only the ring is referred to as a monocyclic group and a group with other ring structures is referred to as a polycyclic group regardless of the structures. The —SO$_2$-containing cyclic group may be a monocyclic group or a polycyclic group.

In a case where Ra$^{x3}$ in Formula (a12-1) represents a —SO$_2$-containing cyclic group, the —SO$_2$-containing cyclic group is not particularly limited, and any group having —SO$_2$— in the ring skeleton can be used as the —SO$_2$-containing cyclic group. It is particularly preferable that the —SO₂-containing cyclic group be a cyclic group having —O—SO₂— in the ring skeleton thereof, in other words, a cyclic group in which —O—S— in —O—SO₂— contains a sultone ring forming a part of the ring skeleton.

More specific examples of the —SO₂-containing cyclic group include groups respectively represented by Formulae (a5-r-1) to (a5-r-4).

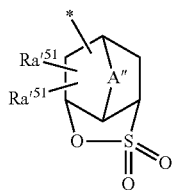
(a5-r-1)

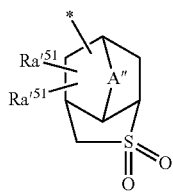
(a5-r-2)

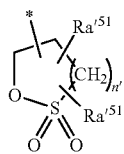
(a5-r-3)

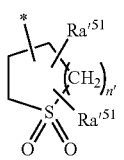
(a5-r-4)

In the formulae, $Ra'^{51}$'s each independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO₂-containing cyclic group; A" represents an alkylene group having 1 to 5 carbon atoms which may have an oxygen atom or a sulfur atom, an oxygen atom, or a sulfur atom; and n' represents an integer of 0 to 2.

In Formulae (a5-r-1) and (a5-r-2), A" has the same definition as that for A" in Formulae (a2-r-2), (a2-r-3), and (a2-r-5).

Examples of the alkyl group, the alkoxy group, the halogen atom, the halogenated alkyl group, —COOR", —OC(=O)R", and the hydroxyalkyl group as $Ra'^{51}$ are respectively the same as those for $Ra'^{21}$ in Formulae (a2-r-1) to (a2-r-7).

Specific examples of the groups respectively represented by Formulae (a5-r-1) to (a5-r-4) are shown below. In the formulae, "Ac" represents an acetyl group.

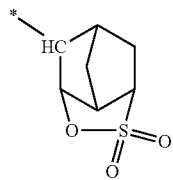
(r-s1-1-1)

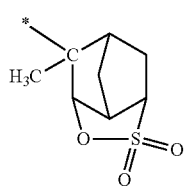
(r-s1-1-2)

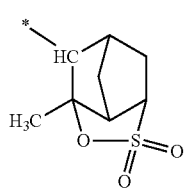
(r-s1-1-3)

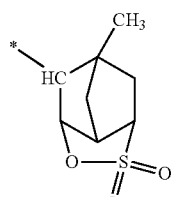
(r-s1-1-4)

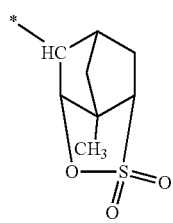
(r-s1-1-5)

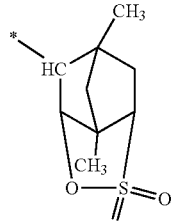
(r-s1-1-6)

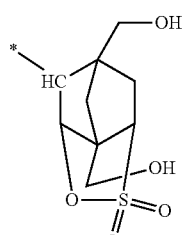
(r-s1-1-7)

(r-s1-1-8) 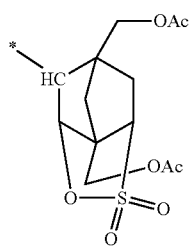
(r-s1-1-9) 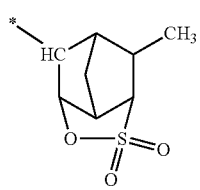
(r-s1-1-10) 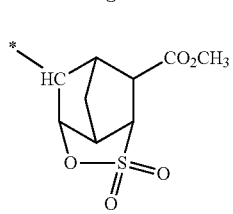
(r-s1-1-11) 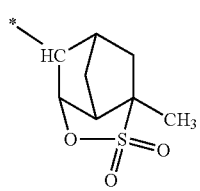
(r-s1-1-12) 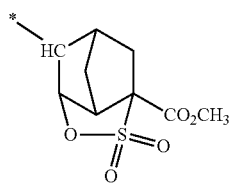
(r-s1-1-13) 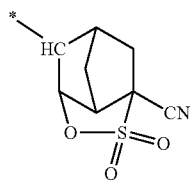
(r-s1-1-14) 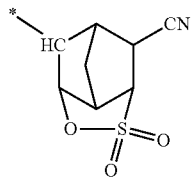
(r-s1-1-15) 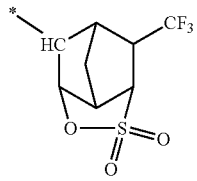
(r-s1-1-16) 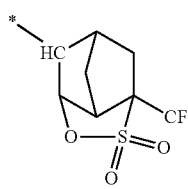
(r-s1-1-17) 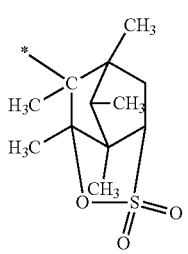
(r-s1-1-18) 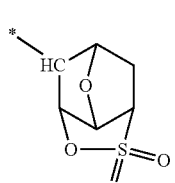
(r-s1-1-19) 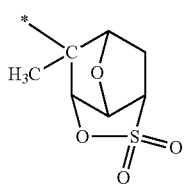
(r-s1-1-20) 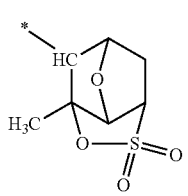
(r-s1-1-21) 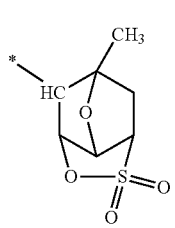
(r-s1-1-22) 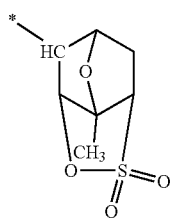

(r-s1-1-23) 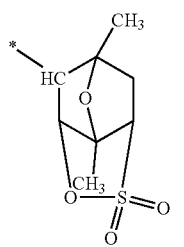

(r-s1-1-24) 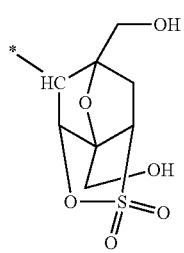

(r-s1-1-25) 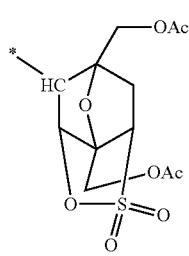

(r-s1-1-26) 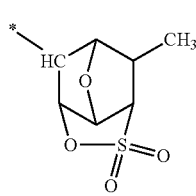

(r-s1-1-27) 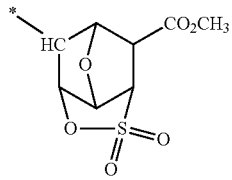

(r-s1-1-28) 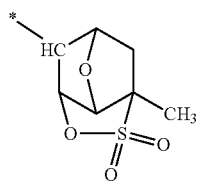

(r-s1-1-29) 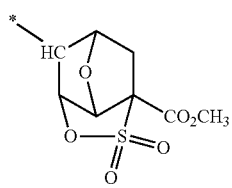

(r-s1-1-30) 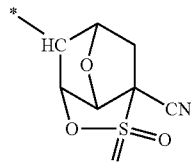

(r-s1-1-31) 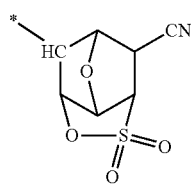

(r-s1-1-32) 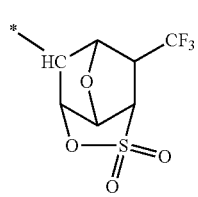

(r-s1-1-33) 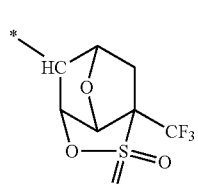

(r-s1-2-1) 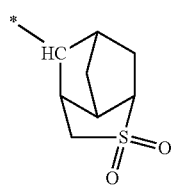

(r-s1-2-2) 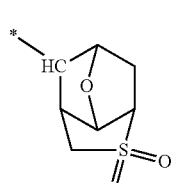

(r-s1-3-1)

(r-s1-4-1) 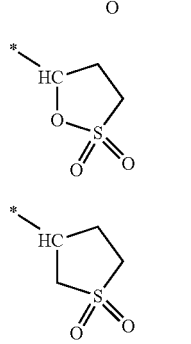

Carbonate-Containing Cyclic Group:

The "carbonate-containing cyclic group" indicates a cyclic group containing a ring (carbonate ring) that has —O—C(=O)—O— in the ring skeleton. The carbonate ring is counted as the first ring, and a group with only the carbonate ring is referred to as a monocyclic group and a group with other ring structures is referred to as a polycyclic group regardless of the structures. The carbonate-containing cyclic group may be a monocyclic group or a polycyclic group.

In a case where $Ra^{x3}$ in Formula (a12-1) represents a carbonate-containing cyclic group, the carbonate-containing cyclic group is not particularly limited, and any group having —O—C(=O)—O— in the ring skeleton can be used as the carbonate-containing cyclic group. Specific examples thereof include groups respectively represented by Formulae (ax3-r-1) to (ax3-r-3).

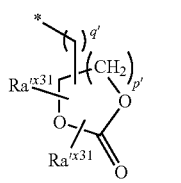
(ax3-r-1)

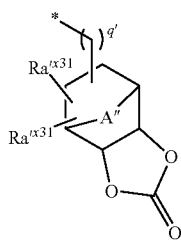
(ax3-r-2)

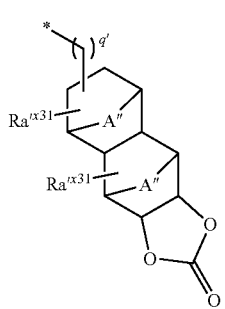
(ax3-r-3)

In the formulae, $Ra'^{x31}$'s each independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$-containing cyclic group; A" represents an alkylene group having 1 to 5 carbon atoms which may have an oxygen atom or a sulfur atom, an oxygen atom, or a sulfur atom; p' represents an integer of 0 to 3; and q' represents 0 or 1.

In Formulae (ax3-r-2) to (ax3-r-3), A" has the same definition as that for A" in Formulae (a2-r-2), (a2-r-3), and (a2-r-5).

Examples of the alkyl group, the alkoxy group, the halogen atom, the halogenated alkyl group, —COOR", —OC(=O)R", and the hydroxyalkyl group as $Ra'^{31}$ are respectively the same as those for $Ra'^{21}$ in Formulae (a2-r-1) to (a2-r-7).

Specific examples of the groups respectively represented by Formulae (ax3-r-1) to (ax3-r-3) are shown below.

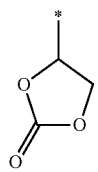
(r-cr-1-1)

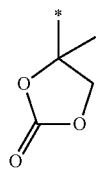
(r-cr-1-2)

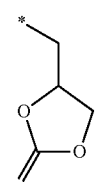
(r-cr-1-3)

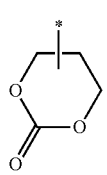
(r-cr-1-4)

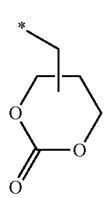
(r-cr-1-5)

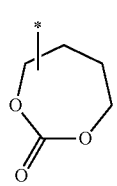
(r-cr-1-6)

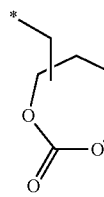
(r-cr-1-7)

(r-cr-2-1)

(r-cr-2-2)
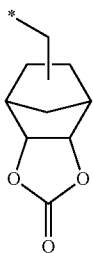

(r-cr-2-3)
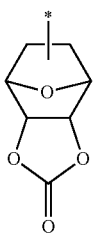

(r-cr-2-4)
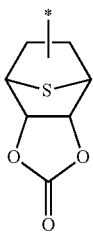

(r-cr-3-1)
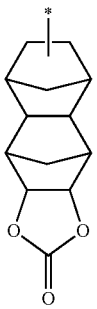

(r-cr-3-2)
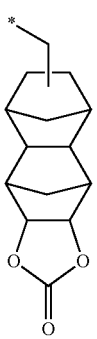

(r-cr-3-3)
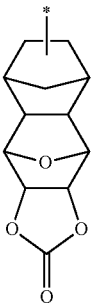

(r-cr-3-4)
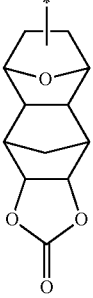

(r-cr-3-5)
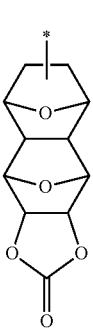

Suitable examples of the lactone-containing cyclic group, the —SO$_2$-containing cyclic group, and the carbonate-containing cyclic group as Ra$^{x3}$ in Formula (a12-1) respectively include groups respectively represented by Formulae (a2-r-1) to (a2-r-7), groups respectively represented by Formulae (a5-r-1) to (a5-r-4), and groups respectively represented by Formulae (ax3-r-1) to (ax3-r-3).

Among the examples, Ra$^{x3}$ represents preferably a lactone-containing cyclic group or a —SO$_2$-containing cyclic group and more preferably a group represented by Formula (a2-r-1), (a2-r-2), (a2-r-6), or (a5-r-1). Specifically, a group represented by any of Chemical Formulae (r-1c-1-1) to (r-1c-1-7), (r-1c-2-1) to (r-1c-2-18), (r-1c-6-1), (r-s1-1-1), and (r-s1-1-18) is more preferable. It is still more preferable that Ra$^{x3}$ represent a lactone-containing cyclic group, and suitable examples thereof include groups represented by Chemical Formulae (r-1c-1-1) and (r-1c-1-2).

In a case where Ra$^{x3}$ in Formula (a12-1) represents a lactone-containing cyclic group, a —SO$_2$-containing cyclic group, or a carbonate-containing cyclic group, the hydrophilicity of the (A1) component is increased and thereby the adhesiveness of the resist film to the substrate is improved when the (A1) component has the constitutional unit (a12).

In a case where the (A1) has the constitutional unit (a12), as the constitutional unit (a12), one kind of the constitutional unit (a12) may be used, or combination of two or more kinds thereof may be used.

In a case where the (A1) component has the constitutional unit (a12), the proportion of the constitutional unit (a12) is preferably in a range of 1% to 50% by mole, more preferably in a range of 3% to 40% by mole, still more preferably in a range of 5% to 30% by mole, and particularly preferably in a range of 10% to 20% by mole with respect to the total amount (100% by mole) of all constitutional units constituting the (A1) component.

In a case where the proportion of the constitutional unit (a12) is greater than or equal to the above-described preferable lower limit, the effects obtained by containing the constitutional unit (a12) are sufficiently obtained. Further, in a case where the proportion of the constitutional unit (a12) is less than or equal to the above-described preferable upper limit, the balance between the constitutional unit and another constitutional unit is likely to be achieved so that various lithography characteristics and the pattern shape become excellent.

<<Other Constitutional Units>>

The (A1) component may further have a constitutional unit other than the constitutional unit (a0), the constitutional unit (a10), the constitutional unit (a11), and the constitutional unit (a12).

Examples of the compounds from which other constitutional units are derived include monocarboxylic acids such as acrylic acid, methacrylic acid, and crotonic acid; dicarboxylic acids such as maleic acid, fumaric acid, and itaconic acid; methacrylic acid derivatives containing an ester bond and a carboxy group such as 2-methacryloyloxyethyl succinic acid, 2-methacryloyloxy ethyl maleic acid, 2-methacryloyloxyethyl phthalic acid, and 2-methacryloyloxyethyl hexahydrophthalic acid; (meth)acrylic acid hydroxy alkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and epoxy group-containing polymerizable compounds.

In the resist composition of the present embodiment, the (A) component contains the polymer compound (A1) (the (A1) component) that has the constitutional unit (a0) and the constitutional unit (a10) and does not have a constitutional unit represented by Formula (1).

Preferred examples of the (A1) component include a polymer compound that has at least the constitutional unit (a0), the constitutional unit (a10), and the constitutional unit (a11) and does not have a constitutional unit represented by Formula (1). Further, examples of the (A1) component include a polymer compound that has at least the constitutional unit (a0), the constitutional unit (a10), and the constitutional unit (a12) and does not have a constitutional unit represented by Formula (1).

Specific examples thereof include a polymer compound having a repeated structure of the constitutional unit (a0) and the constitutional unit (a10), a polymer compound having a repeated structure of the constitutional unit (a0), the constitutional unit (a10), and the constitutional unit (a11), and a polymer compound having a repeated structure of the constitutional unit (a0), the constitutional unit (a10), and the constitutional unit (a12).

The weight-average molecular weight (Mw) (in terms of polystyrene according to gel permeation chromatography (GPC)) of the (A1) component is not particularly limited, but is preferably in a range of 500 to 50000, more preferably in a range of 1000 to 30000, and particularly preferably in a range of 2000 to 20000.

In a case where the Mw of the (A1) component is less than or equal to the preferable upper limit of the above-described range, the solubility of the resist composition in a resist solvent is sufficient to be used as a resist. Further, in a case where the Mw thereof is greater than or equal to the preferable lower limit of the above-described range, the dry etching resistance or the cross-sectional shape of the resist pattern becomes excellent.

The dispersity (Mw/Mn) of the (A1) component is not particularly limited, but is preferably in a range of 1.0 to 4.0, more preferably in a range of 1.0 to 3.0, and particularly preferably in a range of 1.5 to 2.5. Mn indicates the number average molecular weight.

In the resist composition of the present embodiment, one kind of the (A1) component may be used, or combination of two or more kinds thereof may be used.

In the resist composition of the present embodiment, a base material component which does not correspond to the (A1) component and whose solubility in a developer is changed due to an action of an acid may be used as the (A) component in combination of the (A1) component.

The proportion of the (A1) component in the (A) component is preferably 25% by mass or greater, more preferably 50% by mass or greater, still more preferably 75% by mass or greater, and may be 100% by mass with respect to the total mass of the (A) component. In a case where the proportion of the (A1) component is 25% by mass or greater, a resist pattern having various excellent lithography characteristics such as high sensitivity or resolution and improved roughness is likely to be formed.

The (A1) component can be produced by dissolving monomers from which each constitutional unit is derived in a polymerization solvent, adding a radical polymerization initiator such as azobisisobutyronitrile (AIBN) or dimethyl 2,2'-azobisisobutyrate (for example, V-601), and polymerizing the monomers. Alternatively, the (A1) component can be produced by dissolving monomers, from which each constitutional unit is derived and in which functional groups are protected, in a polymerization solvent, adding the above-described radical polymerization initiator, polymerizing the monomers, and carrying out a deprotection reaction. Further, a —$C(CF_3)_2$—OH group may be introduced to the terminal by using a chain transfer agent such as HS—$CH_2$—$CH_2$—$CH_2$—$C(CF_3)_2$—OH during the polymerization. In this manner, a copolymer into which a hydroxyalkyl group obtained by substituting part of hydrogen atoms of an alkyl group with fluorine atoms has been introduced is effective for reducing development defects or line edge roughness (LER: irregularities on a line side wall).

In the resist composition of the present embodiment, as (A) component, one kind thereof may be used, or combination of two or more kind thereof may be used.

The content of the (A) component in the resist composition of the present embodiment may be adjusted according to the film thickness or the like of a resist to be formed.

<Other Components>

The resist composition of the present embodiment may further contain other components in addition to the (A) component. Examples of other components include (B) to (F) components and an (S) component.

<<(B) Component>>

The resist composition of the present embodiment may further contain an acid generator component (hereinafter, referred to as a (B) component) in addition to the (A) component.

The (B) component is not particularly limited, and those which have been suggested as an acid generator for a chemically amplified resist can be used.

Examples of such an acid generator include various acid generators, for example, onium salt-based acid generators such as an iodonium salt and a sulfonium salt, oxime sulfonate-based acid generators; diazomethane-based acid generators such as bisalkyl and bisaryl sulfonium diazomethanes and poly(bissulfonyl)diazomethanes; nitrobenzyl sulfonate-based acid generators, iminosulfonate-based acid generators, and disulfone-based acid generators. Among these, an onium salt-based acid generator is preferably used.

As the onium salt-based acid generator, for example, a compound represented by Formula (b-O) can be used.

$$R^{100}-SO_3^-(M^{m+})_{1/m} \quad (b\text{-}0)$$

In the formula, $R^{100}$ represents a halogenated alkyl group which may have a substituent, a cyclic group which may have a substituent, or an alkenyl group which may have a substituent; m represents an integer of 1 or greater, and $M^{m+}$ represents an m-valent onium cation.

{Anionic Moiety}

In Formula (b-0), $R^{100}$ represents a halogenated alkyl group which may have a substituent, a cyclic group which may have a substituent, or an alkenyl group which may have a substituent.

Examples of the halogenated alkyl group as R100 include a group obtained by substituting part or all of hydrogen atoms of a linear, branched, or cyclic alkyl group with a halogen atom. Examples of the halogen atom include a fluorine atom, a chlorine atom, a bromine atom, and an iodine atom. Among these, a fluorine atom is preferable.

In a case where the alkyl group in the halogenated alkyl group is a linear or branched alkyl group, the number of carbon atoms is preferably in a range of 1 to 10, more preferably in a range of 1 to 8, and particularly preferably in a range of 1 to 4. In a case where the alkyl group is a cyclic alkyl group, the number of carbon atoms is preferably in a range of 4 to 15, more preferably in a range of 4 to 10, and particularly preferably in a range of 6 to 10.

In the halogenated alkyl group, the ratio (halogenation ratio (%)) of the number of halogen atoms to the total number of halogen atoms and hydrogen atoms in the halogenated alkyl group is preferably in a range of 10% to 100%, more preferably in a range of 50% to 100%, and most preferably 100%. It is preferable that the halogenation ratio be increased from the viewpoint that the acidity becomes strong.

It is preferable that the cyclic group as $R^{100}$ be a cyclic hydrocarbon group, and the cyclic hydrocarbon group may be an aromatic hydrocarbon group or an aliphatic hydrocarbon group, but an aliphatic hydrocarbon group is preferable. The aliphatic hydrocarbon group may be saturated or unsaturated, but it is preferable that the aliphatic hydrocarbon group be usually saturated.

Preferred examples of the cyclic aliphatic hydrocarbon group as $R^{100}$ include a group formed by removing one or more hydrogen atoms from adamantane, norbornane, isobornane, tricyclodecane, or tetracyclododecane; and a group formed by removing one or more hydrogen atoms from camphor. Among these, a group formed by removing one or more hydrogen atoms from camphor is more preferable.

It is preferable that the alkenyl group as $R^{100}$ be an alkenyl group having 2 to 10 carbon atoms.

As for $R^{100}$, the expression "which may have a substituent" means that part or all of hydrogen atoms in the halogenated alkyl group, the cyclic group, or the alkenyl group may be substituted with a substituent (an atom or a group other than a hydrogen atom).

The number of substituents in $R^{100}$ may be one or two or more.

Examples of the substituent in $R^{100}$ include a halogen atom, a heteroatom, and an alkyl group.

Examples of the halogen atom and the alkyl group as the substituent in $R^{100}$ are the same as those for the halogen atom and the alkyl group in the halogenated alkyl group as $R^{100}$.

Examples of the heteroatom include an oxygen atom, a nitrogen atom, and a sulfur atom.

Specific examples of the anionic moiety "R100-$SO_3^-$" of a compound represented by Formula (b-0) include trifluoromethane sulfonate, heptafluoropropane sulfonate, nonafluorobutane sulfonate, 1-adanatane sulfonate, 2-norbornane sulfonate, d-camphor-10-sulfonate, benzene sulfonate, perfluorobenzene sulfonate, and p-toluene sulfonate.

In addition to the compound represented by Formula (b-0), examples of the onium salt-based acid generators include a compound represented by Formula (b-1) (hereinafter, also referred to as a "(b-1) component"), a compound represented by Formula (b-2) (hereinafter, also referred to as a "(b-2) component"), and a compound represented by Formula (b-3) (hereinafter, also referred to as a "(b-3) component").

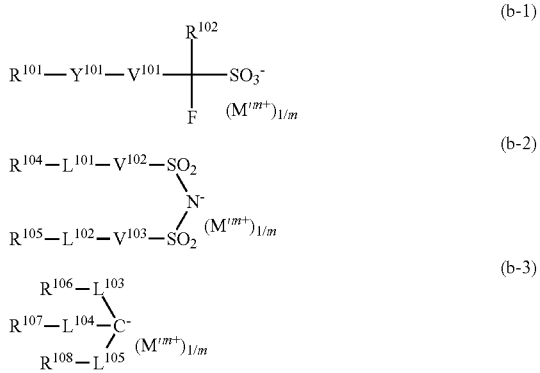

In the formulae, $R^{101}$ and $R^{104}$ to $R^{108}$ each independently represents a cyclic group which may have a substituent, a chain alkyl group which may have a substituent, or a chain alkenyl group which may have a substituent, provided that $R^{104}$ and $R^{105}$ may be bonded to each other to form a ring; $R^{102}$ represents a fluorine atom or a fluorinated alkyl group having 1 to 5 carbon atoms; $Y^{101}$ represents a single bond or a divalent linking group having oxygen atoms; $V^{101}$ to $V^{103}$ each independently represents a single bond, an alkylene group, or a fluorinated alkylene group; $L^{101}$ and $L^{102}$ each independently represents a single bond or an oxygen atom; $L^{103}$ to $L^{105}$ each independently represents a single bond, —CO—, or —$SO_2$—; m represents an integer of 1 or greater; and $M^{m+}$ represents an m-valent onium cation.

{Anionic Moiety}

Anionic Moiety of (b-1) Component

In Formula (b-1), $R^{101}$ represents a cyclic group which may have a substituent, a chain alkyl group which may have a substituent, or a chain alkenyl group which may have a substituent.

Cyclic group which may have substituent:

It is preferable that the cyclic group be a cyclic hydrocarbon group, and the cyclic hydrocarbon group may be an aromatic hydrocarbon group or an aliphatic hydrocarbon group. The aliphatic hydrocarbon group may be saturated or unsaturated, but it is preferable that the aliphatic hydrocarbon group be usually saturated.

The aromatic hydrocarbon group as $R^{101}$ is a hydrocarbon group having an aromatic ring. The number of carbon atoms of the aromatic hydrocarbon group is preferably in a range of 3 to 30, more preferably in a range of 5 to 30, still more preferably in a range of 5 to 20, particularly preferably in a range of 6 to 15, and most preferably in a range of 6 to 10. Here, the number of carbon atoms does not include the number of carbon atoms in a substituent.

Specific examples of the aromatic ring included in the aromatic hydrocarbon group as $R^{101}$ include benzene, fluorene, naphthalene, anthracene, phenanthrene, biphenyl, and aromatic heterocycle formed by part of carbon atoms constituting these aromatic rings being substituted with a heteroatom. Examples of the heteroatom in the aromatic heterocycle include an oxygen atom, a sulfur atom, and a nitrogen atom.

Specific examples of the aromatic hydrocarbon group as $R^{101}$ include a group (an aryl group such as a phenyl group or a naphthyl group) formed by removing one hydrogen atom from the aromatic ring; and a group (for example, an arylalkyl group such as a benzyl group, a phenethyl group, a 1-naphthylmethyl group, a 2-naphthylmethyl group, a 1-naphthylethyl group, or a 2-naphthylethyl group) formed by one hydrogen atom in the aromatic ring being substituted with an alkylene group. The number of carbon atoms of the alkylene group (the alkyl chain in the arylalkyl group) is preferably in a range of 1 to 4, more preferably 1 or 2, and particularly preferably 1.

Examples of the cyclic aliphatic hydrocarbon group as $R^{101}$ include an aliphatic hydrocarbon group having a ring in the structure.

Examples of the aliphatic hydrocarbon group having a ring in the structure include an alicyclic hydrocarbon group (a group formed by removing one hydrogen atom from an aliphatic hydrocarbon ring); a group formed by the alicyclic hydrocarbon group being bonded to the terminal of a linear or branched aliphatic hydrocarbon group; and a group formed by the alicyclic hydrocarbon group being interposed in the middle of a linear or branched aliphatic hydrocarbon group.

The number of carbon atoms of the alicyclic hydrocarbon group is preferably in a range of 3 to 20 and more preferably in a range of 3 to 12.

The alicyclic hydrocarbon group may be a polycyclic group or a monocyclic group. As the monocyclic alicyclic hydrocarbon group, a group formed by removing one or more hydrogen atoms from a monocycloalkane is preferable. The number of carbon atoms of the monocycloalkane is preferably in a range of 3 to 6, and specific examples thereof include cyclopentane and cyclohexane. As the polycyclic alicyclic hydrocarbon group, a group formed by removing one or more hydrogen atoms from a polycycloalkane is preferable. The number of carbon atoms of the polycycloalkane is preferably in a range of 7 to 30. Among the examples, as the polycycloalkane, a polycycloalkane having a bridged ring-based polycyclic skeleton such as adamantane, norbornane, isobornane, tricyclodecane, or tetracyclododecane; and a polycycloalkane having a fused ring-based polycyclic skeleton such as a cyclic group having a steroid skeleton are more preferable.

Among these, as the cyclic aliphatic hydrocarbon group as $R^{101}$, a group formed by removing one or more hydrogen atoms from a monocycloalkane or a polycycloalkane is preferable; a group formed by removing one hydrogen atom from a polycycloalkane is more preferable; an adamantyl group or a norbornyl group is particularly preferable; and an adamantyl group is most preferable.

The number of carbon atoms of the linear or branched aliphatic hydrocarbon group which may be bonded to an alicyclic hydrocarbon group is preferably in a range of 1 to 10, more preferably in a range of 1 to 6, still more preferably in a range of 1 to 4, and most preferably in a range of 1 to 3.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

As the branched aliphatic hydrocarbon group, a branched alkylene group is preferable, and specific examples thereof include an alkylalkylene group, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group such as —$CH(CH_3)CH_2CH_2$— or —$CH_2CH(CH_3)CH_2$—; and an alkyltetramethylene group such as —$CH(CH_3)CH_2CH_2CH_2$— or —$CH_2CH(CH_3)CH_2CH_2$—. As the alkyl group in the alkylalkylene group, a linear alkyl group having 1 to 5 carbon atoms is preferable.

The cyclic hydrocarbon group as $R^{101}$ may have a heteroatom as in a case of a heterocycle. Specific examples of the cyclic hydrocarbon group as $R^{101}$ include lactone-containing cyclic groups respectively represented by Formulae (a2-r-1) to (a2-r-7); —$SO_2$—containing cyclic groups respectively represented by Formulae (a5-r-1) to (a5-r-4); and heterocyclic groups respectively represented by chemical Formulae (r-hr-1) to (r-hr-16).

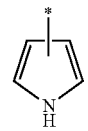

(r-hr-1)

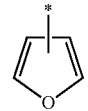

(r-hr-2)

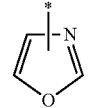

(r-hr-3)

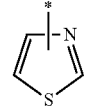

(r-hr-4)

-continued (r-hr-5) 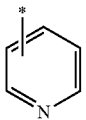

(r-hr-6) 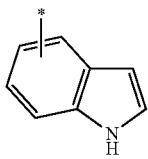

(r-hr-7) 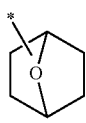

(r-hr-8) 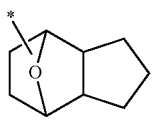

(r-hr-9) 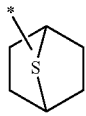

(r-hr-10) 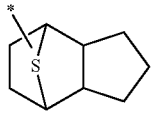

(r-hr-11) 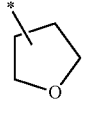

(r-hr-12) 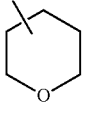

(r-hr-13) 

(r-hr-14) 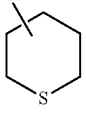

(r-hr-15) 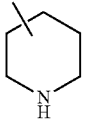

-continued (r-hr-16) 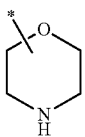

As the cyclic group which may have a substituent, an acid-dissociable group is also exemplified.

Examples of the substituent in the cyclic group as $R^{101}$ include an alkyl group, an alkoxy group, a halogen atom, a halogenated alkyl group, a hydroxyl group, a carbonyl group and a nitro group.

As the alkyl group as the substituent, an alkyl group having 1 to 5 carbon atoms is preferable; and a methyl group, an ethyl group, a propyl group, an n-butyl group, and a tert-butyl group are more preferable.

As the alkoxy group as the substituent, an alkoxy group having 1 to 5 carbon atoms is preferable; a methoxy group, an ethoxy group, an n-propoxy group, an iso-propoxy group, an n-butoxy group, and a tert-butoxy group are more preferable; and a methoxy group and an ethoxy group are most preferable.

Examples of the halogen atom as the substituent include a fluorine atom, a chlorine atom, a bromine atom, and an iodine atom. Among these, a fluorine atom is preferable.

As the halogenated alkyl group as the substituent, a group formed by part or all of hydrogen atoms in the alkyl group having 1 to 5 carbon atoms, such as a methyl group, an ethyl group, a propyl group, an n-butyl group, or a tert-butyl group, being substituted with a halogen atom is exemplified.

The carbonyl group as the substituent is a group that substitutes for a methylene group (—$CH_2$—) constituting a cyclic hydrocarbon group.

Chain alkyl group which may have substituent:

The chain alkyl group as $R^{101}$ may be linear or branched. The number of carbon atoms of the linear alkyl group is preferably in a range of 1 to 20, more preferably in a range of 1 to 15, and most preferably in a range of 1 to 10. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a heneicosyl group, and docosyl group.

The number of carbon atoms of the branched alkyl group is preferably in a range of 3 to 20, more preferably in a range of 3 to 15, and most preferably in a range of 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group. As the cyclic alkyl group which may have a substituent, an acid-dissociable group is also exemplified.

Chain alkenyl group which may have substituent:

The chain alkenyl group as $R^{101}$ may be linear or branched, and the number of carbon atoms is preferably in a range of 2 to 10, more preferably in a range of 2 to 5, still more preferably in a range of 2 to 4, and particularly preferably 3. Examples of the linear alkenyl group include a vinyl group, a propenyl group (allyl group), and a butynyl group. Examples of the branched alkenyl group include a 1-methylvinyl group, a 2-methylvinyl group, a 1-methylpropenyl group, and a 2-methylpropenyl group.

Among these, as the chain alkenyl group, a linear alkenyl group is preferable, a vinyl group or a propenyl group is more preferable, and a vinyl group is particularly preferable.

Examples of the substituent in the chain alkyl group or the chain alkenyl group as $R^{101}$ include an alkoxy group, a halogen atom, a halogenated alkyl group, a hydroxyl group, a carbonyl group, a nitro group, an amino group, and the cyclic groups as $R^{101}$.

Among these, $R^{101}$ represents preferably a cyclic group which may have a substituent and more preferably a cyclic hydrocarbon group which may have a substituent. Specific preferred examples thereof include a group formed by removing one or more hydrogen atoms from a phenyl group which may have a substituent, a naphthyl group which may have a substituent, or a polycycloalkane which may have a substituent; a lactone-containing cyclic group respectively represented by Formulae (a2-r-1) and (a2-r-3) to (a2-r-7); and a —SO$_2$—containing cyclic group respectively represented by Formulae (a5-r-1) to (a5-r-4).

In Formula (b-1), $R^{102}$ represents a fluorinated alkyl group having 1 to 5 carbon atoms or a fluorine atom.

$R^{102}$ represents preferably a perfluoroalkyl group having 1 to 5 carbon atoms or a fluorine atom and more preferably a fluorine atom.

In Formula (b-1), $Y^{101}$ represents a divalent linking group having oxygen atoms or a single bond.

The divalent linking group as $Y^{101}$ may have an atom other than the oxygen atom. Examples of the atom other than the oxygen atom include a carbon atom, a hydrogen atom, a sulfur atom, and a nitrogen atom.

Examples of the divalent linking group having an oxygen atom include a non-hydrocarbon-based oxygen atom-containing linking group such as an oxygen atom (ether bond: —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and a combination of the non-hydrocarbon-based oxygen atom-containing linking group with an alkylene group. A sulfonyl group (—SO$_2$—) may be further bonded to this combination.

Examples of such a divalent linking group having an oxygen atom include linking groups respectively represented by Formulae (y-a1-1) to (y-a1-7).

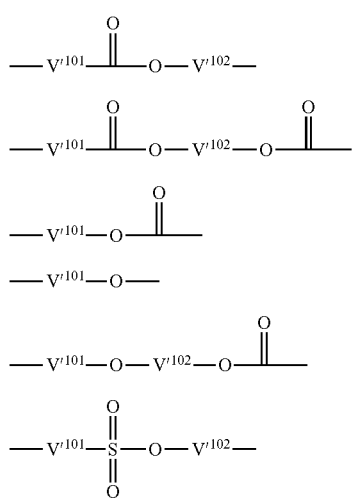

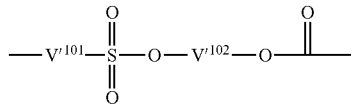

In the formulae, $V'^{101}$ represents an alkylene group having 1 to 5 carbon atoms or a single bond, and $V'^{102}$ represents a divalent saturated hydrocarbon group having 1 to 30 carbon atoms or a single bond.

The divalent saturated hydrocarbon group as $V'^{102}$ represents preferably an alkylene group having 1 to 30 carbon atoms, more preferably an alkylene group having 1 to 10 carbon atoms, and still more preferably an alkylene group having 1 to 5 carbon atoms.

The alkylene groups as $V'^{101}$ and $V'^{102}$ may be respectively a linear or branched alkylene group, and a linear alkylene group is preferable.

Specific examples of the alkylene group as $V'^{101}$ and $V'^{102}$ include a methylene group [—CH$_2$—]; an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, or —C(CH$_2$CH$_3$)$_2$—; an ethylene group [—CH$_2$CH$_2$—]; an alkylethylene group such as —CH(CH$_3$)CH$_2$—, —CH(CH$_3$)CH(CH$_3$)—, —C(CH$_3$)$_2$CH$_2$—, or —CH(CH$_2$CH$_3$)CH$_2$—; a trimethylene group (n-propylene group)[—CH$_2$CH$_2$CH$_2$—]; an alkyltrimethylene group such as —CH(CH$_3$)CH$_2$CH$_2$— or —CH$_2$CH(CH$_3$)CH$_2$—; a tetramethylene group [—CH$_2$CH$_2$CH$_2$CH$_2$—]; an alkyltetramethylene group such as —CH(CH$_3$)CH$_2$CH$_2$CH$_2$— or —CH$_2$CH(CH$_3$)CH$_2$CH$_2$—; and a pentamethylene group [—CH$_2$CH$_2$CH$_2$CH$_2$CH$_2$—].

A part of methylene groups in the alkylene group as $V'^{101}$ or $V'^{102}$ may be substituted with a divalent aliphatic cyclic group having 5 to 10 carbon atoms. As the aliphatic cyclic group, a divalent group formed by removing one hydrogen atom from a cyclic aliphatic hydrocarbon group as $R^{101}$ is preferable; and a cyclohexylene group, a 1,5-adamantylene group, or a 2,6-adamantylene group is more preferable.

$Y^{101}$ represents preferably a divalent linking group having an ester bond or a divalent linking group having an ether bond and more preferably linking groups respectively represented by Formulae (y-a1-1) to (y-a1-5).

In Formula (b-1), $V^{101}$ represents an alkylene group, a fluorinated alkylene group, or a single bond.

The numbers of carbon atoms of the alkylene group and the fluorinated alkylene group as $V^{101}$ are respectively and preferably in a range of 1 to 4. Examples of the fluorinated alkylene group as $V^{101}$ include a group formed by some or all hydrogen atoms in the alkylene group as $V^{101}$ being substituted with fluorine atoms. Among the examples, it is preferable that $V^{101}$ represent a single bond or an alkylene group having 1 to 4 carbon atoms.

Specific examples of the anionic moiety of the (b-1) component include a fluorinated alkylsulfonate anion such as a trifluoromethanesulfonate anion or a perfluorobutanesulfonate anion in a case where $Y^{101}$ represents a single bond. Specific examples thereof include an anion represented by any of Formulae (an-1) to (an-3) in a case where $Y^{101}$ represents a divalent linking group having an oxygen atom.

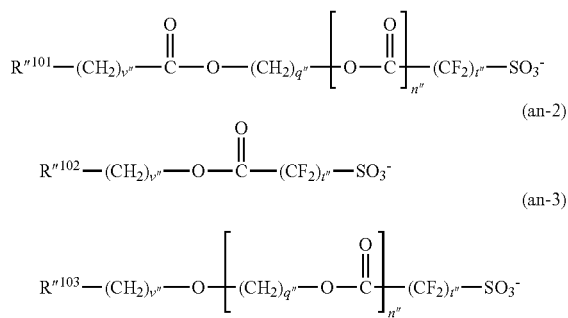

In the formulae, $R''^{101}$ represents an aliphatic cyclic group which may have a substituent, a group represented by any of Formulae (r-hr-1) to (r-hr-6), or a chain alkyl group which may have a substituent; $R''^{102}$ represents an aliphatic cyclic group which may have a substituent, a lactone-containing cyclic group represented by any of Formulae (a2-r-1) to (a2-r-7), or a —SO$_2$-containing cyclic group represented by any of Formulae (a5-r-1) to (a5-r-4); $R''^{103}$ represents an aromatic cyclic group which may have a substituent, an aliphatic cyclic group which may have a substituent, or a chain alkenyl group which may have a substituent; (v")'s each independently represents an integer of 0 to 3; (q")'s each independently represents an integer of 1 to 20; t" represents an integer of 1 to 3; and n" represents 0 or 1.

It is preferable that the aliphatic cyclic group which may have the substituent as $R''^{101}$, $R''^{102}$, or $R''^{103}$ be a group exemplified as the cyclic aliphatic hydrocarbon group as $R^{101}$. Examples of the substituent are the same as those for the substituent that may substitute for the cyclic aliphatic hydrocarbon group as $R^{101}$.

It is preferable that the aromatic cyclic group which may have a substituent as $R''^{103}$ be a group exemplified as the aromatic hydrocarbon group in the cyclic hydrocarbon group as $R^{101}$. Examples of the substituent are the same as those for the substituent that may substitute for the aromatic hydrocarbon group as $R^{101}$.

It is preferable that the chain alkyl group which may have a substituent as $R''^{101}$ be a group exemplified as chain alkyl group as $R^{101}$. It is preferable that the chain alkenyl group which may have a substituent as $R''^{103}$ be a group exemplified as the chain alkenyl group as $R^{101}$.

Anionic Moiety of (b-2) Component

In Formula (b-2), $R^{104}$ and $R^{105}$ each independently represents a cyclic group which may have a substituent, a chain alkyl group which may have a substituent, or a chain alkenyl group which may have a substituent, and examples of $R^{104}$ and $R^{105}$ are respectively the same as those for $R^{101}$ in Formula (b-1). $R^{104}$ and $R^{105}$ may be bonded to each other to form a ring.

$R^{104}$ and $R^{105}$ represent preferably a chain alkyl group which may have a substituent and more preferably a linear or branched alkyl group or a linear or branched fluorinated alkyl group.

The number of carbon atoms of the chain alkyl group is preferably in a range of 1 to 10, more preferably in a range of 1 to 7, and still more preferably in a range of 1 to 3. It is preferable that the number of carbon atoms of the chain alkyl group as $R^{104}$ and $R^{105}$ be as small as possible within the above-described range of carbon atoms from the viewpoint of excellent solubility in a solvent for a resist. Further, in the chain alkyl group as $R^{104}$ and $R^{105}$, it is preferable that the number of hydrogen atoms substituted with fluorine atoms be as large as possible from the viewpoint that the acid strength is increased and the transparency with respect to electron beams or energy light having a wavelength of 200 nm or less is improved.

The proportion of fluorine atoms in the chain alkyl group, that is, the fluorination rate thereof is preferably in a range of 70% to 100% and more preferably in a range of 90% to 100%, and a perfluoroalkyl group formed by all hydrogen atoms being substituted with fluorine atoms is most preferable.

Formula (b-2), $V^{102}$ and $V^{103}$ each independently represents a single bond, an alkylene group, or a fluorinated alkylene group, and examples of $V^{102}$ and $V^{103}$ are respectively the same as those for $V^{101}$ in formula (b-1).

In Formula (b-2), $L^{101}$ and $L^{102}$ each independently represents a single bond or an oxygen atom.

Anionic Moiety of (b-3) Component

In Formula (b-3), $R^{106}$ to $R^{108}$ each independently represents a cyclic group which may have a substituent, a chain alkyl group which may have a substituent, or a chain alkenyl group which may have a substituent, and examples of $R^{106}$ to $R^{108}$ are respectively the same as those for $R^{101}$ in Formula (b-1).

$L^{103}$ to $L^{105}$ each independently represents a single bond, —CO—, or —SO$_2$—.

Among the components, the (b-0) component or the (b-1) component is preferable as the (B) component.

As the anionic moiety of the (b-1) component, a fluorinated alkyl sulfonate anion is preferable and a perfluorobutane sulfonate anion is more preferable.

Specific preferred examples of the anionic moiety of the (B) component include nonafluorobutane sulfonate and d-camphor-10-sulfonate.

Cationic Moiety (($M'^{m+}$)$_{1/m}$)

In Formula (b-1), $M'^{m+}$ represents an m-valent onium cation. m represents an integer of 1 or greater.

As the onium cation as $M'^{m+}$, a sulfonium cation or an iodonium cation is preferable.

Preferred examples of the cationic moiety (($M'^{m+}$)$_{1/m}$) include organic cations respectively represented by Formulae (ca-1) to (ca-5).

(ca-1)

(ca-2)

(ca-3)

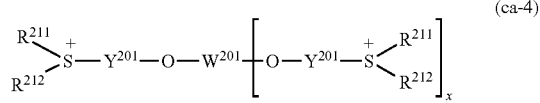

(ca-4)

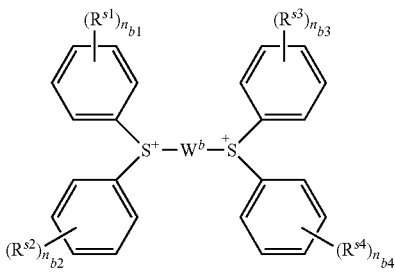

(ca-5)

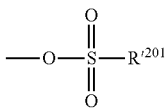

[ca-r-6]

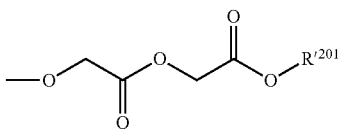

[ca-r-7]

In the formulae, $R^{201}$ to $R^{207}$, $R^{211}$, and $R^{212}$ each independently represents an aryl group which may have a substituent, an alkyl group which may have a substituent, or an alkenyl group which may have a substituent, $R^{201}$ to $R^{203}$, $R^{206}$, $R^{207}$, $R^{211}$, and $R^{212}$ may be bonded to one another to form a ring together with the sulfur atom in the formulae; $R^{208}$ and $R^{209}$ each independently represents a hydrogen atom or an alkyl group having 1 to 5 carbon atoms; $R^{210}$ represents an aryl group which may have a substituent, an alkyl group which may have a substituent, an alkenyl group which may have a substituent, or a —$SO_2$-containing cyclic group which may have a substituent; $L^{201}$ represents —C(=O)— or —C(=O)—O—; $Y^{201}$'s each independently represents an arylene group, an alkylene group, or an alkenylene group; x represents 1 or 2; $W^{201}$ represents an (x+1)-valent linking group; $W^b$ represents a hydrocarbon group which may have a substituent; $R^{s1}$ to $R^{s4}$ each independently represents a substituent; and $n_{b1}$ to $n_{b4}$ each independently represents an integer of 0 to 3.

In Formulae (ca-1) to (ca-4), examples of the aryl group as $R^{201}$ to $R^{207}$, $R^{211}$, and $R^{212}$ include an unsubstituted aryl group having 6 to 20 carbon atoms, and a phenyl group or a naphthyl group are preferable.

The alkyl group as $R^{201}$ to $R^{207}$, $R^{211}$, and $R^{212}$ is a chain or cyclic alkyl group, and the number of carbon atoms thereof is preferably 1 to 30.

The number of carbon atoms of the alkenyl group as $R^{201}$ to $R^{207}$, $R^{211}$, and $R^{212}$ is preferably in a range of 2 to 10.

Examples of the substituent which may be included in $R^{201}$ to $R^{207}$, $R^{210}$, and $R^{212}$ include an alkyl group, a halogen atom, a halogenated alkyl group, a carbonyl group, a cyano group, an amino group, an aryl group, and groups respectively represented by Formulae (ca-r-1) to (ca-r-7).

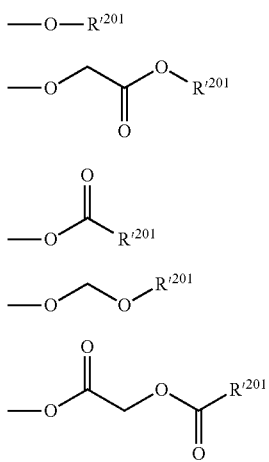

[ca-r-1]

[ca-r-2]

[ca-r-3]

[ca-r-4]

[ca-r-5]

In the formulae, $R'^{201}$'s each independently represents a hydrogen atom, a cyclic group which may have a substituent, a chain alkyl group which may have a substituent, or a chain alkenyl group which may have a substituent.

Examples of the cyclic group which may have a substituent, the chain alkyl group which may have a substituent, or the chain alkenyl group which may have a substituent as $R'^{201}$ are the same as those for $R^{101}$ in Formula (b-1). In addition, examples of the cyclic group which may have a substituent or the chain alkyl group which may have a substituent as $R'^{201}$ also include an acid-dissociable group.

Among the examples, as the substituents which may be included in $R^{201}$ to $R^{207}$ and $R^{210}$ to $R^{212}$, a linear or branched alkyl group having 1 to 5 carbon atoms is preferable, a linear alkyl group having 1 to 5 carbon atoms is more preferable, and a methyl group is still more preferable.

In a case where $R^{201}$ to $R^{203}$, $R^{206}$, $R^{207}$, $R^{211}$, and $R^{212}$ are bonded to one another to form a ring together with the sulfur atom in the formulae, $R^{201}$ to $R^{203}$, $R^{206}$, $R^{207}$, $R^{211}$, and $R^{212}$ may be bonded through a heteroatom such as a sulfur atom, an oxygen atom, or a nitrogen atom, or a functional group such as a carbonyl group, —SO—, —$SO_2$—, —$SO_3$—, —COO—, —CONH—, or —N($R_N$)— ($R_N$ represents an alkyl group having 1 to 5 carbon atoms). As the ring to be formed, one ring containing the sulfur atom in the formulae in the ring skeleton is preferably a 3- to 10-membered ring and particularly preferably a 5- to 7-membered ring, including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a phenoxanthiin ring, a tetrahydrothiophenium ring, and a tetrahydrothiopyranium ring.

$R^{208}$ and $R^{209}$ each independently represents a hydrogen atom or an alkyl group having 1 to 5 carbon atoms and preferably a hydrogen atom or an alkyl group having 1 to 3 carbon atoms. In a case where $R^{208}$ and $R^{209}$ each independently represents an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —$SO_2$-containing cyclic group which may have a substituent.

Examples of the aryl group as $R^{210}$ include an unsubstituted aryl group having 6 to 20 carbon atoms, and a phenyl group and a naphthyl group are preferable.

The alkyl group as $R^{210}$ is a chain or cyclic alkyl group, and the number of carbon atoms thereof is preferably 1 to 30.

The number of carbon atoms of the alkenyl group as $R^{210}$ is preferably in a range of 2 to 10.

As the —$SO_2$-containing cyclic group which may have a substituent as $R^{210}$, a "—$SO_2$-containing polycyclic group is preferable and a group represented by Formula (a5-r-1) is more preferable.

$Y^{201}$'s each independently represents an arylene group, an alkylene group, or an alkenylene group.

Examples of the arylene group as $Y^{201}$ include a group formed by removing one hydrogen atom from the aryl group exemplified as the aromatic hydrocarbon group as $R^{101}$ in Formula (b-1).

Examples of the alkylene group and the alkenylene group as $Y^{201}$ respectively include groups formed by removing one hydrogen atom from the groups exemplified as the chain alkyl group and the chain alkenyl group as $R^{101}$ in Formula (b-1).

In Formula (ca-4), x represents 1 or 2.

$W^{201}$ represent an (x+1)-valent linking group, that is, a divalent or trivalent linking group.

As the divalent linking group represented by $W^{201}$, a divalent hydrocarbon group which may have a substituent is preferable, and the same groups as $Ya^{x0}$ described as the examples for the divalent hydrocarbon group which may have a substituent can be exemplified. The divalent linking group as $W^{201}$ may be linear, branched, or cyclic, but a cyclic divalent linking group is preferable. Among the examples, a group formed by two carbonyl groups being combined with both ends of an arylene group is preferable. Examples of the arylene group include a phenylene group and a naphthylene group. Among these, a phenylene group is particularly preferable.

Examples of the trivalent linking group as $W^{201}$ include a group formed by removing one hydrogen atom from the divalent linking group as $W^{201}$ and a group formed by the divalent linking group being bonded to the divalent linking group. As the trivalent linking group as $W^{201}$, a group formed by two carbonyl groups being bonded to an arylene group is preferable.

In Formula (ca-5), $W^b$ represents a hydrocarbon group which may have a substituent.

The hydrocarbon group as $W^b$ may be an aliphatic hydrocarbon group or an aromatic hydrocarbon group.

Aliphatic Hydrocarbon Group

The aliphatic hydrocarbon group as the divalent hydrocarbon group represented by $W^b$ may be saturated or unsaturated. However, a saturated aliphatic hydrocarbon group is usually preferable.

Specific examples of the aliphatic hydrocarbon group include a linear or branched aliphatic hydrocarbon group and an aliphatic hydrocarbon group having a ring in the structure.

Linear or Branched Aliphatic Hydrocarbon Group

The number of carbon atoms of the linear aliphatic hydrocarbon group is preferably in a range of 1 to 10, more preferably in a range of 1 to 6, still more preferably in a range of 1 to 4, and most preferably in a range of 1 to 3.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The number of carbon atoms of the branched aliphatic hydrocarbon group is preferably in a range of 2 to 10, more preferably in a range of 3 to 6, still more preferably 3 or 4, and most preferably 3.

As the branched aliphatic hydrocarbon group, a branched alkylene group is preferable, and specific examples thereof include an alkylalkylene group, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group such as —$CH(CH_3)CH_2CH_2$— or —$CH_2CH(CH_3)CH_2$—; and an alkyltetramethylene group such as —$CH(CH_3)CH_2CH_2CH_2$— or —$CH_2CH(CH_3)CH_2CH_2$—. As the alkyl group in the alkylalkylene group, a linear alkyl group having 1 to 5 carbon atoms is preferable.

Aliphatic Hydrocarbon Group Having Ring in Structure

Examples of the aliphatic hydrocarbon group having a ring in the structure include an alicyclic hydrocarbon group (group formed by removing two hydrogen atoms from an aliphatic hydrocarbon ring) which may have a substituent having heteroatoms in the ring structure; a group formed by the alicyclic hydrocarbon group being bonded to the terminal of a linear or branched aliphatic hydrocarbon group; and a group formed by the alicyclic hydrocarbon group being interposed in the middle of a linear or branched aliphatic hydrocarbon group. Examples of the linear or branched aliphatic hydrocarbon group are the same as those described above.

The number of carbon atoms of the alicyclic hydrocarbon group is preferably in a range of 3 to 20 and more preferably in a range of 3 to 12.

The alicyclic hydrocarbon group may be a polycyclic or monocyclic group. As the monocyclic alicyclic hydrocarbon group, a group formed by removing two hydrogen atoms from a monocycloalkane is preferable. The number of carbon atoms of the monocycloalkane is preferably in a range of 3 to 6, and specific examples thereof include cyclopentane and cyclohexane. As the polycyclic alicyclic hydrocarbon group, a group formed by removing two hydrogen atoms from a polycycloalkane is preferable. The number of carbon atoms of the polycycloalkane is preferably in a range of 7 to 12, and specific examples thereof include adamantane, norbornane, isobornane, tricyclodecane, and tetracyclododecane.

Aromatic Hydrocarbon Group

The aromatic hydrocarbon group is a hydrocarbon group having an aromatic ring.

The number of carbon atoms of the aromatic hydrocarbon group as the divalent hydrocarbon group represented by $W^b$ is preferably in a range of 3 to 30, more preferably in a range of 5 to 30, still more preferably in a range of 5 to 20, particularly preferably in a range of 6 to 15, and most preferably in a range of 6 to 10. Here, the number of carbon atoms does not include the number of carbon atoms in a substituent.

Specific examples of the aromatic ring included in the aromatic hydrocarbon group include an aromatic hydrocarbon ring such as benzene, biphenyl, fluorene, naphthalene, anthracene, or phenanthrene; and an aromatic heterocycle formed by a carbon atom constituting the aromatic hydrocarbon ring being substituted with a heteroatom. Examples of the heteroatoms in the aromatic heterocycle include an oxygen atom, a sulfur atom, and a nitrogen atom.

Specific examples of the aromatic hydrocarbon group include a group (an arylene group and preferably a phenylene group or a naphthylene group) formed by removing two hydrogen atoms from the aromatic hydrocarbon ring; and a group (for example, a group formed by further removing one hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group) formed by substituting one hydrogen atom in a group (an arylene group) formed by removing one hydrogen atom from the aromatic hydrocarbon ring with an alkylene group. The number of carbon atoms of the alkylene group (the alkyl chain in the arylalkyl group) is preferably in a range of 1 to 4, more preferably 1 or 2, and particularly preferably 1.

Examples of the substituent which may be included in a hydrocarbon group as $W^b$ include an alkyl group having 1 to 5 carbon atoms, an alkoxy group having 1 to 5 carbon atoms, an oxo group (=O), a hydroxyl group (—OH), and an amino group (—NH$_2$).

Among the examples, it is preferable that $W^b$ represent an aromatic hydrocarbon group. As an aromatic ring in an aromatic hydrocarbon group, benzene, biphenyl, or naphthalene is preferable, and benzene or biphenyl is more preferable.

In Formula (ca-5), $R^{s1}$ to $R^{s4}$ each independently represents a substituent.

Examples of the substituents as $R^{s1}$ to $R^{s4}$ include an alkyl group, a halogen atom, a halogenated alkyl group, a carbonyl group, a cyano group, an amino group, an aryl group, an arylthio group, and groups respectively represented by Formulae (ca-r-1) to (ca-r-7).

Examples of the arylthio group as a substituent include a phenylthio group and a biphenylthio group.

In Formula (ca-5), $n_{b1}$ to $n_{b4}$ each independently represents an integer of 0 to 3, preferably 0 or 1, and more preferably 0.

Specific suitable examples of the cation represented by Formula (ca-1) include cations respectively represented by Formulae (ca-1-1) to (ca-1-75).

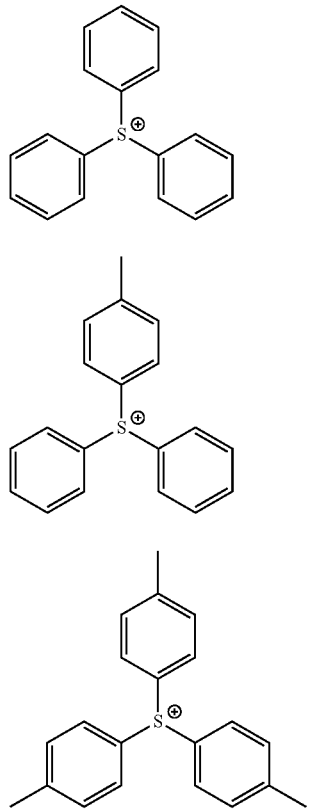

(ca-1-1)

(ca-1-2)

(ca-1-3)

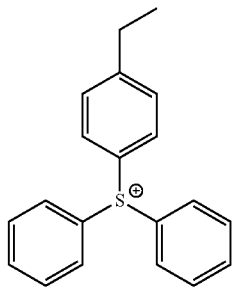

(ca-1-4)

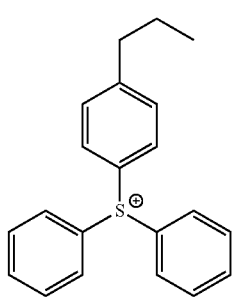

(ca-1-5)

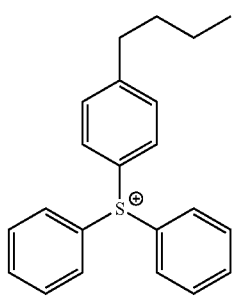

(ca-1-6)

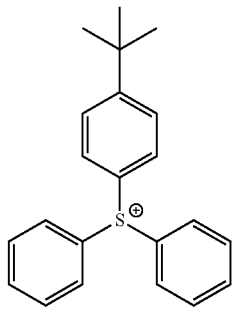

(ca-1-7)

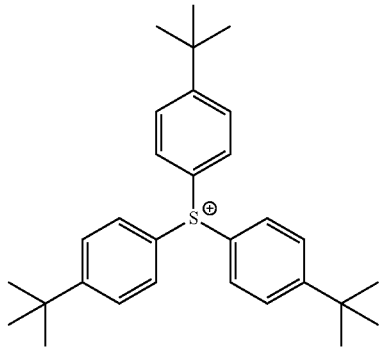

(ca-1-8)

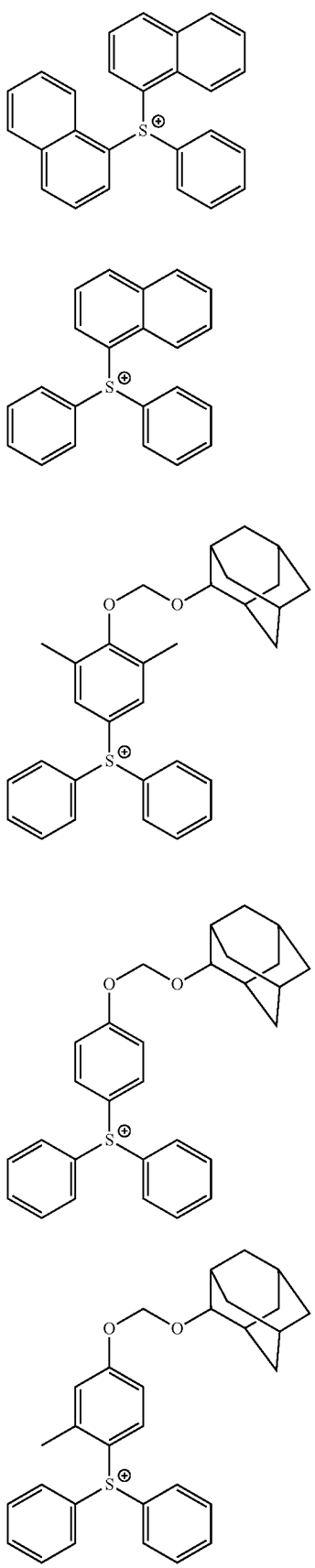
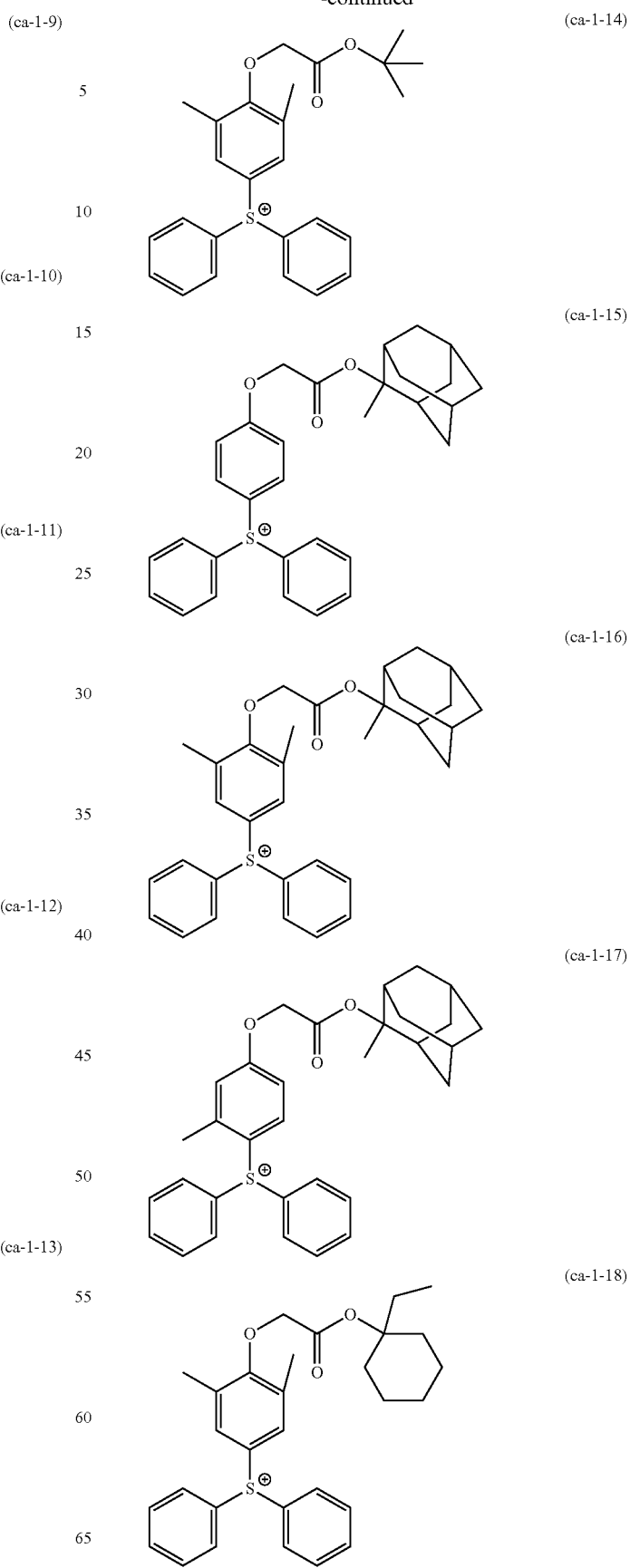

(ca-1-19)
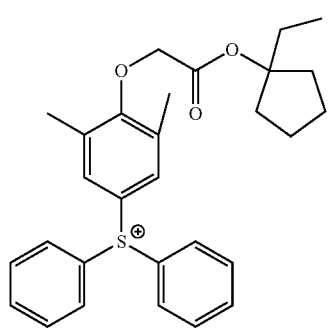
(ca-1-20)
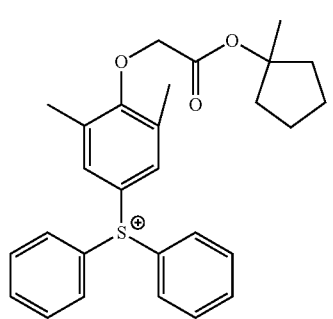
(ca-1-21)
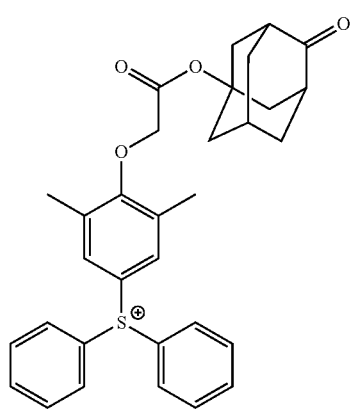
(ca-1-22)
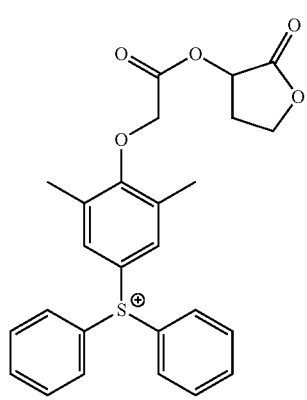
(ca-1-23)
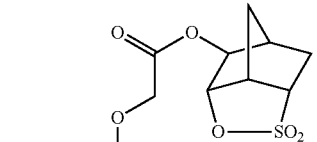
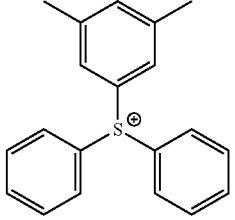
(ca-1-24)
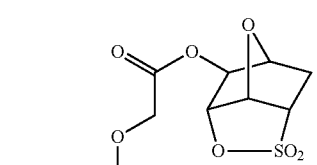
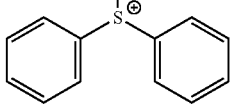
(ca-1-25)
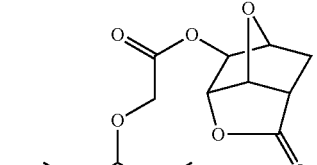
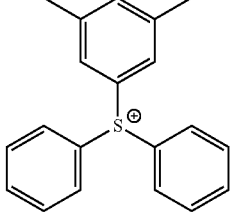
(ca-1-26)
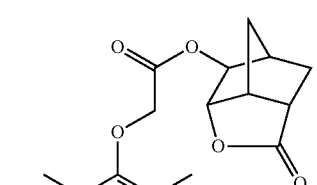
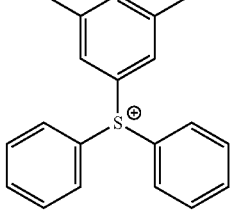

(ca-1-27)
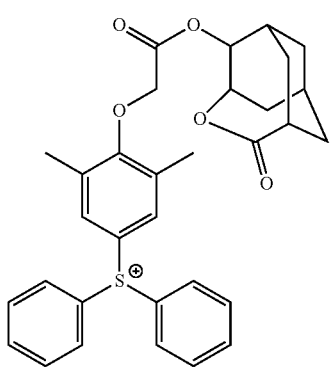
(ca-1-28)
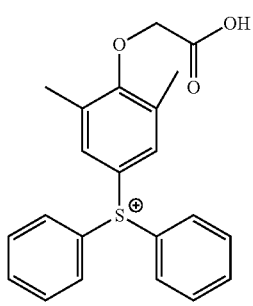
(ca-1-29)
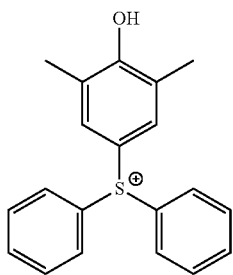
(ca-1-30)
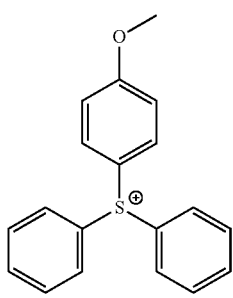
(ca-1-31)
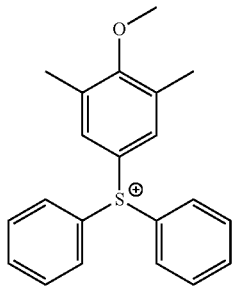
(ca-1-32)
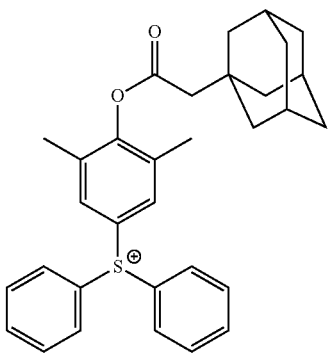
(ca-1-33)
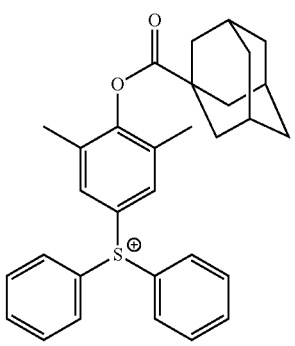
(ca-1-34)
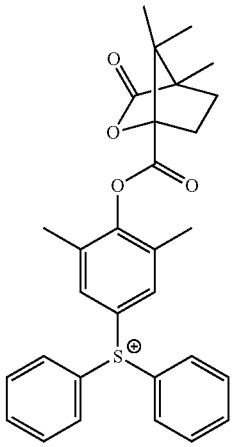
(ca-1-35)
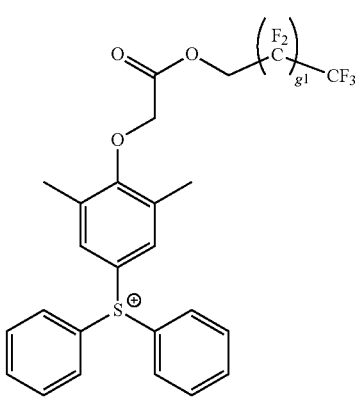

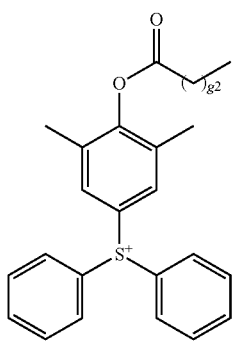
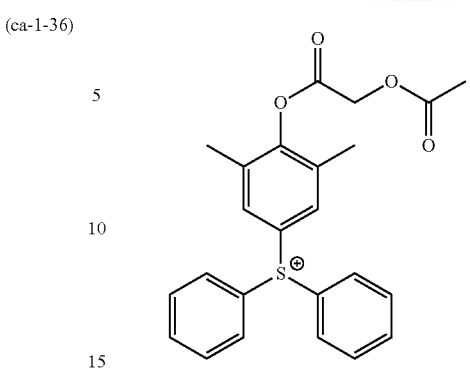

-continued
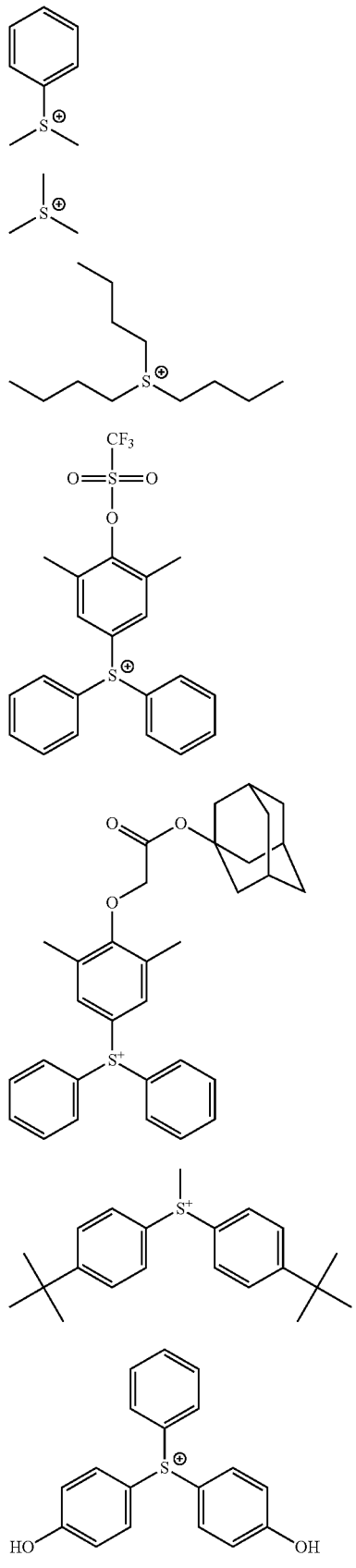
(ca-1-46)
(ca-1-47)
(ca-1-48)
(ca-1-49)
(ca-1-50)
(ca-1-51)
(ca-1-52)
In the formulae, g1, g2, and g3 represent the repetition number, g1 represents an integer of 1 to 5, g2 represents an integer of 0 to 20, and g3 represents an integer of 0 to 20.
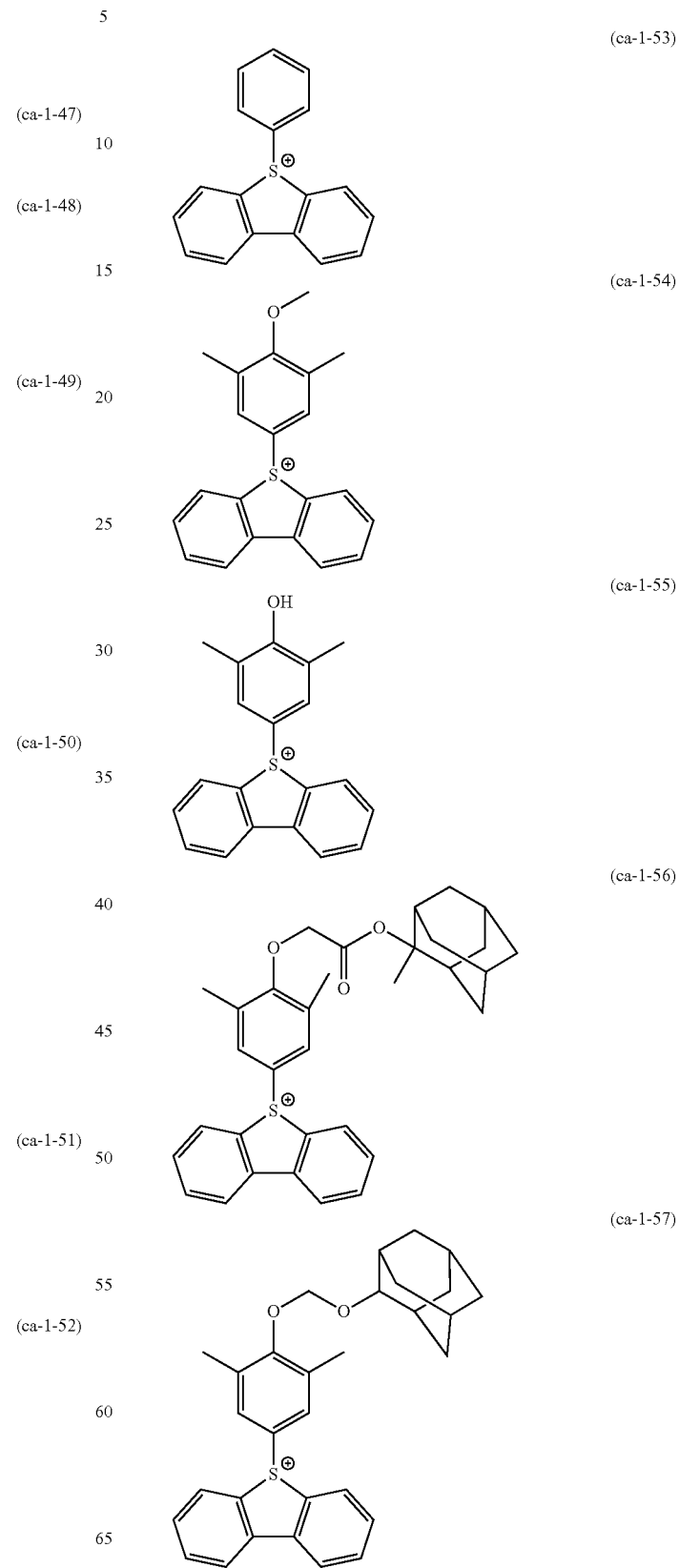
(ca-1-53)
(ca-1-54)
(ca-1-55)
(ca-1-56)
(ca-1-57)

(ca-1-58)
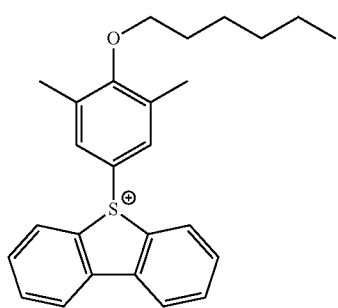
(ca-1-59)
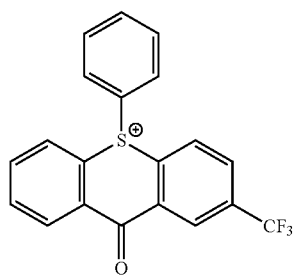
(ca-1-60)
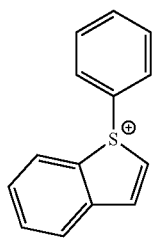
(ca-1-61)
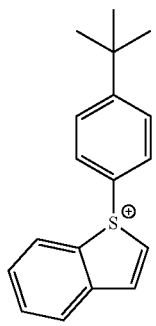
(ca-1-62)
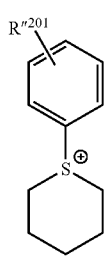
(ca-1-63)
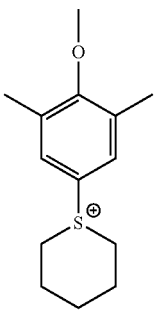
(ca-1-64)
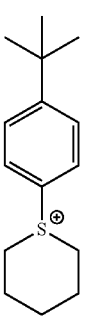
(ca-1-65)
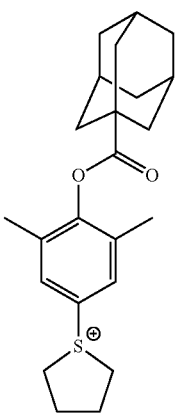
(ca-1-66)

(ca-1-67) 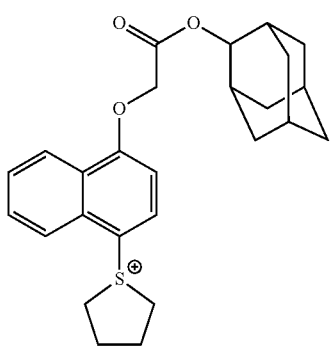

(ca-1-68) 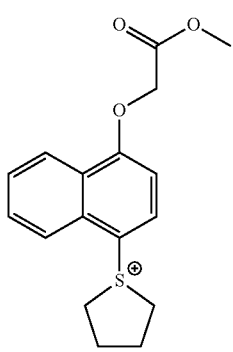

(ca-1-69) 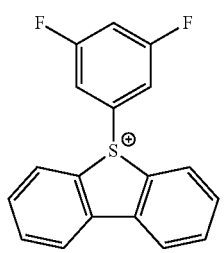

(ca-1-70) 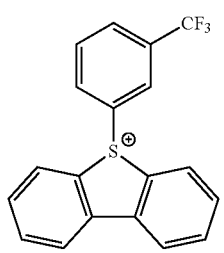

(ca-1-71) 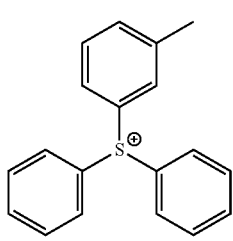

(ca-1-72) 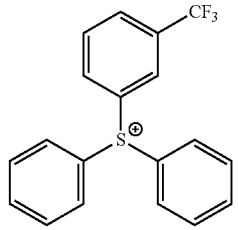

(ca-1-73) 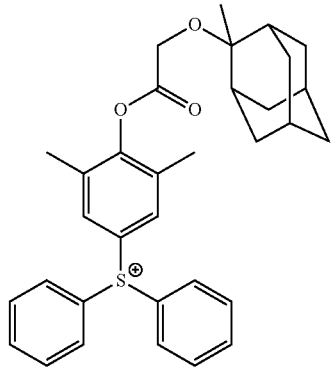

(ca-1-74) 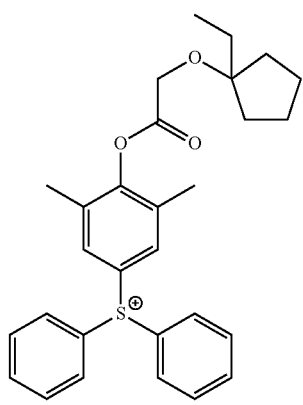

(ca-1-75) 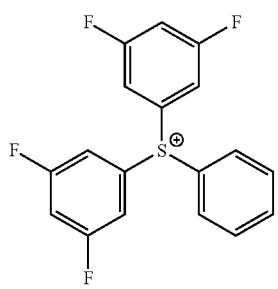

In the formulae, $R''^{201}$ represents a hydrogen atom or a substituent, and examples of the substituent are the same as those for the substituents which may be included in $R^{201}$ to $R^{207}$ and $R^{210}$ to $R^{212}$.

Specific suitable examples of the cation represented by Formula (ca-2) include a diphenyl iodonium cation and a bis(4-tert-butylphenyl)iodonium cation.

Specific suitable examples of the cation represented by Formula (ca-3) include cations respectively represented by Formulae (ca-3-1) to (ca-3-6).

(ca-3-1)
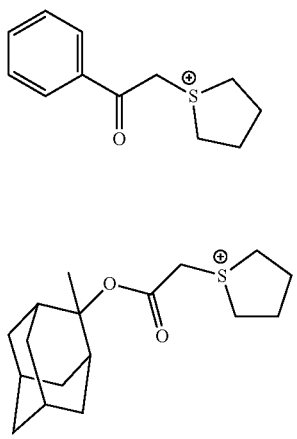
(ca-3-2)
(ca-3-5)
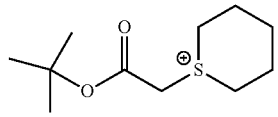
(ca-3-6)
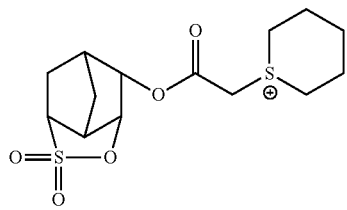
Specific suitable examples of the cation represented by Formula (ca-4) include cations respectively represented by Formulae (ca-4-1) to (ca-4-2).
(ca-4-1)
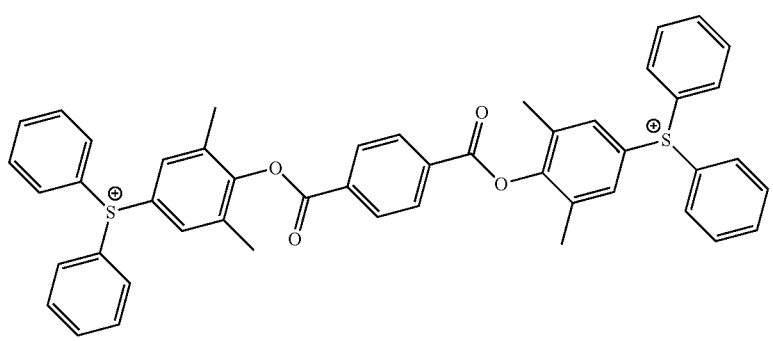
(ca-4-2)
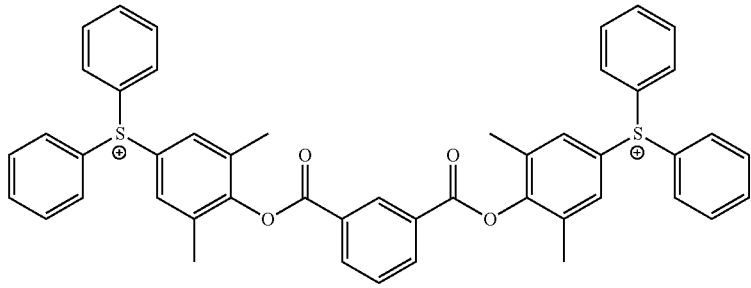
-continued
(ca-3-3)
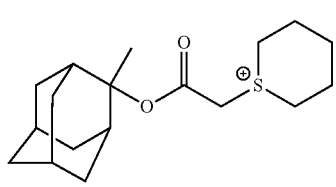
(ca-3-4)
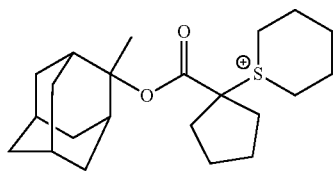
Specific suitable examples of the cation represented by Formula (ca-5) include cations respectively represented by Formulae (ca-5-1) and (ca-5-2).
(ca-5-1)
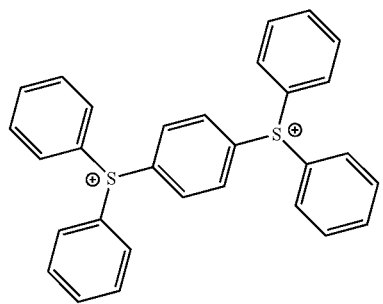

(ca-5-2)

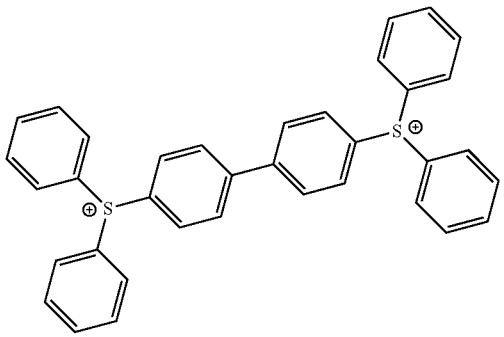

Among the examples, as the cationic moiety $((M^{m+})_{1/m})$ of the (B) component, a cation represented by Formula (ca-1) is preferable, and cations respectively represented by Formulae (ca-1-1) to (ca-1-75) are more preferable.

Specific suitable examples of the (B) component are shown below.

(b-1-1)

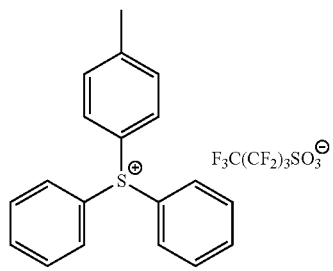

(b-1-2)

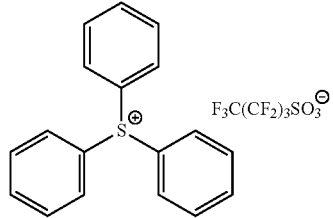

(b-1-3)

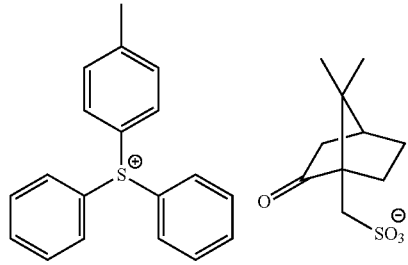

(b-1-4)

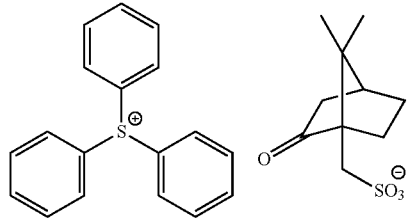

In the resist composition of the present embodiment, as the (B) component, one kind thereof may be used or combination of two or more kinds thereof may be used.

In the resist composition of the present embodiment, the content of the (B) component is preferably in a range of 1 to 40 parts by mass, more preferably in a range of 5 to 35 parts by mass, still more preferably in a range of 9 to 30 parts by mass, and particularly preferably in a range of 9 to 15 parts by mass with respect to 100 parts by mass of the (A) component.

In a case where the content of the (B) component is greater than or equal to the above-described preferable lower limit, lithography characteristics such as the sensitivity, the resolution performance, reduction in line width roughness (LWR), and the shape are further improved at the time of formation of a resist pattern. In a case where the content thereof is less than or equal to the above-described preferable upper limit, a uniform solution is likely to be obtained at the time of dissolution of each component of the resist composition in an organic solvent, and the storage stability of the resist composition is further improved.

<<(D) Component>>

It is preferable that the resist composition of the present embodiment further contain an acid diffusion control agent component (hereinafter, referred to as a "(D) component") that controls diffusion of an acid to be generated when exposed in the resist composition, in addition to the (A) component.

(D1) Component

It is preferable that the resist composition of the present embodiment contain, as the (D) component, a photodegradable base (D1) (hereinafter, referred to as a "(D1) component") that loses acid diffusion controllability by being decomposed when exposed.

In a case where the resist composition contains the (D1) component, the contrast between the exposed portion and the unexposed portion of the resist film can be improved during the formation of the resist pattern.

Among acid diffusion control agent components, the (D1) component is not particularly limited as long as the component loses the acid diffusion controllability by being decomposed when exposed, and one or more compounds selected from the group consisting of a compound represented by Formula (d1-1) (hereinafter, referred to as a "(d1-1) component"), a compound represented by Formula (d1-2) (hereinafter, referred to as a "(d1-2) component"), and a compound represented by Formula (d1-3) (hereinafter, referred to as a "(d1-3) component") are preferable.

The (d1-1) to (d1-3) components respectively act as a quencher in the unexposed portion of the resist film without acting as a quencher in the exposed portion of the resist film because the components lose the acid diffusion controllability (basicity) by being decomposed.

(d1-1)

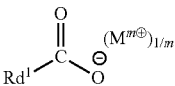

(d1-2)

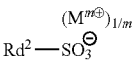

(d1-2)

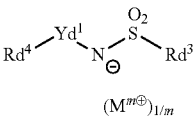

In the formulae, $Rd^1$ to $Rd^4$ each independently represents a cyclic group which may have a substituent, a chain alkyl group which may have a substituent, or a chain alkenyl group which may have a substituent, provided that a fluorine atom is not bonded to a carbon atom adjacent to the sulfur atom in $Rd^2$ in Formula (d1-2); $Yd^1$ represents a single bond or a divalent linking group; m represents an integer of 1 or greater, and $M^{m+}$'s each independently represents an m-valent organic cation.

{(d1-1) Component}
Anionic Moiety

In Formula (d1-1), $Rd^1$ represents a cyclic group which may have a substituent, a chain alkyl group which may have a substituent, or a chain alkenyl group which may have a substituent, and examples thereof are respectively the same as those for $R^{101}$ in Formula (b-1).

Among these, it is preferable that $Rd^1$ represent an aromatic hydrocarbon group which may have a substituent, an aliphatic cyclic group which may have a substituent, or a chain alkyl group which may have a substituent.

Examples of the substituents which may be included in these groups include a hydroxyl group, an oxo group, an alkyl group, an aryl group, a fluorine atom, a fluorinated alkyl group, lactone-containing cyclic groups respectively represented by Formulae (a2-r-1) to (a2-r-7), an ether bond, an ester bond, and a combination of these. In a case where an ether bond or an ester bond is included as a substituent, the ether bond or the ester bond may be present through an alkylene group. As the substituents in this case, linking groups respectively represented by Formulae (y-a1-1) to (y-a1-5) are preferable. Among these, a hydroxyl group is preferable as the substituent.

As the aromatic hydrocarbon group, a phenyl group or a naphthyl group is more preferable.

As the aliphatic cyclic group, a group formed by removing one or more hydrogen atoms from a polycycloalkane such as adamantane, norbornane, isobornane, tricyclodecane, or tetracyclododecane is more preferable.

The number of carbon atoms of the chain alkyl group is preferably in a range of 1 to 10, and specific examples of such an alkyl group include a linear alkyl group such as a methyl group, an ethyl group, a propyl group, a butyl group, a pentyl group, a hexyl group, a heptyl group, an octyl group, a nonyl group, or a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain alkyl group is a fluorinated alkyl group having a fluorine atom or a fluorinated alkyl group as a substituent, the number of carbon atoms of the fluorinated alkyl group is preferably in a range of 1 to 11, more preferably in a range of 1 to 8, and still more preferably in a range of 1 to 4. The fluorinated alkyl group may contain atoms other than the fluorine atom. Examples of the atoms other than the fluorine atom include an oxygen atom, a sulfur atom, and a nitrogen atom.

$Rd^1$ represents preferably a fluorinated alkyl group in which part or all of hydrogen atoms constituting the linear alkyl group are substituted with fluorine atoms and particularly preferably a fluorinated alkyl group (linear perfluoroalkyl group) in which all hydrogen atoms constituting the linear alkyl group are substituted with fluorine atoms.

Specific preferred examples of the anionic moiety of the (d1-1) component are shown below.

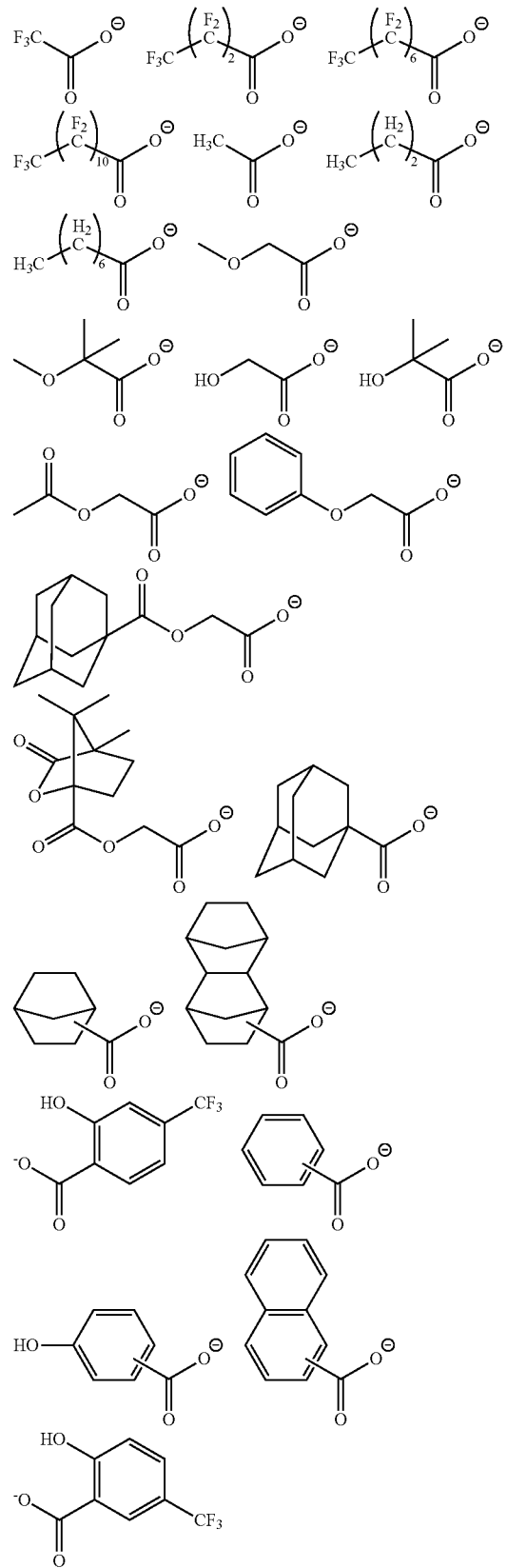

Cationic Moiety

In Formula (d1-1), $M^{m+}$ represents an m-valent organic cation.

Suitable examples of the organic cation as $M^{m+}$ are the same as those for the cations respectively represented by Formulae (ca-1) to (ca-4). Among these, the cation represented by Formula (ca-1) is more preferable, and the cations respectively represented by Formulae (ca-1-1) to (ca-1-75) are still more preferable.

As the (d1-1) component, one kind thereof may be used or the combination of two or more kinds thereof may be used.

{(d1-2) Component}
Anionic Moiety

In Formula (d1-2), $Rd^2$ represents a cyclic group which may have a substituent, a chain alkyl group which may have a substituent, or a chain alkenyl group which may have a substituent, and examples thereof are respectively the same as those for $R^{101}$ in Formula (b-1).

Here, a fluorine atom is not bonded (is not fluorine-substituted) to a carbon atom in $Rd^2$ adjacent to the sulfur atom. In this manner, the anion of the (d1-2) component becomes an appropriately weak acid anion and the quenching ability as the (D) component is improved.

As $Rd^2$, a chain alkyl group which may have a substituent or an aliphatic cyclic group which may have a substituent is preferable. The number of carbon atoms of the chain alkyl group is preferably in a range of 1 to 10 and more preferably in a range of 3 to 10. More preferred examples of the aliphatic cyclic group include a group (which may have a substituent) formed by removing one or more hydrogen atoms from adamantane, norbornane, isobornane, tricyclodecane, or tetracyclododecane; and a group formed by removing one or more hydrogen atoms from camphor.

The hydrocarbon group as $Rd^2$ may have a substituent, and examples of the substituent are the same as those for the substituent which may be included in the hydrocarbon group (such as an aromatic hydrocarbon group, an aliphatic cyclic group, or a chain alkyl group) as $Rd^1$ in Formula (d1-1).

Specific preferred examples of the anionic moiety of the (d1-2) component are shown below.

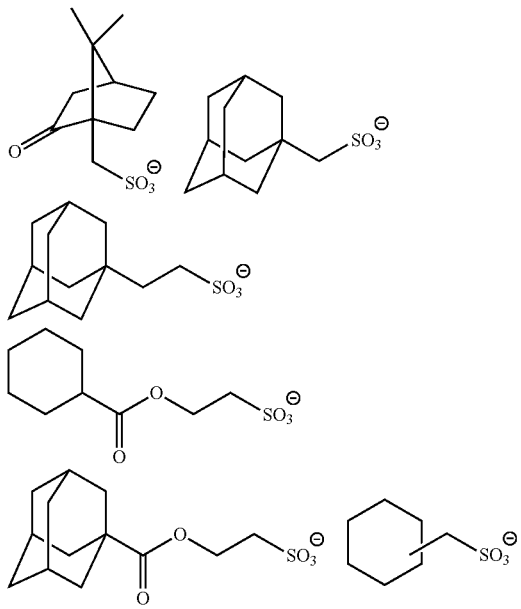

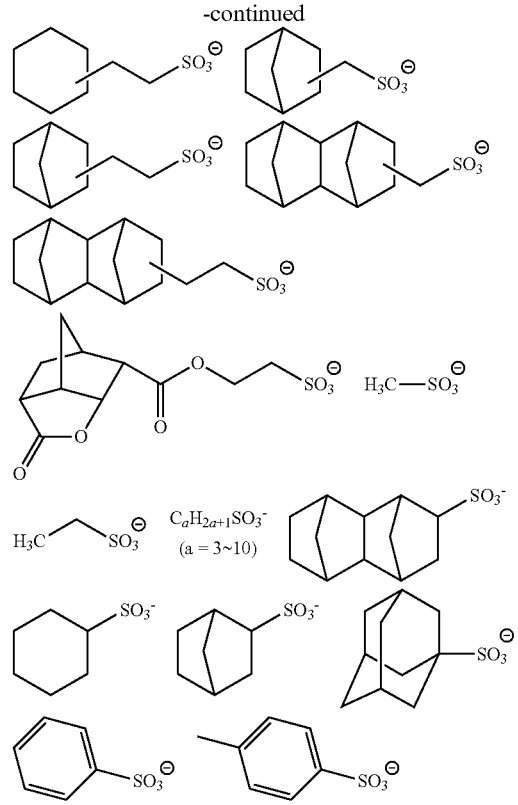

Cationic Moiety

In Formula (d1-2), $M^{m+}$ represents an m-valent organic cation and has the same definition as that for $M^{m+}$ in Formula (d1-1).

As the (d1-2) component, one kind thereof may be used or combination of two or more kinds thereof may be used.

{(d1-3) Component}
Anionic Moiety

In Formula (d1-3), $Rd^3$ represents a cyclic group which may have a substituent, a chain alkyl group which may have a substituent, or a chain alkenyl group which may have a substituent, and examples thereof are the same as those for $R^{101}$ in Formula (b-1) and a cyclic group having fluorine atoms, a chain alkyl group, or a chain alkenyl group is preferable. Among these, a fluorinated alkyl group is preferable, and the same fluorinated alkyl group as $Rd^1$ is more preferable.

In Formula (d1-3), $Rd^4$ represents a cyclic group which may have a substituent, a chain alkyl group which may have a substituent, or a chain alkenyl group which may have a substituent, and examples thereof are the same as those for $R^{101}$ in Formula (b-1).

Among these, an alkyl group which may have a substituent, an alkoxy group, an alkenyl group, and a cyclic group are preferable.

As the alkyl group represented by $Rd^4$, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. Some hydrogen atoms in the alkyl group as $Rd^4$ may be substituted with a hydroxyl group, a cyano group, and the like.

It is preferable that the alkoxy group as $Rd^4$ be an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group or an ethoxy group is more preferable.

Examples of the alkenyl group as $Rd^4$ are the same as those for $R^{101}$ in Formula (b-1). Among the examples, a vinyl group, a propenyl group (allyl group), a 1-methylpropenyl group, or a 2-methylpropenyl group is preferable. These groups may further have an alkyl group having 1 to 5 carbon atoms or a halogenated alkyl group having 1 to 5 carbon atoms as a substituent.

Examples of the cyclic group as $Rd^4$ are the same as those for $R^{101}$ in Formula (b-1). Among the examples, an alicyclic group formed by removing one or more hydrogen atoms from a cycloalkane such as cyclopentane, cyclohexane, adamantane, norbornane, isobornane, tricyclodecane, or tetracyclododecane; or an aromatic group such as a phenyl group or a naphthyl group is preferable. In a case where $Rd^4$ represents an alicyclic group, lithography characteristics become excellent because the resist composition is satisfactorily dissolved in an organic solvent. Further, in a case where $Rd^4$ represents an aromatic group, the resist composition has excellent light absorption efficiency and the sensitivity or lithography characteristics become excellent.

In Formula (d1-3), $Yd^1$ represents a single bond or a divalent linking group.

The divalent linking group as $Yd^1$ is not particularly limited, and examples thereof include a divalent hydrocarbon group (such as an aliphatic hydrocarbon group or an aromatic hydrocarbon group) which may have a substituent and a divalent linking group having heteroatoms. Examples thereof are respectively the same as those for the divalent linking group having heteroatoms as $Ya^{x1}$ in Formula (a10-u1).

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Specific preferred examples of the anionic moiety of the (d1-3) component are shown below.

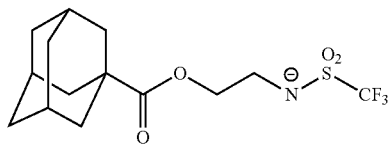

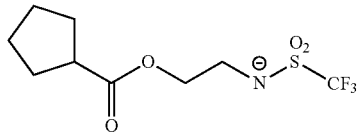

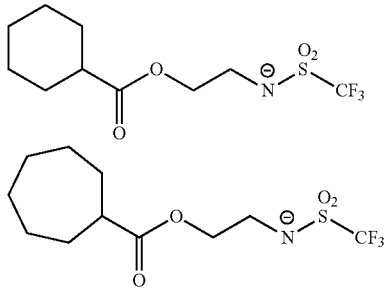

-continued

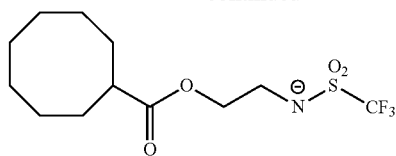

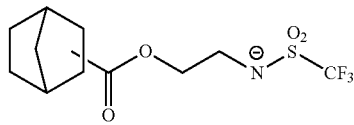

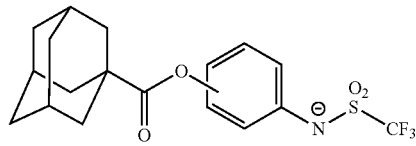

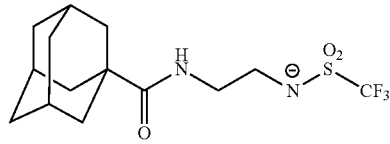

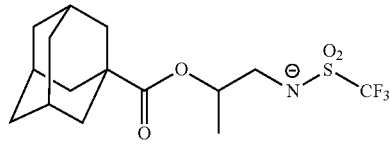

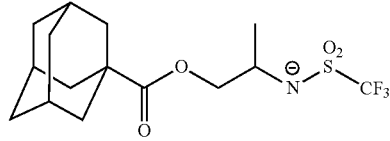

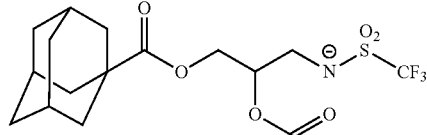

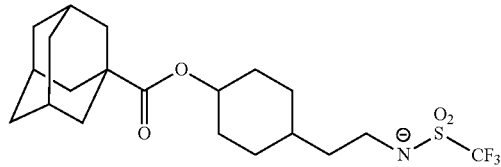

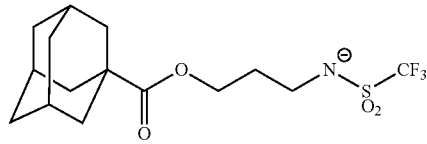

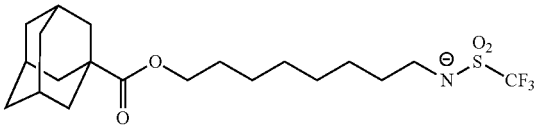

-continued

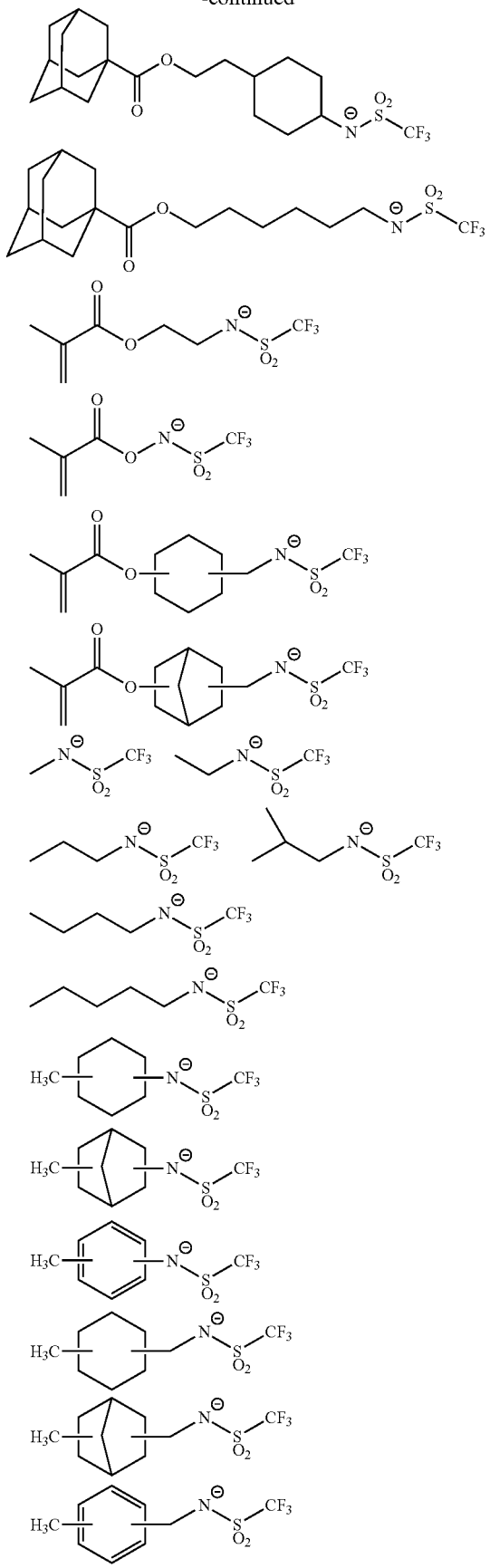

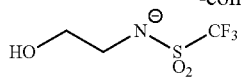

Cationic Moiety

In Formula (d1-3), $M^{m+}$ represents an m-valent organic cation and has the same definition as that for $M^{m+}$ in Formula (d1-1).

As the (d1-3) component, one kind thereof may be used, or combination of two or more kinds thereof may be used.

As the (D1) component, only any one component from among the above-described (d1-1) to (d1-3) components may be used or a combination of two or more kinds thereof may be used.

In a case where the resist composition contains the (D1) component, the content of the (D1) component in the resist composition is preferably in a range of 0.5 parts to 10 parts by mass, more preferably in a range of 0.5 to 8 parts by mass, and still more preferably in a range of 1 to 8 parts by mass with respect to 100 parts by mass of the (A) component.

In a case where the content of the (D1) component is greater than or equal to the above-described preferable lower limit, particularly excellent lithography characteristics and a particularly excellent resist pattern shape are easily obtained. In addition, in a case where the content thereof is less than or equal to the above-described preferable upper limit, the sensitivity can be satisfactorily maintained and the throughput becomes excellent.

(D2) Component

The resist composition of the present embodiment may contain, as the (D) component, a nitrogen-containing organic compound component (hereinafter, referred to as a "(D2) component) that does not correspond to the (D1) component.

The (D2) component is not particularly limited as long as the component acts as an acid diffusion control agent and does not correspond to the (D1) component and may be optionally selected from known ones. Among known ones, an aliphatic amine is preferable. Among examples of the aliphatic amine, a secondary aliphatic amine or a tertiary aliphatic amine is more preferable.

The aliphatic amine indicates an amine that contains one or more aliphatic groups, and the number of carbon atoms of the aliphatic group is preferably in a range of 1 to 12.

Examples of the aliphatic amine include an amine (alkylamine or alkyl alcohol amine) in which at least one hydrogen atom of ammonia $NH_3$ is substituted with an alkyl group having 12 or less carbon atoms or a hydroxyalkyl group; and a cyclic amine.

Specific examples of the alkylamine and the alkyl alcohol amine include monoalkylamine such as n-hexylamine, n-heptylamine, n-octylamine, n-nonylamine, or n-decylamine; dialkylamine such as diethylamine, di-n-propylamine, di-n-heptylamine, di-n-octylamine, or dicyclohexylamine; trialkylamine such as trimethylamine, triethylamine, tri-n-propylamine, tri-n-butylamine, tri-n-pentylamine (triamylamine), tri-n-hexylamine, tri-n-heptylamine, tri-n-octylamine, tri-n-nonylamine, tri-n-decylamine, or tri-n-dodecylamine; and alkyl alcohol amine such as diethanolamine, triethanolamine, diisopropanolamine, triisopropanolamine, di-n-octanolamine, or tri-n-octanolamine. Among these, trialkylamine having 5 to 10 carbon atoms is more preferable, and tri-n-pentylamine or tri-n-octylamine is particularly preferable.

Examples of the cyclic amine include a heterocyclic compound having nitrogen atoms as a heteroatom. The heterocyclic compound may be monocyclic (aliphatic monocyclic amine) or polycyclic (aliphatic polycyclic amine).

Specific examples of the aliphatic monocyclic amine include piperidine and piperazine.

The number of carbon atoms of the aliphatic polycyclic amine is preferably in a range of 6 to 10, and specific examples of such an aliphatic polycyclic amine include 1,5-diazabicyclo[4.3.0]-5-nonene, 1,8-diazabicyclo[5.4.0]-7-undecene, hexamethylenetetramine, and 1,4-diazabicyclo[2.2.2]octane.

Other examples of the aliphatic amine include tris(2-methoxymethoxyethyl)amine, tris {2-(2-methoxyethoxy) ethyl}amine, tris {2-(2-methoxyethoxymethoxy) ethyl}amine, tris{2-(1-methoxyethoxy)ethyl}amine, tris {2-(1-ethoxyethoxy)ethyl}amine, tris {2-(1-ethoxypropoxy) ethyl}amine, tris[2-{2-(2-hydroxyethoxy)ethoxy}ethyl] amine, and triethanolamine triacetate. Among these, triethanolamine triacetate is preferable.

Further, an aromatic amine may be used as the (D2) component.

Examples of the aromatic amine include 4-dimethylaminopyridine, pyrrole, indole, pyrazole, imidazole, and derivatives of these, tribenzylamine, 2,6-diisopropylaniline, and N-tert-butoxycarbonyl pyrrolidine.

As the (D2) component, one kind thereof may be used, or combination of two or more kinds thereof may be used.

In a case where the resist composition of the present embodiment contains the (D2) component, the content of the (D2) component in the resist composition is preferably in a range of 0.01 to 5 parts by mass with respect to 100 parts by mass of the (A) component.

In a case where the content of the (D2) component is set to be in the above-described preferable range, the resist pattern shape, post-exposure temporal stability, and the like are improved.

<<(C) Component>>

The resist composition of the present embodiment may further contain a crosslinking component (hereinafter, also referred to as a (C) component) in addition to the (A) component. Here, in a case where the content of the (C) component is increased, since there is a concern that the lithographic characteristics of the resist composition such as the sensitivity, the resolution, and the roughness are degraded due to the plastic effects of the (C) component, it is preferable that the resist composition of the present embodiment not contain the (C) component. Since the resist composition of the present embodiment contains the (A1) component having the constitutional unit (a0) with crosslinkable properties, crosslinking occurs between the (A1) components due to an action of an acid generated when the resist film is exposed even in a case where the resist composition does not contain the (C) component.

The (C) component is not particularly limited and can be optionally selected from crosslinking agents used in chemically amplified negative type resist compositions known in the related art and then used.

Examples of the (C) component include a cyclic hydrocarbon containing one or both of a hydroxy group and a hydroxyalkyl group and an oxygen-containing derivative thereof, such as 2,3-dihydroxy-5-hydroxymethylnorbornane, 2-hydroxy-5,6-bis(hydroxymethyl)norbornane, cyclohexane dimethanol, 4,4'-biphenyl dimethanol, 3,4,8 (or 9)-trihydroxy tricyclodecane, 2-methyl-2-adamantanol, 1,4-dioxane-2,3-diol, and 1,3,5-trihydroxycyclohexane.

Further, examples thereof include a compound obtained by reacting formaldehyde or formaldehyde and lower alcohol with an amino group-containing compound such as melamine, acetoguanamine, benzoguanamine, urea, ethylene urea, propylene urea, or glycoluril, and substituting a hydrogen atom of the amino group with a hydroxymethyl group or a lower alkoxymethyl group; and a compound containing an epoxy group.

Among these, a crosslinking agent obtained by using melamine is referred to as a melamine-based crosslinking agent, a crosslinking agent obtained by using urea is referred to as a urea-based crosslinking agent, a crosslinking agent obtained by using alkylene urea such as ethylene urea or propylene urea is referred to as an alkylene urea-based crosslinking agent, a crosslinking agent obtained by using glycoluril is referred to as a glycoluril-based crosslinking agent, and a crosslinking agent obtained by using a compound containing an epoxy group is referred to as an epoxy-based crosslinking agent.

As the (C) component, at least one selected from the group consisting of a melamine-based crosslinking agent, a urea-based crosslinking agent, an alkylene urea-based crosslinking agent, a glycoluril-based crosslinking agent, and an epoxy-based crosslinking agent is preferable and a glycoluril-based crosslinking agent is particularly preferable.

Examples of the melamine-based crosslinking agent include a compound obtained by reacting melamine with formaldehyde and substituting a hydrogen atom of an amino group with a hydroxymethyl group; and a compound obtained by reacting melamine, formaldehyde, and lower alcohol and substituting a hydrogen atom of an amino group with a lower alkoxymethyl group. Specific examples thereof include hexamethoxy methyl melamine, hexaethoxy methyl melamine, hexapropoxy methyl melamine, and hexabutoxy butyl melamine. Among these, hexamethoxy methyl melamine is preferable.

Examples of the urea-based crosslinking agent include a compound obtained by reacting urea with formaldehyde and substituting a hydrogen atom of an amino group with a hydroxymethyl group; and a compound obtained by reacting urea, formaldehyde, and lower alcohol and substituting a hydrogen atom of an amino group with a lower alkoxymethyl group. Specific examples thereof include bismethoxy methyl urea, bisethoxy methyl urea, bispropoxy methyl urea, and bisbutoxy methyl urea. Among these, bismethoxy methyl urea is preferable.

Examples of the alkylene urea-based crosslinking agent include a compound represented by Formula (C-1).

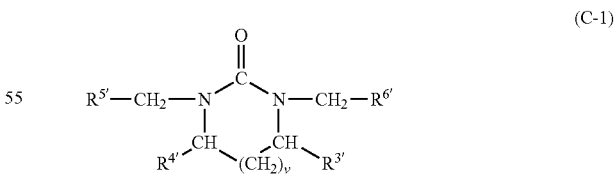

(C-1)

In the formula, $R^{5'}$ and $R^{6'}$ each independently represents a hydroxyl group or a lower alkoxy group; $R^{3'}$ and $R^{4'}$ each independently represents a hydrogen atom, a hydroxyl group, or a lower alkoxy group; and v represents an integer of 0 to 2.

In a case where $R^{5'}$ and $R^{6'}$ represent a lower alkoxy group, an alkoxy group having 1 to 4 carbon atoms is preferable and the alkoxy group may be linear or branched.

$R^{5\prime}$ and $R^{6\prime}$ may be the same as or different from each other and it is more preferable that $R^{5\prime}$ and $R^{6\prime}$ be the same as each other.

In a case where $R^{3\prime}$ and $R^{4\prime}$ represent a lower alkoxy group, an alkoxy group having 1 to 4 carbon atoms is preferable and the alkoxy group may be linear or branched. $R^{3\prime}$ and $R^{4\prime}$ may be the same as or different from each other and it is more preferable that $R^{3\prime}$ and $R^{4\prime}$ be the same as each other.

v represents an integer of 0 to 2 and preferably 0 or 1.

As the alkylene urea-based crosslinking agent, a compound in which v represents 0 (ethylene urea-based crosslinking agent) and/or a compound in which v represents 1 (propylene urea-based crosslinking agent) is particularly preferable.

The compound represented by Formula (C-1) can be obtained by carrying out a condensation reaction between alkylene urea and formalin or by reacting the product thereof with a lower alcohol.

Specific examples of the alkylene urea-based crosslinking agent include an ethylene urea-based crosslinking agent such as mono- and/or dihydroxymethylated ethylene urea, mono- and/or dimethoxymethylated ethylene urea, mono- and/or diethoxymethylated ethylene urea, mono- and/or dipropoxymethylated ethylene urea, or mono- and/or dibutoxymethylated ethylene urea; a propylene urea-based crosslinking agent such as mono- and/or dihydroxymethylated propylene urea, mono- and/or dimethoxymethylated propylene urea, mono- and/or diethoxymethylated propylene urea, mono- and/or dipropoxymethylated propylene urea, or mono- and/or dibutoxymethylated propylene urea; 1,3-di(methoxymethyl)-4,5-dihydroxy-2-imidazolidinone, and 1,3-di(methoxymethyl)-4,5-dimethoxy-2-imidazolidinone.

Examples of the glycoluril-based crosslinking agent include a glycoluril derivative in which the N-position is substituted with one or both of a hydroxyalkyl group and an alkoxyalkyl group having 1 to 4 carbon atoms. Such a glycoluril derivative can be obtained by carrying out a condensation reaction between glycoluril and formalin and reacting the product thereof with a lower alcohol.

Specific examples of the glycoluril-based crosslinking agent include mono-, di-, tri- and/or tetrahydroxymethylated glycoluril; mono-, di-, tri-, and/or tetramethoxymethylated glycoluril; mono-, di-, tri-, and/or tetraethoxymethylated glycoluril; mono-, di-, tri-, and/or tetrapropoxymethylated glycoluril; and mono-, di-, tri-, and/or tetrabutoxymethylated glycoluril.

The epoxy-based crosslinking agent is not particularly limited as long as an epoxy group is contained, and an optional one can be selected and used. Among examples, an agent containing two or more epoxy groups is preferable. In a case where two or more epoxy groups are contained, crosslinking reactivity is improved.

The number of epoxy groups is preferably 2 or more, more preferably in a range of 2 to 4, and most preferably 2.

Suitable examples of the epoxy-based crosslinking agent are shown below.

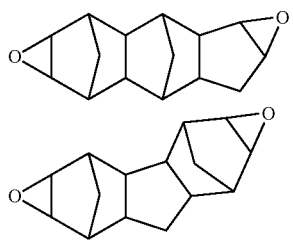

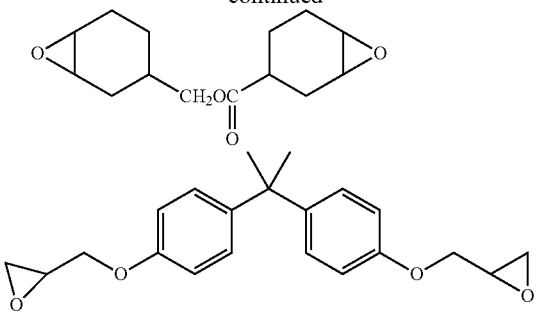

As the (C) component, one kind thereof may be used, or combination of two or more kinds thereof may be used.

In a case where the resist composition contains the (C) component, the content of the (C) component is preferably in a range of 1 to 50 parts by mass, more preferably in a range of 3 to 30 parts by mass, still more preferably in a range of 3 to 20 parts by mass, and most preferably in a range of 5 to 15 parts by mass with respect to 100 parts by mass of the (A) component.

In a case where the content of the (C) component is greater than or equal to the lower limit, crosslinking formation sufficiently proceeds, and resolution performance and lithography characteristics are further improved. Further, an excellent resist pattern with little swelling is obtained. Moreover, in a case where the content is less than or equal to the upper limit, the storage stability of the resist composition is excellent and deterioration of the sensitivity with time is likely to be suppressed.

<<(E) Component>>

The resist composition of the present embodiment may contain at least one compound (E) (hereinafter, referred to as an (E) component) selected from the group consisting of organic carboxylic acid, oxo acid of phosphorus, and a derivative thereof as an optional component for the purpose of preventing deterioration of sensitivity and improving the resist pattern shape and the post-exposure temporal stability.

Suitable examples of the organic carboxylic acid include acetic acid, malonic acid, citric acid, malic acid, succinic acid, benzoic acid, and salicylic acid.

Examples of the oxo acid of phosphorus include phosphoric acid, phosphonic acid, and phosphinic acid. Among these, phosphonic acid is particularly preferable.

Examples of the derivative of the oxo acid of phosphorus include an ester in which a hydrogen atom of the oxo acid is substituted with a hydrocarbon group; and examples of the hydrocarbon group include an alkyl group having 1 to 5 carbon atoms and an aryl group having 6 to 15 carbon atoms.

Examples of the derivative of phosphoric acid include phosphoric acid ester such as phosphoric acid di-n-butyl ester or phosphoric acid diphenyl ester.

Examples of the derivative of phosphonic acid include phosphonic acid ester such as phosphonic acid dimethyl ester, phosphonic acid-di-n-butyl ester, phenylphosphonic acid, phosphonic acid diphenyl ester, or phosphonic acid dibenzyl ester.

Examples of the derivative of phosphinic acid include phosphinic acid ester and phenylphosphinic acid.

In the resist composition of the present embodiment, as the (E) component, one kind thereof may be used, or combination of two or more kinds thereof may be used.

In a case where the resist composition contains the (E) component, the content of the (E) component to be used is preferably in a range of 0.01 to 5 parts by mass with respect to 100 parts by mass of the (A) component.

<<(F) Component>>

The resist composition of the present embodiment may contain a fluorine additive component (hereinafter, referred to as an (F) component) in order to impart water repellency to the resist film.

As the (F) component, for example, fluorine-containing polymer compounds described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the (F) component include a polymer having a constitutional unit (f1) represented by Formula (f1-1). The constitutional unit (f1) exhibits base dissociability. The (F) component having the constitutional unit (f1) exhibits degradability with respect to an alkali developer.

Suitable examples of the polymer include a polymer (homopolymer) formed of only the constitutional unit (f1) represented by Formula (f1-1); a copolymer of the constitutional unit (f1) and a constitutional unit derived from acrylic acid or methacrylic acid; and a copolymer of the constitutional unit (f1) and a constitutional unit containing a lactone-containing cyclic group.

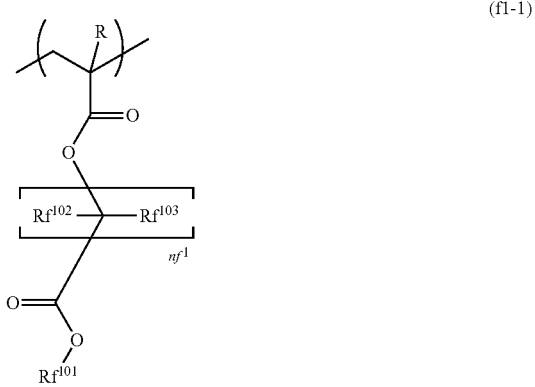

(f1-1)

In the formula, R represents a hydrogen atom, an alkyl group having 1 to 5 carbon atoms, or a halogenated alkyl group having 1 to 5 carbon atoms; $Rf^{102}$ and $Rf^{103}$ each independently represents a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other; $nf^1$ represents an integer of 1 to 5; and $Rf^{101}$ represents an organic group having fluorine atoms.

In Formula (f1-1), as the alkyl group having 1 to 5 carbon atoms as R bonded to the carbon atom at the α-position, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group formed by some or all hydrogen atoms in the alkyl group having 1 to 5 carbon atoms being substituted with halogen atoms. Examples of the halogen atoms include a fluorine atom, a chlorine atom, a bromine atom, and an iodine atom. Among these, a fluorine atom is particularly preferable.

R represents preferably a hydrogen atom, an alkyl group having 1 to 5 carbon atoms, or a fluorinated alkyl group having 1 to 5 carbon atoms and most preferably a hydrogen atom or a methyl group in terms of industrial availability.

In Formula (f1-1), examples of the halogen atom as $Rf^{102}$ and $Rf^{103}$ include a fluorine atom, a chlorine atom, a bromine atom, and an iodine atom. Among these, a fluorine atom is particularly preferable.

Examples of the alkyl group having 1 to 5 carbon atoms as $Rf^{102}$ and $Rf^{103}$ are the same as those for the alkyl group having 1 to 5 carbon atoms as R. Among the examples, a methyl group or an ethyl group is preferable.

Specific examples of the halogenated alkyl group having 1 to 5 carbon atoms as $Rf^{102}$ and $Rf^{103}$ include a group formed by part or all of hydrogen atoms of an alkyl group having 1 to 5 carbon atoms being substituted with a halogen atom.

Examples of the halogen atom include a fluorine atom, a chlorine atom, a bromine atom, and an iodine atom. Among these, a fluorine atom is particularly preferable.

Among these, as $Rf^{102}$ and $Rf^{103}$, a hydrogen atom, a fluorine atom, or an alkyl group having 1 to 5 carbon atoms is preferable; and a hydrogen atom, a fluorine atom, a methyl group, or an ethyl group is more preferable.

In Formula (f1-1), $nf^1$ represents an integer of 1 to 5, preferably an integer of 1 to 3, and more preferably 1 or 2.

In Formula (f1-1), $Rf^{101}$ represents an organic group having a fluorine atom and preferably a hydrocarbon group having a fluorine atom.

The hydrocarbon group having a fluorine atom may be linear, branched, or cyclic, and the number of carbon atoms is preferably in a range of 1 to 20, more preferably in a range of 1 to 15, and particularly preferably in a range of 1 to 10.

In the hydrocarbon group having a fluorine atom, it is preferable that 25% or greater of hydrogen atoms in the hydrocarbon group be fluorinated, more preferable that 50% or greater of hydrogen atoms therein be fluorinated, and particularly preferable that 60% or greater of hydrogen atoms therein be fluorinated from the viewpoint that the hydrophobicity of the resist film is increased.

Among the examples, $Rf^{101}$ represents more preferably a fluorinated hydrocarbon group having 1 to 6 carbon atoms and particularly preferably a trifluoromethyl group, —$CH_2$—$CF_3$, —$CH_2$—$CF_2$—$CF_3$, —$CH(CF_3)_2$, —$CH_2$—$CH_2$—$CF_3$, or —$CH_2$—$CH_2$—$CF_2$—$CF_2$—$CF_2$—$CF_3$.

The weight-average molecular weight (Mw) (in terms of polystyrene according to gel permeation chromatography) of the (F) component is preferably in a range of 1000 to 50000, more preferably in a range of 5000 to 40000, and particularly preferably in a range of 10000 to 30000. In a case where the Mw of the (F) component is less than or equal to the upper limit of the above-described preferable range, the solubility of the resist composition in a resist solvent is sufficient enough to be used as a resist. Further, in a case where the Mw thereof is greater than or equal to the lower limit of the above-described preferable range, the dry etching resistance or the cross-sectional shape of the resist pattern becomes excellent.

The dispersity (Mw/Mn) of the (F) component is preferably in a range of 1.0 to 5.0, more preferably in a range of 1.0 to 3.0, and particularly preferably in a range of 1.2 to 2.5.

In the resist composition of the present embodiment, as the (F) component, one kind thereof may be used, or combination of two or more kinds thereof may be used.

In a case where the resist composition contains the (F) component, the content of the (F) component to be used is preferably in a range of 0.5 to 10 parts by mass with respect to 100 parts by mass of the (A) component.

<<(S) Component>>

The resist composition of the present embodiment can be produced by dissolving a resist material in an organic solvent component (hereinafter, also referred to as an "(S) component").

The (S) component is not particularly limited as long as each component to be used is dissolved to obtain a uniform solution and can be optionally selected from among components known as solvents of a chemically amplified resist composition in the related art.

Examples of the (S) component include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, and dipropylene glycol; a compound having an ester bond such as ethylene glycol monoacetate, diethylene glycol monoacetate, propylene glycol monoacetate, or dipropylene glycol monoacetate; derivatives of polyhydric alcohols, for example, a compound having an ether bond such as monoalkyl ether or monophenyl ether such as monomethyl ether, monoethyl ether, monopropyl ether, or monobutyl ether of the polyhydric alcohols or the compound having an ester bond [among these, propylene glycol monomethyl ether acetate (PGMEA) or propylene glycol monomethyl ether (PGME) is preferable]; cyclic ethers such as dioxane; esters such as methyl lactate, ethyl lactate (EL), methyl acetate, ethyl acetate, butyl acetate, methyl pyruvate, ethyl pyruvate, methyl methoxy propionate, and ethyl ethoxy propionate; an aromatic organic solvent such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene, or mesitylene; and dimethyl sulfoxide (DMSO).

In the resist composition of the present embodiment, as the (S) component, one kind thereof may be used, or a mixed solvent containing two or more kinds thereof may be used. Among these, PGMEA, PGME, γ-butyrolactone, EL, or cyclohexanone and a mixed solvent formed by mixing two or more selected from these are preferable.

The amount of the (S) component to be used is not particularly limited and appropriately set according to the thickness of the coated film at a concentration suitable for coating a substrate or the like with the resist composition. The (S) component is typically used such that the concentration of the solid content in the resist composition is in a range of 1% to 20% by mass and preferably in a range of 2% to 15% by mass.

The resist composition of the present embodiment may further contain additives having miscibility as desired. For example, an additional resin, a surfactant, a dissolution inhibitor, a plasticizer, a stabilizer, a colorant, an antihalation agent, a dye, and the like may be added to the resist composition as appropriate in order to improve the performance of the resist film.

The above-described resist composition of the present embodiment contains the polymer compound ((A1) component) that has the constitutional unit (constitutional unit (a0) derived from a compound represented by Formula (a0-1) and a constitutional unit (constitutional unit (a10)) derived from a compound represented by Formula (a10-1) and does not have a constitutional unit represented by Formula (1).

In manufacture of a semiconductor element or a liquid crystal display element, pattern miniaturization has been rapidly promoted. Accordingly, there is a demand for a resist material having excellent resolution performance. Meanwhile, in a chemically amplified resist composition of the related art which contains a crosslinking agent component, improvement of the crosslinking efficiency of an exposed portion in a resist film has been attempted by increasing the amount of the crosslinking agent component or the acid generator component. However, in a case where the amount of the crosslinking agent component or the acid generator component is increased, since the solubility of the unexposed portion of the resist film in a developer is decreased, the development contrast would be reduced and resolution performance would be insufficient. Further, in a case where the amount of the crosslinking agent component or the acid generator component is excessive, the resist film is unlikely to be formed. Further, in a case where the amount of the crosslinking agent component is increased, the lithography characteristics such as the sensitivity, the resolution, and the roughness are deteriorated due to the plastic effects of the crosslinking agent component.

In the resist composition of the present embodiment, the crosslinking efficiency of the exposed portion in the resist film is improved due to introduction of the constitutional unit (a0) containing a crosslinking group, even in a case where the resist composition does not contain the crosslinking agent component. Therefore, since the content of the crosslinking agent component in the resist composition of the present embodiment can be reduced or set to be zero, the adverse effects from the crosslinking agent component can be eliminated. In this manner, a resist pattern with improved lithographic characteristics such as the sensitivity, the resolution, and the roughness (LWR) can be formed.

The constitutional unit (a0) contains a crosslinking group with higher hydrophilicity and reactivity than those of a crosslinking group which has been used in the related art. Consequently, in the resist composition containing a base material component having the constitutional unit (a0), a resist pattern with further improved lithography characteristics such as the sensitivity, the resolution, and the roughness (LWR), than those of a resist composition that contains a base material component having a crosslinking group of the related art, can be formed.

The resist composition of the present embodiment does not have a constitutional unit represented by Formula (1). Accordingly, the electric characteristics or the reliability of a semiconductor element or a liquid crystal display element to be manufactured as a final product is increased by suppressing the content of the metal in the resist composition to be low. Further, high integration is easily achieved.

(Method of Forming Resist Pattern)

A method of forming a resist pattern according to a second embodiment of the present invention includes a step of forming a resist film on a support using the resist composition of the embodiment; a step of exposing the resist film; and a step of performing alkali development on the exposed resist film to form a resist pattern.

According to an embodiment of such a method of forming a resist pattern, a method of forming a resist pattern described below is exemplified.

First, the support is coated with the above-described resist composition of the embodiment using a spinner or the like, and a bake (post-apply bake (PAB)) treatment is performed under a temperature condition of 80° C. to 150° C. for 40 to 120 seconds and preferably for 50 to 90 seconds, thereby forming a resist film.

Next, the resist film is exposed through a mask (mask pattern) on which a predetermined pattern is formed or selectively exposed by drawing or the like through direct irradiation with electron beams without using a mask pattern, using an exposure device such as an ArF exposure device, a KrF exposure device, an electron beam drawing device, or an EUV exposure device. Thereafter, a bake (post-exposure bake (PEB)) treatment is performed under a temperature condition of 80° C. to 150° C. for 40 to 120 seconds and preferably for 50 to 90 seconds.

Next, the resist film is developed. The development may be alkali development or organic solvent development, but alkali development is preferable. An alkali development treatment is performed using an alkali developer. The organic solvent development treatment is performed using a developer (organic developer) that contains an organic solvent.

It is preferable that a rinse treatment be performed after the development treatment. It is preferable to perform a water rinse treatment using pure water as the rinse treatment after the alkali development. It is preferable that the rinse treatment after the organic solvent development be performed using a rinse liquid containing an organic solvent. Further, the developer or the rinse liquid adhering onto the resist pattern may be subjected to a removal treatment using a supercritical fluid after the development or the rinse treatment.

Next, drying is performed after the treatment of alkali development or organic solvent development or the rinse treatment. Further, a bake treatment (post-bake) may be performed after the development treatment in some cases.

In this manner, a resist pattern can be formed.

The support is not particularly limited, and a known one of the related art can be used and examples of the known support include a substrate for an electronic component and a support on which a predetermined wiring pattern is formed. More specific examples thereof include a silicon wafer, a substrate made of a metal such as copper, chromium, iron, or aluminum, and a glass substrate. As the material for the wiring pattern, for example, copper, aluminum, nickel, or gold can be used.

Further, the support may be such a substrate described above, on which an inorganic and/or organic film is provided. Examples of the inorganic film include an inorganic antireflection film (inorganic BARC). Examples of the organic film include organic films such as an organic antireflection film (organic BARC) and a lower organic film used for a multilayer resist method.

Here, the multilayer resist method is a method of providing an organic film (lower organic film) formed of at least one layer and a resist film (upper resist film) formed of at least one layer on a substrate and performing patterning on the lower organic film using a resist pattern formed on the upper resist film as a mask, and a pattern with a high aspect ratio can be formed using this method. In other words, according to the multilayer resist method, since a desired thickness can be ensured using the lower organic film, the thickness of the resist film can be reduced and thus a fine pattern with a high aspect ratio can be formed.

The multilayer resist method is classified into a method (two-layer resist method) of forming a two-layer structure having an upper resist film and a lower organic film and a method (three-layer resist method) of forming a multilayer structure formed of three or more layers by proving one or more intermediate layers (metal thin film or the like) between an upper resist film and a lower organic film.

The wavelength used for exposure is not particularly limited, and the exposure can be performed using radiation such as an ArF excimer laser, a KrF excimer laser, an $F_2$ excimer laser, extreme ultraviolet rays (EUV), vacuum ultraviolet rays (VUV), electron beams (EB), X-rays, and soft X-rays. The resist composition of the present embodiment is highly useful for a KrF excimer laser, an ArF excimer laser, EB, or EUV.

The method of exposing the resist film may be performed through typical exposure (dry exposure) performed in air or inert gas such as nitrogen or liquid immersion exposure (liquid immersion lithography).

The liquid immersion exposure is an exposure method of filling a space between a resist film and a lens disposed in the lowermost position of an exposure device with a solvent (liquid immersion medium) having a refractive index larger than the refractive index of air in advance and performing exposure (immersion exposure) in this state.

As the liquid immersion medium, a solvent having a refractive index that is larger than the refractive index of air and smaller than the refractive index of the resist film to be exposed is preferable. The refractive index of such a solvent is not particularly limited as long as the refractive index is in the above-described range.

Examples of the solvent having a refractive index that is larger than the refractive index of air and smaller than the refractive index of the resist film include water, a fluorine-based inert liquid, a silicon-based solvent, and a hydrocarbon-based solvent.

Specific examples of the fluorine-based inert liquid include a liquid that contains a fluorine-based compound such as $C_3HCl_2F_5$, $C_4F_9OCH_3$, $C_4F_9OC_2H_5$, or $C_5H_3F_7$ as a main component, and the boiling point thereof is preferably in a range of 70° C. to 180° C. and more preferably in a range of 80° C. to 160° C. It is preferable that the fluorine-based inert liquid have the above-described boiling point from the viewpoint that a medium used for liquid immersion can be removed using a simple method after the exposure is completed.

As the fluorine-based inert liquid, a perfluoroalkyl compound formed by all hydrogen atoms in an alkyl group being substituted with fluorine atoms is particularly preferable. Specific examples of the perfluoroalkylether compound include a perfluoroalkyl ether compound and a perfluoroalkylamine compound.

Further, specific examples of the perfluoroalkylether compound include perfluoro(2-butyl-tetrahydrofuran) (boiling point of 102° C.); and specific examples of the perfluoroalkylamine compound include perfluorotributylamine (boiling point of 174° C.).

Water is preferably used as the liquid immersion medium from the viewpoints of the cost, the safety, the environmental problems, versatility, and the like.

Examples of the alkali developer used for the development treatment in the alkali development process, a 0.1 to 10 mass % tetramethylammonium hydroxide (TMAH) aqueous solution is exemplified.

The alkali development treatment can be performed according to a known development method, and examples of the known development method include a method (dipping method) of immersing a support in a developer for a certain period of time; a method (paddle method) of raising a developer on the surface of a support using the surface tension and maintaining the state for a certain period of time; a method (spray method) of spraying a developer to the surface of a support; and a method (dynamic dispense method) of continuously coating a support rotating at a certain speed with a developer while scanning an organic developer coating nozzle at a certain speed.

The organic solvent contained in the organic developer used for the organic solvent development treatment is not particularly limited as long as the above-described (A) component (the (A) component before exposure) can be dissolved therein, and the solvent can be appropriately selected from among known organic solvents. Specific examples thereof include a polar solvent such as a ketone-based solvent, an ester-based solvent, an alcohol-based solvent, a nitrile-based solvent, an amide-based solvent, or an ether-based solvent and a hydrocarbon-based solvent.

The ketone-based solvent is an organic solvent that contains C—C(=O)—C in the structure. The ester-based solvent is an organic solvent contains C—C(=O)—O—C in the structure. The alcohol-based solvent is an organic solvent that contains an alcoholic hydroxyl group in the structure. The "alcoholic hydroxyl group" indicates a hydroxyl group bonded to a carbon atom of an aliphatic hydrocarbon group. The nitrile-based solvent is an organic solvent that contains a nitrile group in the structure. The amide-based solvent is an organic solvent that contains an amide group in the structure. The ether-based solvent is an organic solvent that contains C—O—C in the structure.

In the organic solvents, organic solvents containing a plurality of functional groups in the structures which characterize each of the above-described solvents are present. In this case, each of the above-described solvents corresponds to all solvents containing the functional groups included in the corresponding organic solvent. For example, diethylene glycol monomethyl ether corresponds to both of the alcohol-based solvent and the ether-based solvent in the above-described classification.

The hydrocarbon-based solvent is a hydrocarbon solvent which is formed of hydrocarbon that may be halogenated and does not have a substituent other than a halogen atom. Examples of the halogen atom include a fluorine atom, a chlorine atom, a bromine atom, and an iodine atom. Among these, a fluorine atom is preferable.

Among the examples, as the organic solvent contained in the organic developer, a polar solvent is preferable and a ketone-based solvent, an ester-based solvent, or a nitrile-based solvent is more preferable.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, γ-butyrolactone, and methyl amyl ketone (2-heptanone). Among these, methyl amyl ketone (2-heptanone) is preferable as the ketone-based solvent.

Examples of the ester-based solvent include methyl acetate, butyl acetate, ethyl acetate, isopropyl acetate, amyl acetate, isoamyl acetate, ethyl methoxy acetate, ethyl ethoxy acetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxy propionate, ethyl 2-hydroxy propionate, methyl-3-methoxy propionate, ethyl-3-methoxy propionate, ethyl-3-ethoxy propionate, and propyl-3-methoxy propionate. Among these, butyl acetate is preferable as the ester-based solvent.

Examples of the nitrile-based solvent include acetonitrile, propionitrile, valeronitrile, and butyronitrile.

Known additives can be blended into the organic developer as necessary. Examples of the additives include a surfactant. The surfactant is not particularly limited, and ionic or non-ionic fluorine-based and/or silicon-based surfactants can be used.

As the surfactant, a non-ionic surfactant is preferable, and a non-ionic fluorine-based surfactant or a silicon-based surfactant is more preferable.

In a case where the surfactant is blended into the organic developer, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developer.

The organic solvent development treatment can be performed according to a known development method, and examples of the known development method include a method (dipping method) of immersing a support in an organic developer for a certain period of time; a method (paddle method) of raising an organic developer on the surface of a support using the surface tension and maintaining the state for a certain period of time; a method (spray method) of spraying an organic developer to the surface of a support; and a method (dynamic dispense method) of continuously coating a support rotating at a certain speed with an organic developer while scanning an organic developer coating nozzle at a certain speed.

In a case where the rinse treatment is performed after the organic solvent development, as the organic solvent contained in the rinse liquid used for the rinse treatment, a solvent in which a resist pattern is unlikely to be dissolved is appropriately selected from among the organic solvents exemplified the examples of the organic solvent used for the organic developer and then used. At least one solvent selected from the hydrocarbon-based solvent, the ketone-based solvent, the ester-based solvent, the alcohol-based solvent, the amide-based solvent, and the ether-based solvent is typically used. Among these, at least one solvent selected from the hydrocarbon-based solvent, the ketone-based solvent, the ester-based solvent, the alcohol-based solvent, and the amide-based solvent is preferable; at least one solvent selected from the alcohol-based solvent and the ester-based solvent is more preferable; and the alcohol-based solvent is particularly preferable.

As the alcohol-based solvent used for the rinse liquid, monohydric alcohol having 6 to 8 carbon atoms is preferable, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable; and 1-hexanol and 2-hexanol are more preferable.

As the organic solvent, one kind thereof may be used, or the mixture containing two or more kinds thereof may be used. Further, the organic solvent may be mixed with an organic solvent other than those described above or water and then used. In consideration of the development characteristics, the content of water in the rinse liquid is preferably 30% by mass or less, more preferably 10% by mass or less, still more preferably 5% by mass or less, and particularly preferably 3% by mass or less with respect to the total amount of the rinse liquid.

Known additives can be added to the rinse liquid as necessary. Examples of the additives include a surfactant. Examples of the surfactant are the same as those described above. Among those, a non-ionic surfactant is preferable, and a non-ionic fluorine-based surfactant or a non-ionic silicon-based surfactant is more preferable.

In a case where a surfactant is added to the rinse liquid, the amount of the surfactant to be added is typically in a range of 0.001% to 5% by mass, preferably in a range of 0.005% to 2% by mass, and more preferably in a range of 0.01% to 0.5% by mass with respect to the total amount of the rinse liquid.

The rinse treatment (washing treatment) using the rinse liquid can be performed according to a known rinse method. Examples of the known rinse treatment method include a method (rotation coating method) of continuously coating a support rotating at a certain speed with a rinse liquid; a method (dipping method) of immersing a support in a rinse liquid for a certain period of time; and a method (spray method) of spraying a rinse liquid to the surface of a support.

According to the above-described method of forming a resist pattern of the present embodiment, since the above-described resist composition is used, a resist pattern with improved lithography characteristics such as excellent sensitivity, resolution, and roughness can be formed.

(Polymer Compound)

A polymer compound according to a third embodiment of the present invention has the constitutional unit (a0) derived from a compound represented by Formula (a0-1) and the constitutional unit (a10) derived from a compound represented by Formula (a10-1) and does not have a constitutional unit represented by Formula (1).

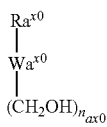

(a0-1)

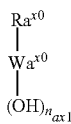

(a00-1)

In Formula (a0-1), $Ra^{x0}$ represents a polymerizable group-containing group; $Wa^{x0}$ represents an $(n_{ax0}+1)$-valent aromatic hydrocarbon group, provided that $Ra^{x0}$ and $Wa^{x0}$ may together form a fused ring structure; $n_{ax0}$ represents an integer of 1 to 3. In Formula (a10-1), $Ra^{x1}$ represents a polymerizable group-containing group; $Wa^{x1}$ represents an $(n_{ax1}+1)$-valent aromatic hydrocarbon group, provided that $Ra^{x1}$ and $Wa^{x1}$ may together form a fused ring structure; and $n_{ax1}$ represents an integer of 1 to 3.

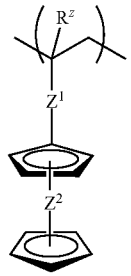

(1)

In Formula (1), $R^z$ represents a hydrogen atom or a methyl group; $Z^1$ represents a single bond, a methylene group, —C(=O)—O—$R^{z1}$—, —O—$R^{z1}$—, —O—C(=O)—$R^{z1}$—, or —$R^{z2}$—$R^{z1}$—, provided that $R^{z1}$ represents a single bond, a linear, branched, or cyclic alkylene group having 1 to 6 carbon atoms which may have an ester group or an ether group, an arylene group having 6 to 10 carbon atoms which may have an ester group or an ether group, or an alkenylene group having 2 to 10 carbon atoms which may have an ester group or an ether group, and $R^{z2}$ represents a phenylene group or a naphthylene group; and $Z^2$ represents Fe, Co, Ni, Cr, or Ru.

The polymer compound of the present embodiment has the same definition as the (A1) component (the polymer compound that has the constitutional unit (a0) and the constitutional unit (a10) and does not have a constitutional unit represented by Formula (1)) described in the section of "(resist composition)", and the type of constitutional units which may be included in addition to the constitutional unit (a0) and the constitutional unit (a10) and the content ratio of each constitutional unit in the (A1) component are as described above.

The polymer compound of the present embodiment can be produced by dissolving a monomer from which the constitutional unit (a0) is derived, a monomer from which the constitutional unit (a10) is derived, and monomers from which other constitutional units are derived as necessary in a polymerization solvent, adding a radical polymerization initiator such as azobisisobutyronitrile (AIBN) or dimethyl 2,2'-azobisisobutyrate (for example, V-601), and polymerizing the monomers. Alternatively, the polymer compound of the present embodiment can be produced by dissolving monomers, from which each constitutional unit is derived and in which functional groups are protected, in a polymerization solvent, adding the above-described radical polymerization initiator, polymerizing the solution, and carrying out a deprotection reaction. Further, a —C(CF$_3$)$_2$—OH group may be introduced to the terminal by using a chain transfer agent such as HS—CH$_2$—CH$_2$—CH$_2$—C(CF$_3$)$_2$—OH in combination during the polymerization. In this manner, a copolymer into which a hydroxyalkyl group obtained by substituting some hydrogen atoms of an alkyl group with fluorine atoms has been introduced is effective for reducing development defects or line edge roughness (LER: irregularities on a line side wall).

The polymer compound of the present embodiment is a new material that is useful as a base resin for a resist composition and can be suitably combined with the resist composition as a base material component having film forming ability or a resin component ((A1) component) whose solubility in a developer is changed due to an action of an acid.

EXAMPLES

Hereinafter, the present invention will be described in more detail with reference to the following examples, but the present invention is not limited to these examples.

In the examples, a compound represented by Chemical Formula (1) is noted as a "compound (1)" and the same applies to compounds represented by other chemical formulae.

Production Example of Polymer Compound

Production Example 1: Production of Polymer Compound A1-1 p-Acetoxystyrene (26.28 g, 0.16 mol), p-hydroxymethylstyrene (5.10 g, 0.04 mol), and dimethyl 2,2'-azobis(2-methylpropionate) (hereinafter, abbreviated as "V-601", 6.625 g, 0.029 mol) were dissolved in propylene glycol 1-monomethyl ether 2-acetate (hereinafter, abbreviated as "PGMEA", 63.0 g) and a polymerization reaction was carried out at 80° C. for 6 hours.

Next, the polymerization solution was added dropwise to a mixed solution (400 g) of methanol and water at room temperature for 30 minutes, and the resulting solution was stirred for 30 minutes. The stirred solution was filtered, and the obtained precipitate was added to a mixed solution (350 g) of methanol and water and dispersed at room temperature for 30 minutes. The dispersion liquid was filtered, a mixed solution (350 g) of methanol and water was added to the obtained filtered material again, and the material was re-dispersed at room temperature for 30 minutes. The dispersion liquid was filtered again, and the obtained filtered material was dried under reduced pressure overnight.

Propylene glycol monomethyl ether (hereinafter, abbreviated as "PGME", 39.24 g), methanol (39.03 g), trimethylamine (20.87 g, 0.21 mol), and dimethylaminopyridine (5.03 g, 0.04 mol) were added to the dried material (25.87 g), and the resultant was heated and refluxed to carry out a deprotection reaction for 6 hours. The reaction solution was cooled after being heated and refluxed and added dropwise to 1% hydrochloric acid (782 g) at room temperature, and the solution was stirred for 1 hour after dropwise addition.

The solution was filtered after being stirred to obtain a precipitate, the precipitate was dissolved in methyl isobutyl ketone (hereinafter, abbreviated as "MIBK", 517 g), 1 wt % hydrochloric acid (259 g) was added to the solution, and the solution was stirred and then allowed to stand to obtain an upper layer (MIBK layer) through liquid separation. After this MIBK solution was washed with hydrochloric acid three time, and then washed with water three times.

The MIBK solution which had been washed with water was concentrated and dried under reduced pressure, thereby obtaining 15.8 g of a target polymer compound A1-1.

The weight-average molecular weight (Mw) of the obtained polymer compound A1-1 in terms of standard polystyrene acquired by performing GPC measurement was 4.0 K, and the molecular weight dispersity (PDI (Mw/Mn)) was 1.62.

Further, the copolymer compositional ratio (the proportion of each constitutional unit in the structural formula (molar ratio)) acquired by the carbon 13 nuclear magnetic resonance spectrum (150 MHz_$^{13}$C-NMR) and proton 1 nuclear magnetic resonance spectrum (600 MHz_$^{1}$H-NMR) was 1/m=80/20.

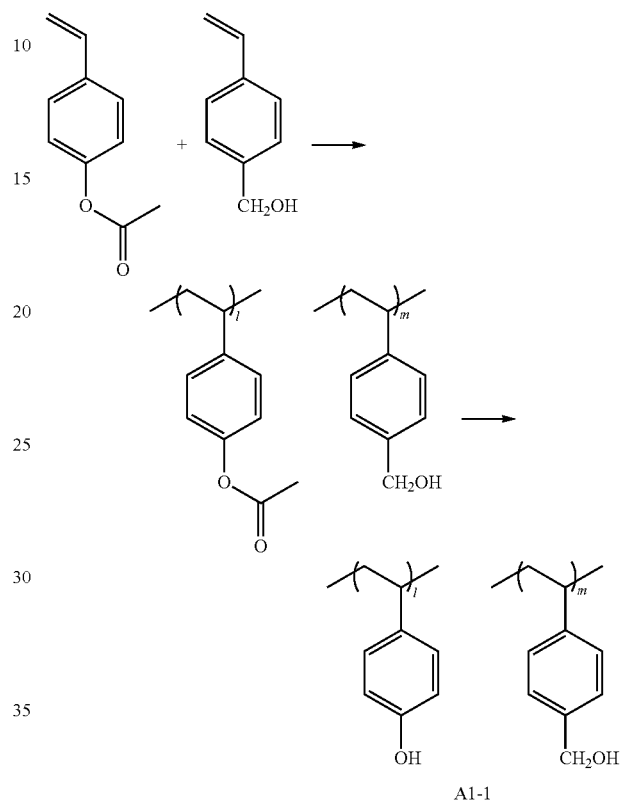

A1-1

Production Examples 2 to 8: Production of Polymer Compounds A1-2 to A1-8

Polymer compounds A1-2 to A1-8 were obtained in the same manner as in Production Example 1 except that the type and the amount of the monomer to be used were changed. The Mw, PDI, and compositional ratio (the proportion of each constitutional unit in the structural formula (molar ratio)) of each polymer compound were measured in the same manner as in Production Example 1.

Production Example 9: Production of Polymer Compound A1-9 p-Ethoxyethoxystyrene (26.92 g, 0.14 mol), styrene (5.13 g, 0.05 mol), p-hydroxymethylphenyl methacrylate (9.61 g, 0.05 mol), and V-601 (7.541 g, 0.033 mol) were dissolved in methyl ethyl ketone (hereinafter, abbreviated as "MEK", 72.6 g) and heated and refluxed to carry out a polymerization reaction for 5 hours.

Next, the polymerization solution was added to acetic acid (25.22 g, 0.42 mol) and methanol (134.6 g) to carry out a deprotection reaction at 30° C. Ethyl acetate (488 g) and water (976 g) were added to the obtained reaction solution, the resulting solution was stirred and allowed to stand, and the lower layer (water layer) was removed. The organic solution was concentrated until the amount thereof was set to 122 g, the concentrated solution was added dropwise to heptane (1220 g), and the solution was stirred and filtered. The obtained precipitated material was dried under reduced pressure overnight, thereby obtaining 14.30 g of a target polymer compound A1-9.

The weight-average molecular weight (Mw) of the obtained polymer compound A1-9 in terms of standard polystyrene acquired by performing GPC measurement was 3.6 K, and the molecular weight dispersity (PDI (Mw/Mn)) was 1.61.

Further, the copolymer compositional ratio (the proportion of each constitutional unit in the structural formula (molar ratio)) acquired by the carbon 13 nuclear magnetic resonance spectrum (150 MHz_$^{13}$C-NMR) and proton 1 nuclear magnetic resonance spectrum (600 MHz_$^1$H-NMR) was 1/m/n=60/20/20.

Production Examples 10 to 12: Production of Polymer Compounds A1-10 to A1-12

Polymer compounds A1-10 to A1-12 were obtained in the same manner as in Production Example 9 except that the type and the amount of the monomer to be used were changed. The Mw, PDI, and compositional ratio (the proportion of each constitutional unit in the structural formula (molar ratio)) of each polymer compound were measured in the same manner as in Production Example 9.

Production Example 13: Production of Polymer Compound A1-13

Vinyl naphthol (25.00 g, 0.15 mol), styrene (3.68 g, 0.04 mol), p-hydroxymethylstyrene (6.58 g, 0.05 mol), and V-601 (11.800 g, 0.051 mol) were dissolved in PGMEA (71.58 g) and a polymerization reaction was carried out at 80° C. for 6 hours.

Next, the polymerization solution was added dropwise to a mixed solution (474 g) of methanol and water at room temperature for 30 minutes, and the resulting solution was stirred for 30 minutes. The stirred solution was filtered, and the obtained precipitate was added to a mixed solution (415 g) of methanol and water and dispersed at room temperature for 30 minutes. The dispersion liquid was filtered, a mixed solution (415 g) of methanol and water was added to the obtained filtered material again, and the material was re-dispersed at room temperature for 30 minutes. The dispersion liquid was filtered again, and the obtained filtered material was dried under reduced pressure overnight, thereby obtaining 22.85 g of a target polymer compound A1-13.

The weight-average molecular weight (Mw) of the obtained polymer compound A1-13 in terms of standard polystyrene acquired by performing GPC measurement was 3.8 K, and the molecular weight dispersity (PDI (Mw/Mn)) was 1.90.

Further, the copolymer compositional ratio (the proportion of each constitutional unit in the structural formula (molar ratio)) acquired by the carbon 13 nuclear magnetic resonance spectrum (150 MHz_$^{13}$C-NMR) and proton 1 nuclear magnetic resonance spectrum (600 MHz_$^1$H-NMR) was 1/m/n=70/10/20.

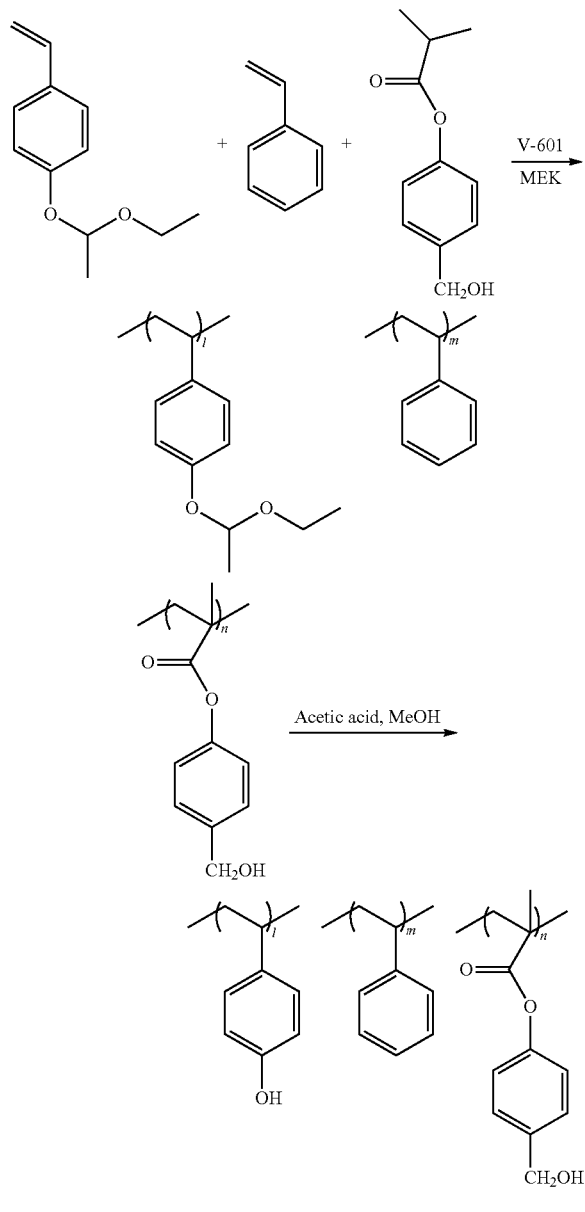

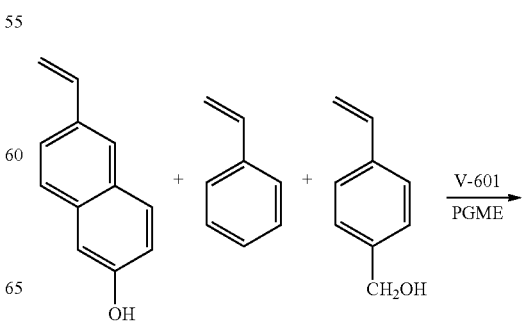

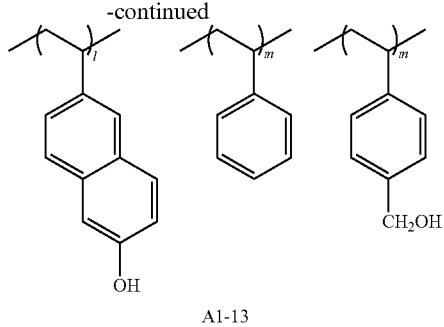

A1-13

Production Example 14: Production of Polymer Compound A1-14

A polymer compound A1-14 was obtained in the same manner as in Production Example 13 except that the type and the amount of the monomer to be used were changed. The Mw, PDI, and compositional ratio (the proportion of each constitutional unit in the structural formula (molar ratio)) of each polymer compound were measured in the same manner as in Production Example 13.

The constitutional units of the polymer compounds A1-1 to A1-14 produced in Production Examples 1 to 14, the proportions of the constitutional units (molar ratios), and the Mw and PDI are listed in Tables 1 to 3.

TABLE 1

| Polymer compound | Constitutional unit | Proportion of each constitutional unit (molar ratio) | Mw | PDI |
|---|---|---|---|---|
| A1-1 | | l/m = 80/20 | 4000 | 1.62 |
| A1-2 | | l/m = 60/40 | 3700 | 1.62 |
| A1-3 | | l/m/n = 60/10/30 | 3600 | 1.61 |
| A1-4 | | l/m/n = 60/20/20 | 3500 | 1.60 |
| A1-5 | | l/m/n = 55/15/30 | 3500 | 1.59 |

TABLE 2
| Polymer compound | Constitutional unit | | | Proportion of each constitutional unit (molar ratio) | Mw | PDI |
|---|---|---|---|---|---|---|
| A1-6 | 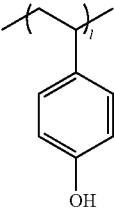 | 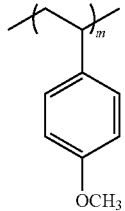 | 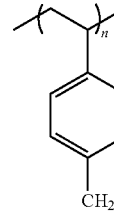 | l/m/n = 60/15/25 | 3600 | 1.60 |
| A1-7 | 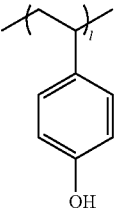 | 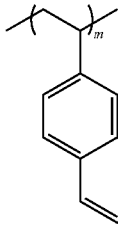 | 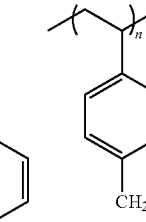 | l/m/n = 60/10/30 | 3600 | 1.55 |
| A1-8 | 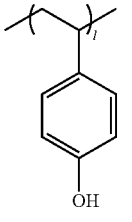 | 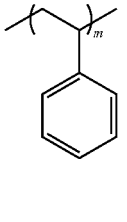 | 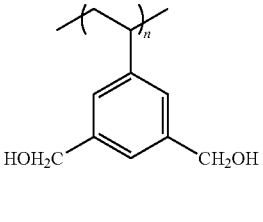 | l/m/n = 60/20/20 | 3400 | 1.61 |
| A1-9 | 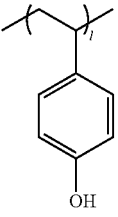 | 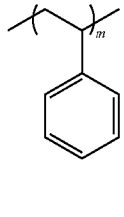 | 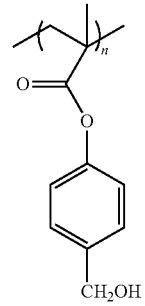 | l/m/n = 60/20/20 | 3600 | 1.61 |
| A1-10 | 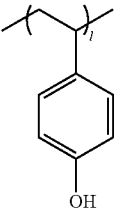 | 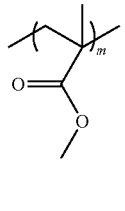 | 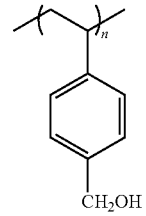 | l/m/n = 60/15/25 | 3500 | 1.60 |

TABLE 3

| Polymer compound | Constitutional unit | Proportion of each constitutional unit (molar ratio) | Mw | PDI |
|---|---|---|---|---|
| A1-11 | (4-hydroxystyrene) / (adamantyl methacrylate) / (4-(hydroxymethyl)styrene) | l/m/n = 60/15/25 | 3500 | 1.60 |
| A1-12 | (4-hydroxystyrene) / (γ-butyrolactone methacrylate) / (4-(hydroxymethyl)styrene) | l/m/n = 60/10/30 | 3500 | 1.59 |
| A1-13 | (6-hydroxy-2-naphthyl vinyl) / (styrene) / (4-(hydroxymethyl)styrene) | l/m/n = 70/10/20 | 3800 | 1.90 |
| A1-14 | (4-hydroxyphenyl acrylate) / (styrene) / (4-(hydroxymethyl)styrene) | l/m/n = 60/20/20 | 3600 | 1.80 |

(Production of Polymer Compounds A2-1 and A2-2)

Polymer compounds A2-1 and A2-2 were respectively obtained by performing radical polymerization on monomers, from which the following constitutional units constituting each polymer compound were derived, at predetermined molar ratios.

The constitutional units of the polymer compounds A2-1 and A2-2, the proportion of each constitutional unit (molar ratio), and the Mw and PDI are listed in Table 4.

TABLE 4

| Polymer compound | Constitutional unit | Proportion of each constitutional unit (molar ratio) | Mw | PDI |
| --- | --- | --- | --- | --- |
| A2-1 | (structure: poly(hydroxystyrene-co-styrene)) | l/m = 80/20 | 4000 | 1.62 |
| A2-2 | (structure: poly(hydroxystyrene-co-alkoxymethyl aryl ether styrene)) | l/m = 80/20 | 3300 | 1.20 |

<Preparation of Resist Composition>

Examples 1 to 56 and Comparative Examples 1 to 12

A resist composition (solid content concentration: 1.5% by mass) of each example was prepared by mixing each component listed in Tables 5 to 8 and dissolving the mixture.

TABLE 5

| | (A) Component | (B) Component | (D) Component | (S) Component |
| --- | --- | --- | --- | --- |
| Example 1 | (A)-1 [100] | (B)-1 [11.5] | (D)-1 [3.0] | (S)-1 [6665] |
| Example 2 | (A)-1 [100] | (B)-1 [11.5] | (D)-2 [3.5] | (S)-1 [6665] |
| Example 3 | (A)-1 [100] | (B)-2 [10.5] | (D)-1 [3.0] | (S)-1 [6665] |
| Example 4 | (A)-1 [100] | (B)-2 [10.5] | (D)-2 [3.5] | (S)-1 [6665] |
| Example 5 | (A)-2 [100] | (B)-1 [11.5] | (D)-1 [3.0] | (S)-1 [6665] |
| Example 6 | (A)-2 [100] | (B)-1 [11.5] | (D)-2 [3.5] | (S)-1 [6665] |
| Example 7 | (A)-2 [100] | (B)-2 [10.5] | (D)-1 [3.0] | (S)-1 [6665] |
| Example 8 | (A)-2 [100] | (B)-2 [10.5] | (D)-2 [3.5] | (S)-1 [6665] |
| Example 9 | (A)-3 [100] | (B)-1 [11.5] | (D)-1 [3.0] | (S)-1 [6665] |
| Example 10 | (A)-3 [100] | (B)-1 [11.5] | (D)-2 [3.5] | (S)-1 [6665] |
| Example 11 | (A)-3 [100] | (B)-2 [10.5] | (D)-1 [3.0] | (S)-1 [6665] |
| Example 12 | (A)-3 [100] | (B)-2 [10.5] | (D)-2 [3.5] | (S)-1 [6665] |
| Example 13 | (A)-4 [100] | (B)-1 [11.5] | (D)-1 [3.0] | (S)-1 [6665] |
| Example 14 | (A)-4 [100] | (B)-1 [11.5] | (D)-2 [3.5] | (S)-1 [6665] |
| Example 15 | (A)-4 [100] | (B)-2 [10.5] | (D)-1 [3.0] | (S)-1 [6665] |
| Example 16 | (A)-4 [100] | (B)-2 [10.5] | (D)-2 [3.5] | (S)-1 [6665] |

TABLE 6

| | (A) Component | (B) Component | (D) Component | (S) Component |
| --- | --- | --- | --- | --- |
| Example 17 | (A)-5 [100] | (B)-1 [11.5] | (D)-1 [3.0] | (S)-1 [6665] |
| Example 18 | (A)-5 [100] | (B)-1 [11.5] | (D)-2 [3.5] | (S)-1 [6665] |
| Example 19 | (A)-5 [100] | (B)-2 [10.5] | (D)-1 [3.0] | (S)-1 [6665] |
| Example 20 | (A)-5 [100] | (B)-2 [10.5] | (D)-2 [3.5] | (S)-1 [6665] |
| Example 21 | (A)-6 [100] | (B)-1 [11.5] | (D)-1 [3.0] | (S)-1 [6665] |
| Example 22 | (A)-6 [100] | (B)-1 [11.5] | (D)-2 [3.5] | (S)-1 [6665] |
| Example 23 | (A)-6 [100] | (B)-2 [10.5] | (D)-1 [3.0] | (S)-1 [6665] |
| Example 24 | (A)-6 [100] | (B)-2 [10.5] | (D)-2 [3.5] | (S)-1 [6665] |

TABLE 6-continued

|  | (A) Component | (B) Component | (D) Component | (S) Component |
|---|---|---|---|---|
| Example 25 | (A)-7 [100] | (B)-1 [11.5] | (D)-1 [3.0] | (S)-1 [6665] |
| Example 26 | (A)-7 [100] | (B)-1 [11.5] | (D)-2 [3.5] | (S)-1 [6665] |
| Example 27 | (A)-7 [100] | (B)-2 [10.5] | (D)-1 [3.0] | (S)-1 [6665] |
| Example 28 | (A)-7 [100] | (B)-2 [10.5] | (D)-2 [3.5] | (S)-1 [6665] |
| Example 29 | (A)-8 [100] | (B)-1 [11.5] | (D)-1 [3.0] | (S)-1 [6665] |
| Example 30 | (A)-8 [100] | (B)-1 [11.5] | (D)-2 [3.5] | (S)-1 [6665] |
| Example 31 | (A)-8 [100] | (B)-2 [10.5] | (D)-1 [3.0] | (S)-1 [6665] |
| Example 32 | (A)-8 [100] | (B)-2 [10.5] | (D)-2 [3.5] | (S)-1 [6665] |
| Example 33 | (A)-9 [100] | (B)-1 [11.5] | (D)-1 [3.0] | (S)-1 [6665] |
| Example 34 | (A)-9 [100] | (B)-1 [11.5] | (D)-2 [3.5] | (S)-1 [6665] |
| Example 35 | (A)-9 [100] | (B)-2 [10.5] | (D)-1 [3.0] | (S)-1 [6665] |
| Example 36 | (A)-9 [100] | (B)-2 [10.5] | (D)-2 [3.5] | (S)-1 [6665] |

TABLE 7

|  | (A) Component | (B) Component | (D) Component | (S) Component |
|---|---|---|---|---|
| Example 37 | (A)-10 [100] | (B)-1 [11.5] | (D)-1 [3.0] | (S)-1 [6665] |
| Example 38 | (A)-10 [100] | (B)-1 [11.5] | (D)-2 [3.5] | (S)-1 [6665] |
| Example 39 | (A)-10 [100] | (B)-2 [10.5] | (D)-1 [3.0] | (S)-1 [6665] |
| Example 40 | (A)-10 [100] | (B)-2 [10.5] | (D)-2 [3.5] | (S)-1 [6665] |
| Example 41 | (A)-11 [100] | (B)-1 [11.5] | (D)-1 [3.0] | (S)-1 [6665] |
| Example 42 | (A)-11 [100] | (B)-1 [11.5] | (D)-2 [3.5] | (S)-1 [6665] |
| Example 43 | (A)-11 [100] | (B)-2 [10.5] | (D)-1 [3.0] | (S)-1 [6665] |
| Example 44 | (A)-11 [100] | (B)-2 [10.5] | (D)-2 [3.5] | (S)-1 [6665] |
| Example 45 | (A)-12 [100] | (B)-1 [11.5] | (D)-1 [3.0] | (S)-1 [6665] |
| Example 46 | (A)-12 [100] | (B)-1 [11.5] | (D)-2 [3.5] | (S)-1 [6665] |
| Example 47 | (A)-12 [100] | (B)-2 [10.5] | (D)-1 [3.0] | (S)-1 [6665] |
| Example 48 | (A)-12 [100] | (B)-2 [10.5] | (D)-2 [3.5] | (S)-1 [6665] |
| Example 49 | (A)-13 [100] | (B)-1 [11.5] | (D)-1 [3.0] | (S)-1 [6665] |
| Example 50 | (A)-13 [100] | (B)-1 [11.5] | (D)-2 [3.5] | (S)-1 [6665] |
| Example 51 | (A)-13 [100] | (B)-2 [10.5] | (D)-1 [3.0] | (S)-1 [6665] |
| Example 52 | (A)-13 [100] | (B)-2 [10.5] | (D)-2 [3.5] | (S)-1 [6665] |
| Example 53 | (A)-14 [100] | (B)-1 [11.5] | (D)-1 [3.0] | (S)-1 [6665] |
| Example 54 | (A)-14 [100] | (B)-1 [11.5] | (D)-2 [3.5] | (S)-1 [6665] |
| Example 55 | (A)-14 [100] | (B)-2 [10.5] | (D)-1 [3.0] | (S)-1 [6665] |
| Example 56 | (A)-14 [100] | (B)-2 [10.5] | (D)-2 [3.5] | (S)-1 [6665] |

TABLE 8

|  | (A) Component | (B) Component | (D) Component | (C) Component | (S) Component |
|---|---|---|---|---|---|
| Comparative Example 1 | (A)-15 [100] | (B)-1 [11.5] | (D)-1 [3.0] | (C)-1 [10] | (S)-1 [6665] |
| Comparative Example 2 | (A)-15 [100] | (B)-1 [11.5] | (D)-2 [3.5] | (C)-1 [10] | (S)-1 [6665] |
| Comparative Example 3 | (A)-15 [100] | (B)-2 [10.5] | (D)-1 [3.0] | (C)-1 [10] | (S)-1 [6665] |
| Comparative Example 4 | (A)-15 [100] | (B)-2 [10.5] | (D)-2 [3.5] | (C)-1 [10] | (S)-1 [6665] |
| Comparative Example 5 | (A)-15 [100] | (B)-1 [11.5] | (D)-1 [3.0] | (C)-2 [10] | (S)-1 [6665] |
| Comparative Example 6 | (A)-15 [100] | (B)-1 [11.5] | (D)-2 [3.5] | (C)-2 [10] | (S)-1 [6665] |
| Comparative Example 7 | (A)-16 [100] | (B)-1 [11.5] | (D)-1 [3.0] | (C)-1 [10] | (S)-1 [6665] |
| Comparative Example 8 | (A)-16 [100] | (B)-1 [11.5] | (D)-2 [3.5] | (C)-1 [10] | (S)-1 [6665] |
| Comparative Example 9 | (A)-16 [100] | (B)-2 [10.5] | (D)-1 [3.0] | (C)-1 [10] | (S)-1 [6665] |
| Comparative Example 10 | (A)-16 [100] | (B)-2 [10.5] | (D)-2 [3.5] | (C)-1 [10] | (S)-1 [6665] |
| Comparative Example 11 | (A)-16 [100] | (B)-1 [11.5] | (D)-1 [3.0] | (C)-2 [10] | (S)-1 [6665] |
| Comparative Example 12 | (A)-16 [100] | (B)-1 [11.5] | (D)-2 [3.5] | (C)-2 [10] | (S)-1 [6665] |

In Tables 5 to 8, each abbreviation has the following meaning. Further, the numerical values in the parentheses indicate the blending amounts (part by mass).

(A)-1 to (A)-14: the above-described polymer compounds A1-1 to A1-14

(A)-15 and (A)-16: the above-described polymer compounds A2-1 and A2-2

(B)-1 and (B)-2: acid generators formed of compounds respectively represented by Chemical Formulae (b-1-1) and (b-1-2)

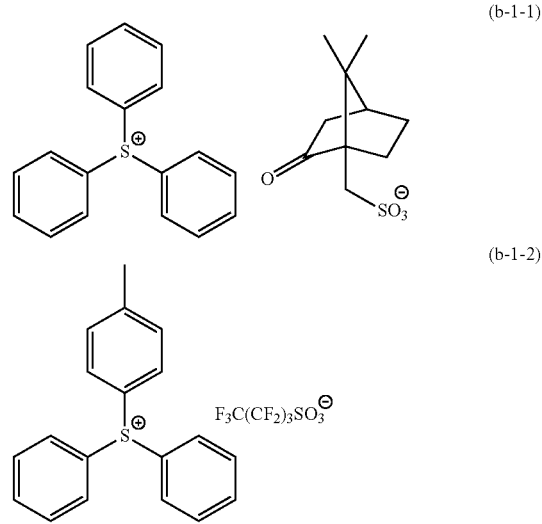

(D)-1: n-trioctylamine
(D)-2: photodegradable base formed of compound represented by Chemical Formula (D1-2)

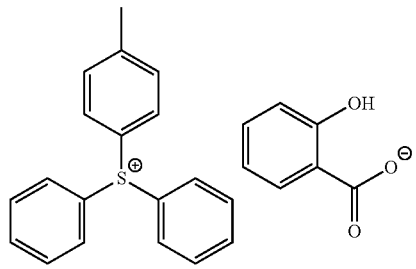

(D1-2)

(C)-1 and (C)-2: crosslinking agents composed of compounds represented by Chemical Formulae (C-1) and (C-2)

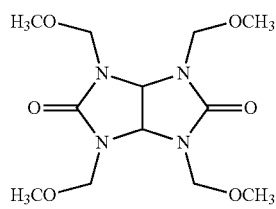

(C-1)

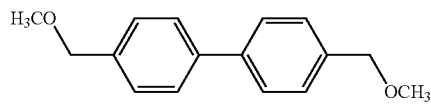

(C-2)

(S)-1: mixed solvent containing propylene glycol monomethyl ether acetate and propylene glycol monomethyl ether at mixing ratio of 20/80 (mass ratio)

<Formation of Resist Pattern Using EB Exposure>

An 8-inch silicon substrate on which a hexamethyldisilazane (HMDS) treatment was performed was coated with each resist composition of each example using a spinner, a pre-bake (PAB) treatment was performed thereon on a hot plate at a temperature of 110° C. for 60 seconds, and the composition was dried, thereby forming a resist film having a film thickness of 40 nm.

Next, drawing (exposing) was performed on the resist film at an acceleration voltage of 100 kV using an electron beam drawing device JEOL-JBX-9300FS (manufactured by JEOL Ltd.) such that the target size was set to a 1:1 line and space pattern (hereinafter, "LS pattern") with a line width of 50 to 26 nm, and a post-exposure bake (PEB) treatment was performed at 100° C. for 60 seconds.

Next, alkali development was performed at 23° C. for 60 seconds using a 2.38 mass % tetramethylammonium hydroxide (TMAH) aqueous solution "NMD-3" (trade name, manufactured by Tokyo Ohka Kogyo Co., Ltd.). Thereafter, water rinsing was performed for 60 seconds using pure water.

As a result, a 1:1 LS pattern with a line width of 50 to 26 nm was formed.

[Evaluation of Optimum Exposure Amount (Eop)]

An optimum exposure amount Eop ($\mu C/cm^2$) at which a LS pattern with a target size was formed according to the method of forming a resist pattern was acquired. The results are listed in Tables 9 to 12 as "Eop ($\mu C/cm^2$)".

[Evaluation of Resolution]

In a case where the limit resolution in the Eop, specifically, the exposure amount from the optimum exposure amount Eop was gradually increased to form a LS pattern, the minimum dimension of the pattern resolved without causing pattern collapse was acquired using a scanning electron microscope S-9380 (manufactured by Hitachi High-Technologies Corporation). The obtained results are listed in Tables 9 to 12 as the "resolution performance (nm)".

[Evaluation of Line Width Roughness (LWR)]

As a scale showing LWR, 3σ of the LS pattern formed in the <formation of resist pattern> was acquired. The obtained results are listed in Tables 9 to 12 as "LWR (nm)".

The "3σ" indicates a value of three times (3σ) (unit: nm) the standard deviation (σ) acquired from the measurement results obtained by measuring 400 sites of line positions of lines in the longitudinal direction using a scanning electron microscope (acceleration voltage of 800 V, trade name: S-9380, manufactured by Hitachi High-Technologies Corporation).

As the value of 3σ was decreased, this means that the roughness of the line side wall was small and a LS pattern having a uniform width was obtained.

TABLE 9

| | PAB (° C.) | PEB (° C.) | Eop ($\mu C/cm^2$) | Resolution performance (nm) | LWR (nm) |
|---|---|---|---|---|---|
| Example 1 | 110 | 100 | 125 | 30 | 6.8 |
| Example 2 | 110 | 100 | 118 | 28 | 6.6 |
| Example 3 | 110 | 100 | 109 | 30 | 7.1 |
| Example 4 | 110 | 100 | 101 | 28 | 7.3 |
| Example 5 | 110 | 100 | 96 | 28 | 7.1 |
| Example 6 | 110 | 100 | 94 | 28 | 6.7 |
| Example 7 | 110 | 100 | 91 | 28 | 6.6 |
| Example 8 | 110 | 100 | 88 | 28 | 6.9 |
| Example 9 | 110 | 100 | 102 | 28 | 7.4 |
| Example 10 | 110 | 100 | 98 | 28 | 7.0 |
| Example 11 | 110 | 100 | 96 | 28 | 6.6 |
| Example 12 | 110 | 100 | 93 | 28 | 6.5 |
| Example 13 | 110 | 100 | 105 | 28 | 6.3 |
| Example 14 | 110 | 100 | 103 | 26 | 6.4 |
| Example 15 | 110 | 100 | 100 | 26 | 6.2 |
| Example 16 | 110 | 100 | 98 | 26 | 6.4 |

TABLE 10

| | PAB (° C.) | PEB (° C.) | Eop ($\mu C/cm^2$) | Resolution performance (nm) | LWR (nm) |
|---|---|---|---|---|---|
| Example 17 | 110 | 100 | 98 | 28 | 6.6 |
| Example 18 | 110 | 100 | 96 | 26 | 6.4 |
| Example 19 | 110 | 100 | 95 | 28 | 6.8 |
| Example 20 | 110 | 100 | 92 | 26 | 6.5 |
| Example 21 | 110 | 100 | 108 | 28 | 6.3 |
| Example 22 | 110 | 100 | 106 | 26 | 6.5 |
| Example 23 | 110 | 100 | 104 | 26 | 6.4 |
| Example 24 | 110 | 100 | 101 | 26 | 6.5 |
| Example 25 | 110 | 100 | 92 | 30 | 6.9 |
| Example 26 | 110 | 100 | 90 | 28 | 7.2 |
| Example 27 | 110 | 100 | 87 | 30 | 7.1 |
| Example 28 | 110 | 100 | 85 | 28 | 6.7 |
| Example 29 | 110 | 100 | 103 | 30 | 6.8 |
| Example 30 | 110 | 100 | 99 | 30 | 6.8 |
| Example 31 | 110 | 100 | 97 | 28 | 6.9 |
| Example 32 | 110 | 100 | 96 | 28 | 7.0 |
| Example 33 | 110 | 100 | 106 | 28 | 6.6 |
| Example 34 | 110 | 100 | 105 | 26 | 6.8 |
| Example 35 | 110 | 100 | 104 | 26 | 6.5 |
| Example 36 | 110 | 100 | 101 | 26 | 6.6 |

TABLE 11

| | PAB (° C.) | PEB (° C.) | Eop (µC/cm²) | Resolution performance (nm) | LWR (nm) |
|---|---|---|---|---|---|
| Example 37 | 110 | 100 | 131 | 30 | 6.5 |
| Example 38 | 110 | 100 | 126 | 30 | 6.4 |
| Example 39 | 110 | 100 | 122 | 28 | 6.5 |
| Example 40 | 110 | 100 | 120 | 30 | 6.6 |
| Example 41 | 110 | 100 | 110 | 30 | 6.9 |
| Example 42 | 110 | 100 | 108 | 30 | 7.3 |
| Example 43 | 110 | 100 | 106 | 28 | 6.8 |
| Example 44 | 110 | 100 | 104 | 30 | 6.7 |
| Example 45 | 110 | 100 | 128 | 30 | 6.8 |
| Example 46 | 110 | 100 | 124 | 28 | 6.9 |
| Example 47 | 110 | 100 | 123 | 28 | 6.7 |
| Example 48 | 110 | 100 | 121 | 28 | 6.9 |
| Example 49 | 110 | 100 | 94 | 30 | 7.2 |
| Example 50 | 110 | 100 | 92 | 30 | 7.3 |
| Example 51 | 110 | 100 | 89 | 30 | 7.5 |
| Example 52 | 110 | 100 | 85 | 30 | 7.1 |
| Example 53 | 110 | 100 | 103 | 30 | 6.8 |
| Example 54 | 110 | 100 | 99 | 28 | 6.7 |
| Example 55 | 110 | 100 | 96 | 28 | 6.7 |
| Example 56 | 110 | 100 | 93 | 26 | 6.8 |

TABLE 12

| | PAB (° C.) | PEB (° C.) | Eop (µC/cm²) | Resolution performance (nm) | LWR (nm) |
|---|---|---|---|---|---|
| Comparative Example 1 | 110 | 100 | 220 | 50 | — |
| Comparative Example 2 | 110 | 100 | 208 | 50 | — |
| Comparative Example 3 | 110 | 100 | 206 | 50 | — |
| Comparative Example 4 | 110 | 100 | 197 | 50 | — |
| Comparative Example 5 | 110 | 100 | 224 | 50 | — |
| Comparative Example 6 | 110 | 100 | 216 | 50 | — |
| Comparative Example 7 | 110 | 100 | 210 | 50 | — |
| Comparative Example 8 | 110 | 100 | 206 | 50 | — |
| Comparative Example 9 | 110 | 100 | 211 | 50 | — |
| Comparative Example 10 | 110 | 100 | 204 | 50 | — |
| Comparative Example 11 | 110 | 100 | 214 | 50 | — |
| Comparative Example 12 | 110 | 100 | 202 | 50 | — |

As shown in the results listed in Tables 9 to 12, according to the resist compositions of Examples 1 to 56, to which the present invention had been applied, it was confirmed that a resist pattern having an excellent shape with high sensitivity, high resolution, and reduced roughness can be formed during formation of the resist pattern through EB exposure.

<Formation of Resist Pattern Using KrF Exposure>

An 8-inch silicon substrate on which an antireflection film (BARC) treatment was performed was coated with each resist composition of each example using a spinner, a pre-bake (PAB) treatment was performed thereon on a hot plate at a temperature of 110° C. for 60 seconds, and the composition was dried, thereby forming a resist film having a film thickness of 40 nm.

Next, exposing was performed on the resist film using a KrF exposure device NSR-S203-B (manufactured by Nikon Corp.) such that the target size was set to a 1:1 line and space pattern (hereinafter, "LS pattern") with a line width of 200 to 100 nm, and a post-exposure bake (PEB) treatment was performed at 100° C. for 60 seconds.

Next, alkali development was performed at 23° C. for 60 seconds using a 2.38 mass % tetramethylammonium hydroxide (TMAH) aqueous solution "NMD-3" (trade name, manufactured by Tokyo Ohka Kogyo Co., Ltd.). Thereafter, water rinsing was performed for 60 seconds using pure water.

As a result, a 1:1 LS pattern with a line width of 200 to 100 nm was formed.

[Evaluation of Eop, Resolution, and LWR]

The Eop, resolution performance, and LWR were acquired according to the same method as that for the "<Formation of resist pattern using EB exposure>". The results are listed in Tables 13 to 16 as "Eop (mJ/cm²)", "resolution performance (nm)", and "LWR (nm)".

TABLE 13

| | PAB (° C.) | PEB (° C.) | Eop (mJ/cm²) | Resolution performance (nm) | LWR (nm) |
|---|---|---|---|---|---|
| Example 1 | 110 | 100 | 78 | 120 | 5.2 |
| Example 2 | 110 | 100 | 75 | 120 | 5.3 |
| Example 3 | 110 | 100 | 73 | 110 | 5.0 |
| Example 4 | 110 | 100 | 73 | 110 | 5.1 |
| Example 5 | 110 | 100 | 68 | 110 | 5.1 |
| Example 6 | 110 | 100 | 68 | 110 | 5.4 |
| Example 7 | 110 | 100 | 66 | 110 | 4.9 |
| Example 8 | 110 | 100 | 65 | 100 | 5.0 |
| Example 9 | 110 | 100 | 70 | 110 | 4.8 |
| Example 10 | 110 | 100 | 69 | 110 | 4.7 |
| Example 11 | 110 | 100 | 69 | 110 | 5.2 |
| Example 12 | 110 | 100 | 68 | 110 | 5.2 |
| Example 13 | 110 | 100 | 72 | 100 | 4.6 |
| Example 14 | 110 | 100 | 71 | 100 | 4.7 |
| Example 15 | 110 | 100 | 69 | 100 | 4.6 |
| Example 16 | 110 | 100 | 67 | 100 | 4.4 |

TABLE 14

| | PAB (° C.) | PEB (° C.) | Eop (mJ/cm²) | Resolution performance (nm) | LWR (nm) |
|---|---|---|---|---|---|
| Example 17 | 110 | 100 | 68 | 100 | 4.8 |
| Example 18 | 110 | 100 | 67 | 100 | 4.7 |
| Example 19 | 110 | 100 | 65 | 100 | 4.7 |
| Example 20 | 110 | 100 | 63 | 100 | 4.7 |
| Example 21 | 110 | 100 | 70 | 100 | 4.8 |
| Example 22 | 110 | 100 | 69 | 100 | 4.6 |
| Example 23 | 110 | 100 | 68 | 100 | 4.8 |
| Example 24 | 110 | 100 | 68 | 100 | 4.5 |
| Example 25 | 110 | 100 | 75 | 110 | 5.1 |
| Example 26 | 110 | 100 | 75 | 110 | 4.9 |
| Example 27 | 110 | 100 | 73 | 100 | 4.9 |
| Example 28 | 110 | 100 | 71 | 100 | 5.2 |
| Example 29 | 110 | 100 | 71 | 100 | 5.0 |
| Example 30 | 110 | 100 | 68 | 100 | 5.1 |
| Example 31 | 110 | 100 | 68 | 100 | 4.8 |
| Example 32 | 110 | 100 | 67 | 100 | 4.8 |
| Example 33 | 110 | 100 | 70 | 100 | 4.6 |
| Example 34 | 110 | 100 | 69 | 100 | 4.5 |
| Example 35 | 110 | 100 | 69 | 100 | 4.5 |
| Example 36 | 110 | 100 | 68 | 100 | 4.7 |

TABLE 15

|  | PAB (° C.) | PEB (° C.) | Eop (mJ/cm$^2$) | Resolution performance (nm) | LWR (nm) |
|---|---|---|---|---|---|
| Example 37 | 110 | 100 | 77 | 120 | 4.4 |
| Example 38 | 110 | 100 | 75 | 120 | 4.5 |
| Example 39 | 110 | 100 | 74 | 110 | 4.6 |
| Example 40 | 110 | 100 | 74 | 110 | 4.4 |
| Example 41 | 110 | 100 | 68 | 120 | 5.1 |
| Example 42 | 110 | 100 | 66 | 120 | 5.2 |
| Example 43 | 110 | 100 | 65 | 120 | 5.2 |
| Example 44 | 110 | 100 | 64 | 110 | 5.3 |
| Example 45 | 110 | 100 | 74 | 110 | 4.8 |
| Example 46 | 110 | 100 | 74 | 100 | 4.6 |
| Example 47 | 110 | 100 | 73 | 100 | 4.7 |
| Example 48 | 110 | 100 | 71 | 110 | 4.8 |
| Example 49 | 110 | 100 | 65 | 120 | 5.4 |
| Example 50 | 110 | 100 | 64 | 110 | 5.5 |
| Example 51 | 110 | 100 | 64 | 120 | 5.4 |
| Example 52 | 110 | 100 | 62 | 110 | 5.3 |
| Example 53 | 110 | 100 | 76 | 110 | 4.9 |
| Example 54 | 110 | 100 | 75 | 100 | 4.9 |
| Example 55 | 110 | 100 | 74 | 100 | 4.7 |
| Example 56 | 110 | 100 | 71 | 100 | 5.0 |

TABLE 16

|  | PAB (° C.) | PEB (° C.) | Eop (mJ/cm$^2$) | Resolution performance (nm) | LWR (nm) |
|---|---|---|---|---|---|
| Comparative Example 1 | 110 | 100 | 88 | 200 | 7.4 |
| Comparative Example 2 | 110 | 100 | 86 | 200 | 7.2 |
| Comparative Example 3 | 110 | 100 | 85 | 200 | 7.4 |
| Comparative Example 4 | 110 | 100 | 84 | 200 | 7.2 |
| Comparative Example 5 | 110 | 100 | 88 | 200 | 7.7 |
| Comparative Example 6 | 110 | 100 | 87 | 200 | 7.6 |
| Comparative Example 7 | 110 | 100 | 84 | 200 | 7.4 |
| Comparative Example 8 | 110 | 100 | 81 | 200 | 7.5 |
| Comparative Example 9 | 110 | 100 | 79 | 200 | 7.8 |
| Comparative Example 10 | 110 | 100 | 79 | 200 | 7.6 |
| Comparative Example 11 | 110 | 100 | 78 | 200 | 7.7 |
| Comparative Example 12 | 110 | 100 | 80 | 200 | 7.3 |

As shown in the results listed in Tables 13 to 16, according to the resist compositions of Examples 1 to 56, to which the present invention had been applied, it was confirmed that a resist pattern having an excellent shape with high sensitivity, high resolution, and reduced roughness can be formed during formation of the resist pattern through KrF exposure.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A chemically-amplified resist composition which generates an acid when exposed and whose solubility in a developer is changed by an action of an acid, the resist composition comprising:
a polymer compound (A1) which has a constitutional unit (a0) derived from a compound represented by Formula (a0-1) and a constitutional unit (a10) derived from a compound represented by Formula (a10-1) and does not have a constitutional unit represented by Formula (1):

(a0-1)

wherein $Ra^{x0}$ represents a polymerizable group-containing group; $Wa^{x0}$ represents an $(n_{ax0}+1)$-valent aromatic hydrocarbon group, provided that $Ra^{x0}$ and $Wa^{x0}$ may together form a fused ring structure; and $n_{ax0}$ represents an integer of 1 to 3,

(a10-1)

wherein $Ra^{x1}$ represents a polymerizable group-containing group; $Wa^{x1}$ represents an $(n_{ax1}+1)$-valent aromatic hydrocarbon group, provided that $Ra^{x1}$ and $Wa^{x1}$ may together form a fused ring structure; and $n_{ax1}$ represents an integer of 1 to 3, and

(1)

wherein $R^z$ represents a hydrogen atom or a methyl group; $Z^1$ represents a single bond a methylene group, —C(=O)—O—$R^{z1}$—, —O—$R^{z1}$—, —O—C(=O)—$R^{z1}$—, or —$R^{z2}$—$R^{z1}$—, provided that $R^{z1}$ represents a single bond, a linear, branched, or cyclic alkylene group having 1 to 6 carbon atoms which may have an ester group or an ether group, an arylene group having 6 to 10 carbon atoms which may have an ester group or an ether group, or an alkenylene group having 2 to 10 carbon atoms which may have an ester group or an ether group, and $R^{z2}$ represents a phenylene group or a naphthylene group; and $Z^2$ represents Fe, Co, Ni, Cr, or Ru; and
an acid generator component (B), which generates an acid upon exposure to radiation.

2. The chemically-amplified resist composition according to claim 1, wherein the polymer compound (A1) further has a constitutional unit (a11) derived from a compound represented by Formula (a11-1):

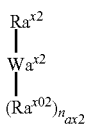

(a11-1)

wherein $Ra^{x2}$ represents a polymerizable group-containing group; $Wa^{x2}$ represents an $(n_{ax2}+1)$-valent aromatic hydrocarbon group, provided that $Ra^{x2}$ and $Wa^{x2}$ may together form a fused ring structure; $Ra^{x02}$ represents a substituent that substitutes a hydrogen atom constituting $Wa^{x2}$; $n_{ax2}$ represents an integer of 0 to 3; and when $n_{ax2}$ represents 2 or greater, a plurality of $Ra^{x02}$'s may be bonded to one another to form a ring structure.

3. The chemically-amplified resist composition according to claim 2, wherein the constitutional unit (a11) is represented by Formula (a11-u1):

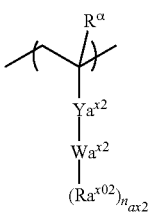

(a11-u1)

wherein $R^\alpha$ represents a hydrogen atom, a methyl group, or a trifluoromethyl group; $Ya^{x2}$ represents a divalent linking group having a heteroatom or a single bond; $Wa^{x2}$ represents an $(n_{ax2}+1)$-valent aromatic hydrocarbon group; $Ra^{x02}$ represents a substituent that substitutes a hydrogen atom constituting $Wa^{x2}$; $n_{ax2}$ represents an integer of 0 to 3; and when $n_{ax2}$ represents 2 or greater, a plurality of $Ra^{x02}$'s may be bonded to one another to form a ring structure.

4. The chemically-amplified resist composition according to claim 1, wherein the polymer compound (A1) further has a constitutional unit (a12) represented by Formula (a12-1)

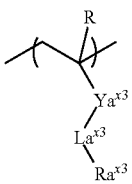

(a12-1)

wherein R represents a hydrogen atom, an alkyl group having 1 to 5 carbon atoms, or a halogenated alkyl group having 1 to 5 carbon atoms; $Ya^{x3}$ represents a single bond or a divalent linking group; $La^{x3}$ represents —O—, —COO—, —CON(R')—, —OCO—, —CONHCO—, or —CONHCS—; R' represents a hydrogen atom or a methyl group, provided that $Ya^{x3}$ does not represent —CO— when $La^{x3}$ represents —O—; and $Ra^{x3}$ represents a hydrogen atom, an aliphatic hydrocarbon group, a lactone-containing cyclic group, a —SO$_2$-containing cyclic group, or a carbonate-containing cyclic group, provided that $Ra^{x3}$ represents a non-acid-dissociable group.

5. The chemically-amplified resist composition according to claim 1, wherein the constitutional unit (a0) is represented by Formula (a0-u1):

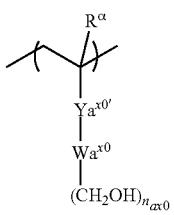

(a0-u1)

wherein $R^\alpha$ represents a hydrogen atom, a methyl group, or a trifluoromethyl group; $Ya^{x0'}$ represents a divalent linking group having a heteroatom or a single bond; $Wa^{x0}$ represents an $(n_{ax0}+1)$-valent aromatic hydrocarbon group; and $n_{ax0}$ represents an integer of 1 to 3.

6. The chemically-amplified resist composition according to claim 1, wherein the constitutional unit (a10) is represented by Formula (a10-u1):

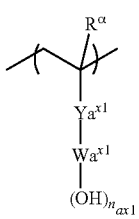

(a10-u1)

wherein $R^\alpha$ represents a hydrogen atom, a methyl group, or a trifluoromethyl group; $Ya^{x1}$ represents a divalent linking group having a heteroatom or a single bond; $Wa^{x1}$ represents an $(n_{ax1}+1)$-valent aromatic hydrocarbon group; and $n_{ax1}$ represents an integer of 1 to 3.

7. The chemically-amplified resist composition according to claim 1, wherein a proportion of the constitutional unit (a0) in the polymer compound (A1) is in a range of 5% to 95% by mole with respect to the total amount (100% by mole) of all constitutional units constituting the polymer compound (A1).

8. The chemically-amplified resist composition according to claim 1, wherein a proportion of the constitutional unit (a10) in the polymer compound (A1) is in a range of 5% to 95% by mole with respect to the total amount (100% by mole) of all constitutional units constituting the polymer compound (A1).

9. A method of forming a resist pattern, comprising:
forming a resist film on a support using the chemically-amplified resist composition according to claim 1;
exposing the resist film; and
developing the exposed resist film to form a resist pattern.

10. The chemically-amplified resist composition according to claim 1, wherein the acid generator component is an onium salt acid generator.

* * * * *